(12) United States Patent
Zhu et al.

(10) Patent No.: US 11,024,465 B2
(45) Date of Patent: Jun. 1, 2021

(54) MIXED THREE-DIMENSIONAL AND TWO-DIMENSIONAL PEROVSKITES AND METHODS OF MAKING THE SAME

(71) Applicant: Alliance for Sustainable Energy, LLC, Golden, CO (US)

(72) Inventors: Kai Zhu, Littleton, CO (US); Donghoe Kim, Seoul (KR)

(73) Assignee: Alliance for Sustainable Energy, LLC, Golden, CO (US)

( * ) Notice: Subject to any disclaimer, the term of this patent is extended or adjusted under 35 U.S.C. 154(b) by 106 days.

(21) Appl. No.: 16/571,344

(22) Filed: Sep. 16, 2019

(65) Prior Publication Data
US 2020/0090876 A1 Mar. 19, 2020

Related U.S. Application Data

(60) Provisional application No. 62/731,413, filed on Sep. 14, 2018.

(51) Int. Cl.
| | | |
|---|---|---|
| C07F 1/00 | (2006.01) |
| H01G 9/20 | (2006.01) |
| H01L 27/30 | (2006.01) |
| H01L 51/00 | (2006.01) |
| H01L 51/42 | (2006.01) |
| C07F 7/24 | (2006.01) |
| H01G 9/00 | (2006.01) |
| H01L 31/032 | (2006.01) |

(52) U.S. Cl.
CPC ............. *H01G 9/2009* (2013.01); *C07F 1/00* (2013.01); *C07F 7/24* (2013.01); *H01G 9/0036* (2013.01); *H01G 9/2072* (2013.01); *H01L 27/302* (2013.01); *H01L 51/0007* (2013.01); *H01L 51/0077* (2013.01); *H01L 51/4253* (2013.01); *H01L 31/0322* (2013.01)

(58) Field of Classification Search
None
See application file for complete search history.

(56) References Cited

U.S. PATENT DOCUMENTS

| | | |
|---|---|---|
| 9,880,458 B1 | 1/2018 | Irwin et al. |
| 2017/0186559 A1* | 6/2017 | Zhu ............... H01L 51/4226 |
| 2017/0331013 A1 | 11/2017 | Lee et al. |
| 2019/0241802 A1 | 8/2019 | Wheeler et al. |

FOREIGN PATENT DOCUMENTS

WO  2018009530 A1  1/2018

OTHER PUBLICATIONS

Search Report from corresponding PCT patent application No. PCT/US19/51235, dated Mar. 5, 2020, 3 pages.
Written Opinion from corresponding PCT patent application No. PCT/US19/51235, dated Mar. 5, 2020, 4 pages.

(Continued)

*Primary Examiner* — Clinton A Brooks
(74) *Attorney, Agent, or Firm* — Michael A. McIntyre

(57) ABSTRACT

An aspect of the present disclosure is a perovskite that includes $A_{(n-1-nw+w)}A'_{(nw-w)}A''_2B_nX_{(3n-3zn+3z-4e+1)}X'_{(3zn-3z)}X''_{4e}$, where each of A, A', A'' are monovalent cations, B is a divalent cation, each of X, X', and X'' are monovalent anions, $0<w\leq1$, $0<z\leq1$, $0<e\leq1$, and $1\leq n\leq100000$.

14 Claims, 64 Drawing Sheets

(56) References Cited

OTHER PUBLICATIONS

Bailie, C. et al., "Semi-transparent perovskite solar cells for tandems with silicon and CIGS," Energy & Environmental Science, vol. 8, 2015, pp. 956-963.
Cao, D. et al., "2D Homologous Perovskites as Light-Absorbing Materials for Solar Cell Applications," Journal of the American Chemical Society, vol. 137, 2015, pp. 7843-7850.
Daub, M. et al., "Synthesis, Single-Crystal Structure and Characterization of (CH3NH3)2Pb(SCN)2I2," Angewandte Correspondence, vol. 54, 2015, pp. 11016-11017.
Fu, Fan et al., "High-efficiency inverted semi-transparent planar perovskite solar cells in substrate configuration," Nature Energy, vol. 2, 2016, 9 pages.
Gao, F. et al., "Enhanced performance of tin halide perovskite solar cell by addition of lead thiocyanate," RSC Advances, vol. 8, 2018, pp. 14025-14030.
Guchhait, A. et al., "Over 20% Efficient CIGS-Perovskite Tandem Solar Cells," ACS Energy Letters, vol. 2, 2017, pp. 807-812.
Harvey, S.P. et al., Probing Perovskite Inhomogeneity beyond the Surface: TOF-SIMS Analysis of Halide Perovskite Photovoltaic Devices, ACS Applied Materials Interface, vol. 10, 2018, pp. 28541-28552.
Ke, W. et al., "Employing Lead Thiocyanate Additive to Reduce the Hysteresis and Boost the Fill Factor of Planar Perovskite Solar Cells," Advanced Materials, vol. 28, 2016, pp. 5214-522.
Koscher, B. et al., "Essentially Trap-Free CsPbBr3 Colloidal Nanocrystals by Postsynthetic Thiocyanate Surface Treatment," Journal of the American Chemical Society, vol. 139, 2017, pp. 6566-6569.
Kumar, M.N. et al., "Lead-Free Halide Perovskite Solar Cells with High Photocurrents Realized Through Vacancy Modulation," Advanced Materials, vol. 26, 2014, pp. 7122-7127.
Lee, Jin-Wook et al., "2D perovskite stabilized phase-pure formamidinium perovskite solar cells," Nature Communications, vol. 9, 2018, 10 pages.
Lee, Jin-Wook et al., "Lewis Acid-Base Adduct Approach for High Efficiency Perovskite Solar Cells," ACS Accounts of chemical research, vol. 49, 2016, pp. 311-319.
Lee, D.S. et al., "Passivation of Grain Boundaries by Phenethylammonium in Formamidinium-Methylammonium Lead Halide Perovskite Solar Cells," ACS Energy Letters, vol. 3, 2018, pp. 647-654.
Lee, S.J. et al., "Fabrication of Efficient Formamidinium Tin Iodide Perovskite Solar Cells through SnF2-Pyrazine Complex," Journal of the American Chemical Society, vol. 138, 2016, pp. 3974-3977.
Li, N. et al., "Mixed Cation FAxPEA1-xPbI3 with Enhanced Phase and Ambient Stability toward High-Performance Perovskite Solar Cells," Advanced Energy Materials, vol. 7, 2017, 9 pages.
Liao, W. et al., "Lead-Free Inverted Planar Formamidinium Tin Triiodide Perovskite Solar Cells Achieving Power Conversion Efficiencies up to 6.22%," Advanced Materials, vol. 28, 2016, pp. 9333-9340.
Ma, L. et al., Carrier Diffusion Lengths of over 500 nm in Lead-Free Perovskite Ch3NH3SnI3 Films, Journal of the American Chemical Society, vol. 138, 2016, pp. 14750-14755.
Noel, N. et al., "Enhanced Photoluminescence and Solar Cell Performance via Lewis Base Passivation of Organic-Inorganic Lead Halide Perovskites," ACS Nano, vol. 8, No. 10, 2014, pp. 9815-9821.
Paetzold, U.W. et al., "Scalable perovskite/CIGS thin-film solar module with power conversion efficiency of 17.8%," Journal of Materials Chemistry A, vol. 5, 2017, pp. 9897-9906.
Quan, Li Na et al., "Ligand-Stabilized Reduced-Dimensionality Perovskites," Journal of the American Chemical Society, vol. 138, 2016, pp. 2649-2655.
Rajagopal, A. et al., "Defect Passivation via a Graded Fullerene Heterojunction in Low-Bandgap Pb—Sn Binary Perovskite Photovoltaics," ACS Energy Letters, vol. 2, 2017, pp. 2531-2539.
Rajagopal, A. et al., "Overcoming the Photovoltage Plateau in Large Bandgap Perovskite Photovoltaics," ACS Nano Letters, vol. 18, 2018, pp. 3985-3993.
Shen, H. et al., "Mechanically-stacked perovskite/CIGS tandem solar cells with efficiency of 23.9% and reduced oxygen sensitivity," Energy & Environmental Science, vol. 11, 2018, pp. 394-406.
Stoumpas, C. et al., "Ruddlesden-Popper Hybrid Lead Iodide Perovskite 2D Homologous Semiconductors," ACS Chemistry of Materials, vol. 28, 2016, pp. 2852-2867.
Todorov, T. et al., "Monolithic Perovskite-CIGS Tandem Solar Cells via in Situ Band Gap Engineering," Wiley Advanced Energy Materials, vol. 5, 2015, 6 pages.
Tsai, H. et al., "High-efficiency two-dimensional Ruddlesden-Popper perovskite solar cells," Nature, vol. 536, Aug. 2016, 15 pages.
Uhl, A. et al., "Solution-Processed Low-Bandgap CuIn(S,Se)2 Absorbers for High-Efficiency Single-Junction and monolithic Chalcopyrite-Perovskite Tandem Solar Cells," Wiley Advanced Energy Materials, vol. 8, 2018, 8 pages.
Wang, Z. et al., "Efficient ambient-air-stable solar cells with 2D-3D heterostructured butylammonium-caesium-formamidinium lead halide perovskites," Nature Energy, vol. 2, 2017, 10 pages.
Wang, C. et al., "Synergistic effects of thiocyanate additive and cesium cations on improving the performance and Initial illumination stability of efficient perovskite solar cells," RSC Sustainable Energy & Fuels, vol. 2, 2018, pp. 2435-2441.
Yang, Y. et al., "Multilayer Transparent Top Electrode for Solution Processed Perovskite/Cu(In,Ga)(Se,S)2 Four Terminal Tandem Solar Cells," ACS Nano, vol. 9, No. 7, 2015, pp. 7714-7721.
Yin, Wan-Jian et al., "Unusual defect physics in Ch3NH3PbI3 perovskite solar cell absorber," Applied Physics Letters, vol. 104, 2014, 4 pages.
Zhao, D. et al., "Low-bandgap mixed tin-lead iodide perovskite absorbers with long carrier lifetimes for all-perovskite tandem solar cells," Nature Energy, vol. 2, 2017, 7 pages.

* cited by examiner

MIXED THREE-DIMENSIONAL AND TWO-DIMENSIONAL PEROVSKITES AND METHODS OF MAKING THE SAME

CROSS-REFERENCE TO RELATED APPLICATIONS

This application claims the benefit of U.S. Provisional Patent Application No. 62/731,413 filed Sep. 14, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

Tandem solar cells based on dual junctions combining a wide-bandgap (e.g., ~1.7-1.9 eV) top cell with a narrow-bandgap (e.g., ~0.9-1.2 eV) bottom cell represent an effective way to push the solar conversion efficiency above the Shockley-Queisser (S-Q) limit (~31%-33%) for single-junction devices. So far, only III-V compound semiconductors have demonstrated tandem cell efficiencies higher than the S-Q limit. However, the epitaxial growth and expensive substrate has made this technology costly at present. Organic-inorganic metal halide perovskite solar cells (PSCs)—with their rapid efficiency improvement, bandgap tunability, and low-cost processing have become a promising candidate for a variety of tandem devices including perovskite/perovskite, perovskite/CIGS (copper, indium, gallium, selenide), and perovskite/Si. Among these tandem technologies, the polycrystalline thin-film tandem cells (e.g., based on perovskite or CIGS bottom cells) have several potential advantages over the Si-based counterpart such as flexible devices, light weight, and roll-to-roll processing.

The state-of-the-art polycrystalline thin-film CIGS solar cell has a bandgap of ~1.1 eV and has achieved a certified 22.9% cell efficiency. This makes CIGS a strong candidate as the bottom cell in a tandem configuration to achieve ultrahigh device performance. With the bottom-cell absorber near 1.1 eV, the top cell should ideally have a bandgap near 1.7 eV. In theory, pairing a 1.1-eV bottom cell with a ~1.7-eV top cell could yield a tandem cell efficiency above 40%. However, there are only a handful of studies on perovskite/CIGS tandem cells, with the best-reported power conversion efficiency (PCE) of 23.9% for a mechanically stacked four-terminal (4-T) configuration and lower efficiency for monolithic two-terminal devices. Thus, a key focus in developing tandem devices is to develop more efficient wide-bandgap PSCs, and methods for the producing such PSCs.

SUMMARY

An aspect of the present disclosure is a perovskite that includes $A_{(n-1-nw+w)}A'_{(wn-w)}A''_2B_nX_{(3n-3zn+3z-4e+1)}X'_{(3zn-3z)}X''_{4e}$, where each of A, A', A" are monovalent cations, B is a divalent cation, each of X, X', and X" are monovalent anions, $0<w\leq1$, $0<z\leq1$, $0<e\leq1$, and $1\leq n\leq100000$. In some embodiments of the present disclosure, A" may include at least one of phenylethyl ammonium (PEA), guanidinium (Gua), butylammonium, cyclopropylammonium, polyethylenimine, iodoethylammonium, ethane-1,2-diammonium, and/or ammoniumvaleric acid. In some embodiments of the present disclosure, X" may include a pseudohalide. In some embodiments of the present disclosure, X" may include at least one of thiocyanate (SCN), cyanate, isothiocyanate, azide, selenocyanogen, tellurorhodanide, tetracarbonylcobaltate, and/or $AL_{13}I_2^-$.

In some embodiments of the present disclosure, the perovskite may include $FA_{(n-1-nw+w)}MA_{(wn-w)}PEA_2Pb_n I_{(3n-3zn+3z-4e+1)}Br_{(3zn-3z)}SCN_{4e}$. In some embodiments of the present disclosure, the perovskite may include $FA_{(n-1-nw+w)}MA_{(wn-w)}Gua_2Pb_nI_{(3n-4e+1)}SCN_{4e}$ and z=0. In some embodiments of the present disclosure, the perovskite may include bromine, resulting in $FA_{(n-1-nw+w)}MA_{(wn-w)}Gua_2Pb_nI_{(3n-3zn+3z-4e+1)}Br_{(3zn-3z)}SCN_{4e}$. In some embodiments of the present disclosure, a perovskite may further include A''', where A''' is a monovalent cation, resulting in $A_{(n-nw-nx-1+w+x)}A'_{(wn-w)}A''_2A'''_{(xn-x)}B_nX_{(3n-3zn+3z-4e+1)}X'_{(3zn-3z)}X''_{4e}$, where $0<x\leq1$. In some embodiments of the present disclosure, the perovskite may include $FA_{(n-nw-nx-1+w+x)}MA_{(wn-w)}PEA_2Cs_{(xn-x)}Pb_n I_{(3n-3zn+3z-4e+1)}Br_{(3zn-3z)}SCN_{4e}$.

In some embodiments of the present disclosure, the perovskite may include $FA_{(n-nw-nx-1+w+x)}MA_{(wn-w)}GuA_2 Cs_{(xn-x)}Pb_nI_{(3n-3zn+3z-4e+1)}Br_{(3zn-3z)}SCN_{4e}$. In some embodiments of the present disclosure, a perovskite may further include B', where B' is a monovalent anion, resulting in $A_{(n-nw-nx-1+w+x)}A'_{(wn-w)}A''_2A'''_{(xn-x)}B_{(n-ny+y)}B'_{(ny-y)} X_{(3n-3zn+3z-4e+1)}X'_{(3zn-3z)}X''_{4e}$, where $0<y\leq1$. In some embodiments of the present disclosure, the perovskite may include $FA_{(n-nw-nx-1+w+x)}MA_{(wn-w)}PEA_2Cs_{(xn-x)}Pb_{(n-ny+y)} B_{(ny-y)}Sn_{(3n-3zn+3z-4e+1)}I_{(3zn-3z)}SCN_{4e}$. In some embodiments of the present disclosure, the perovskite may include $FA_{(n-nw-nx-1+w+x)}MA_{(wn-w)}Gua_2Cs_{(xn-x)}Pb_{(n-ny+y)} Sn_{(3n-3zn+3z-4e+1)}I_{(3zn-3z)}SCN_{4e}$.

In some embodiments of the present disclosure, a perovskite may further include a plurality of grains separated from neighboring grains by a plurality of grain boundaries, where the plurality of grains consist essentially of a first portion of the perovskite, and the plurality of grain boundaries consist essentially of a second portion of the perovskite. In some embodiments of the present disclosure, the first portion may be substantially in a 3D perovskite structure. In some embodiments of the present disclosure, the second portion may be substantially in a 2D perovskite structure. In some embodiments of the present disclosure, each grain may have a characteristic length between 300 nm to 10 μm.

An aspect of the present disclosure is a method that includes completing a first reaction, $(1-w)(AX+BX_2)+w(A'X'+BX'_2) \rightarrow A_{1-w}A'_wB(X_{1-w}X'_w)_3$ and completing a second reaction, $2A''X''+(1-e)BX_2+eBX''_2 \rightarrow A''_2B(X_{2-2e}X''_{2+2e})$, where the first reaction and the second reaction result in the forming of a perovskite comprising $[A_{1-w}A'_wB(X_{1-w}X'_w)_3]_{n-1}[A''_2B(X_{2-2e}X''_{2+2e})]$. Each of A, A', and A" are monovalent cations, B is a divalent cation, each of X, X', and X" are monovalent anions, $0<w\leq1$, $0<e\leq1$, and $1\leq n\leq100000$. In some embodiments of the present disclosure, A" may include at least one of phenylethyl ammonium (PEA), guanidinium (Gua), butylammonium, cyclopropylammonium, polyethylenimine, iodoethylammonium, ethane-1,2-diammonium, and/or ammoniumvaleric acid. In some embodiments of the present disclosure, X" may include a pseudohalide.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 5A illustrates typical J-V curves, according to some embodiments of the present disclosure. FIGS. 5B-5E illustrate statistics of photovoltaic parameters of perovskite solar cells without and with additives, according to some embodiments of the present disclosure: 2 mol % $Pb(SCN)_2$, 1 mol % PEAI, or combining both 1 mol % PEAI and 2 mol % $Pb(SCN)_2$. The amount of Pb(SCN) was calculated as: moles of Pb(SCN)/(moles of $PbI_2+PbBr_2$).

FIG. 7A power conversion efficiency (PCE), FIG. 7B short-circuit photocurrent density ($J_{sc}$), FIG. 7C open-circuit voltage ($V_{oc}$), and FIG. 7D fill factor (FF) of perovskite solar cells prepared with different amount of PEAI additive ranging from 0 mol % to 3 mol %. For all these devices, 2 mol % $Pb(SCN)_2$ was used.

FIG. 8A—PCE, FIG. 8B—$J_{sc}$, FIG. 8C—$V_{oc}$, and FIG. 8D—FF of perovskite solar cells prepared with different amount of $Pb(SCN)_2$ additive ranging from 0 mol % to 5 mol %. For all these devices, 1 mol % PEAI was used.

FIG. 9A illustrates typical SEM images and FIG. 9B XRD patterns of perovskite films prepared without (A) and with additives: 2 mol % $Pb(SCN)_2$ (+), 1 mol % PEAI (**), or combining both 1 mol % PEAI and 2 mol % $Pb(SCN)_2$ (*).

FIG. 14A illustrates a schematic of defect passivation at perovskite grain boundaries (or surfaces) by $PEA^+$ from PEAI and $SCN^-$ from $Pb(SCN)_2$. FIG. 14B illustrates time-of-flight secondary-ion mass spectrometry 2D images of element distribution: I, FA, PEA, and SCN. The scale bar is 1 μm.

FIG. 15A illustrates typical photoconductivity ($\phi\Sigma\mu$) transient for perovskite films prepared without and with additives: 2 mol % $Pb(SCN)_2$, 1 mol % PEAI, or combining both 1 mol % PEAI and 2 mol % $Pb(SCN)_2$. The excitation intensity was near $1\times10^{10}$ $cm^{-2}$ absorbed photon flux ($I_0F_A$). FIG. 15B illustrates excitation intensity dependence of the photoconductivity with $I_0F_A$ in an absorbed flux range of about $3.8\times10^9$ to $3.8\times10^{10}$ $cm^{-2}$ for the same samples shown in FIG. 15A.

FIG. 18A illustrates J-V curve of champion perovskite solar cell with an opaque (Ag) top contact. Inset shows the stable power output (SPO) under continuous illumination near the maximum power point. FIG. 18B illustrates external quantum efficiency (EQE) spectrum and the integrated photocurrent for the cell shown in FIG. 18A. FIG. 18C illustrates J-V curves of the perovskite solar cell with a transparent (IZO) top contact, and the CIGS solar cell with and without the optical filter from the top semi-transparent perovskite solar cell. FIG. 18D EQE spectra of the semi-transparent top perovskite solar cell and the filtered bottom CIGS solar cell.

REFERENCE NUMBERS

Figure 1A:
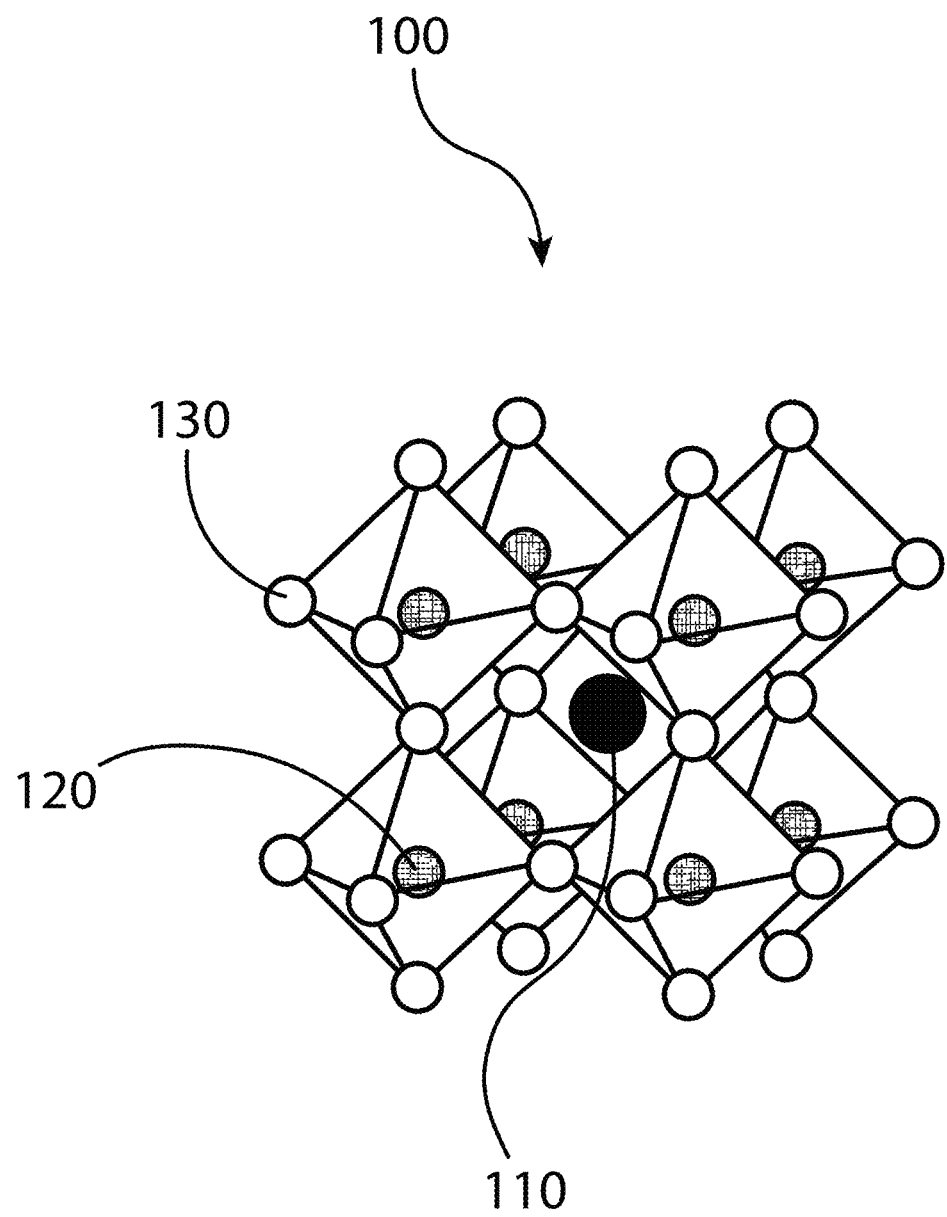
FIGS. 1A, 1B, and 1C illustrate the three-dimensional (3D) structure of a perovskite, according to some embodiments of the present disclosure.

100 . . . perovskite
110 . . . A-cation
120 . . . B-cation
130 . . . X-anion
210 . . . A'-cation
220 . . . X'-anion
230 . . . two-dimensional structure
240 . . . grain
250 . . . grain boundary
300 . . . method
310 . . . combining
315 . . . precursor
317 . . . first solution
320 . . . adding
325 . . . additive
327 . . . second solution
330 . . . applying
337 . . . liquid film
340 . . . treating

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to methods for producing perovskite materials having superior performance and/or physical property characteristics. Specifically, the present disclosure relates to methods of making unique perovskites using one or more additives that, among other things, improve the resultant perovskite film quality, crystallinity, lower defect density and energy disorder, increase carrier mobility, and increase carrier mobility. As shown herein, for the example of a $(FA_{0.65}MA_{0.20}Cs_{0.15})Pb(I_{0.8}Br_{0.2})_3$ perovskite, the use of two additives, phenylethyl ammonium iodide (PEAT) and lead II thiocyanate ($Pb(SCN)_2$), resulted in a wide bandgap perovskite material (about 1.68 eV) with 20% efficiency, faster carrier mobility (~47 $cm^2$ $V^{-1}s^{-1}$) and longer carrier lifetime (~2.9 μs). When combined with a 1.12 eV CIGS bottom cell, the semi-transparent 1.68 eV perovskite top cell yielded a ~26.5%-efficient polycrystalline perovskite/CIGS tandem solar cell. This example illustrates the feasibility and advantages that the use of additives may have in manufacturing methods to produce a variety of organic-inorganic perovskite and/or fully inorganic perovskite materials having superior physical property and performance characteristics.

Figure 1B:
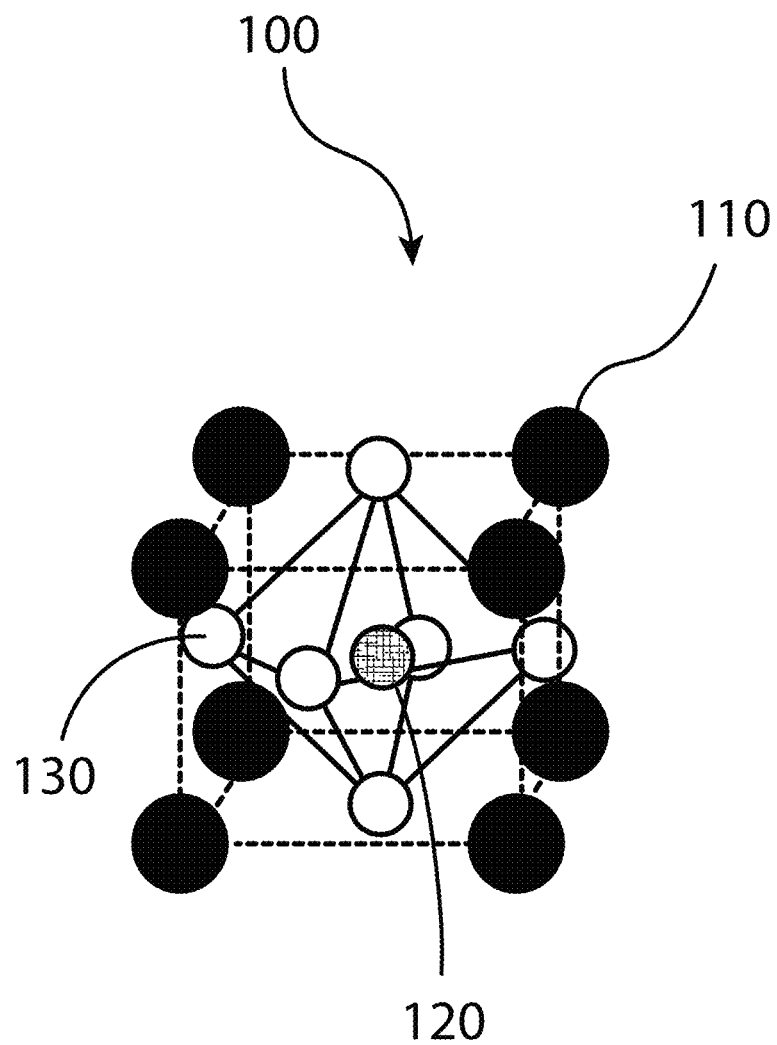
Figure 1C:
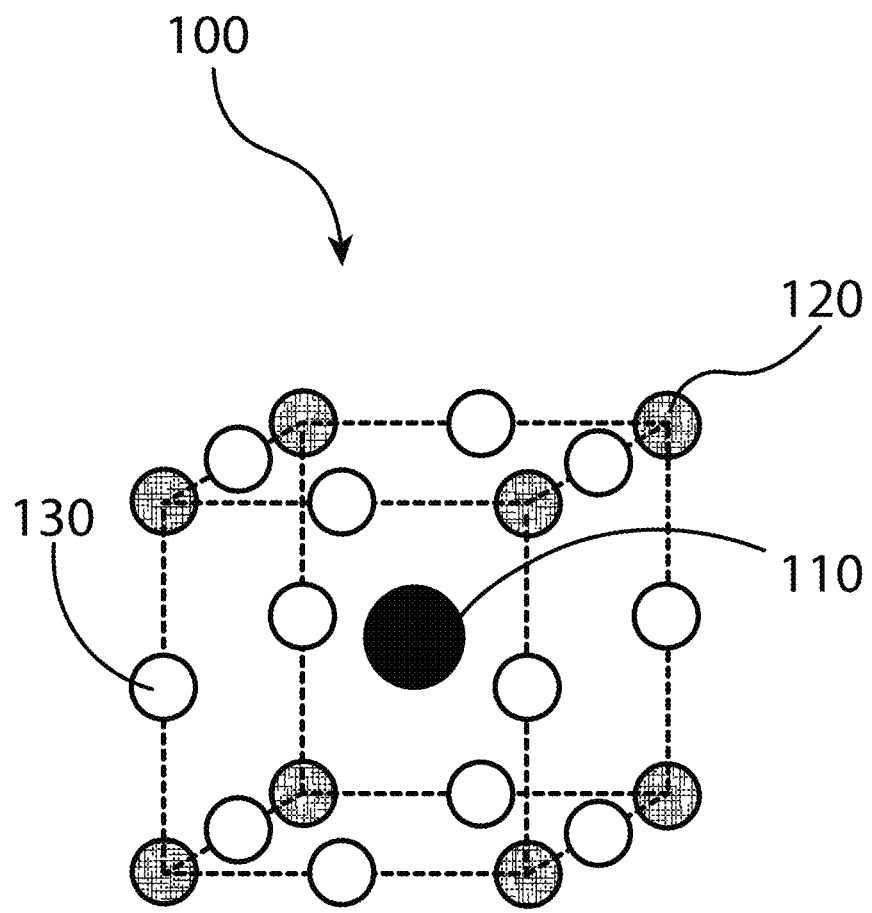

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions centrally located between B-cations along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six A-anions 130 is shared between two unit cells, and each of the eight A-cations 110 is shared between eight unit cells. So for the unit cell shown in FIG. 1B, the stoichiometry simplifies to B=1, A=8*0.124=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$) (MA), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$) (FA), hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tertbutyl ($C_4$), secbutyl ($C_4$), isobutyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. In addition, perovskites, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the anion 130 of a perovskite 100 may include one or more anions, for example, one or more halogens. Any combination is possible provided that the charges balance.

For example, a perovskite having the basic crystal structure illustrated in FIG. 1A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with examples of such a composition being $Cs_2BiAgCl_5$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Further, any perovskite described by the above-mentioned compositions (e.g. $ABX_3$, $A_2BB'X_6$, $A_2BX_6$, $A_3B_2X_9$), may include more than one of a given species, A-cation, B-cation, B'-cation, and/or X-anion, provided the charges balance. For example, a perovskite may include more than one A-cation, including a mixture of any of the A-cations listed above; e.g. formamidinium, one or more alkylammonium ions, and/or cesium. Similarly, a perovskite may include one or more X-anions; e.g. one or more halogens fluorine, bromine, chlorine, iodine, etc. Also, a perovskite may have more than one B-cation, for example, more than one of bismuth, silver, and/or copper.

Figure 2A:
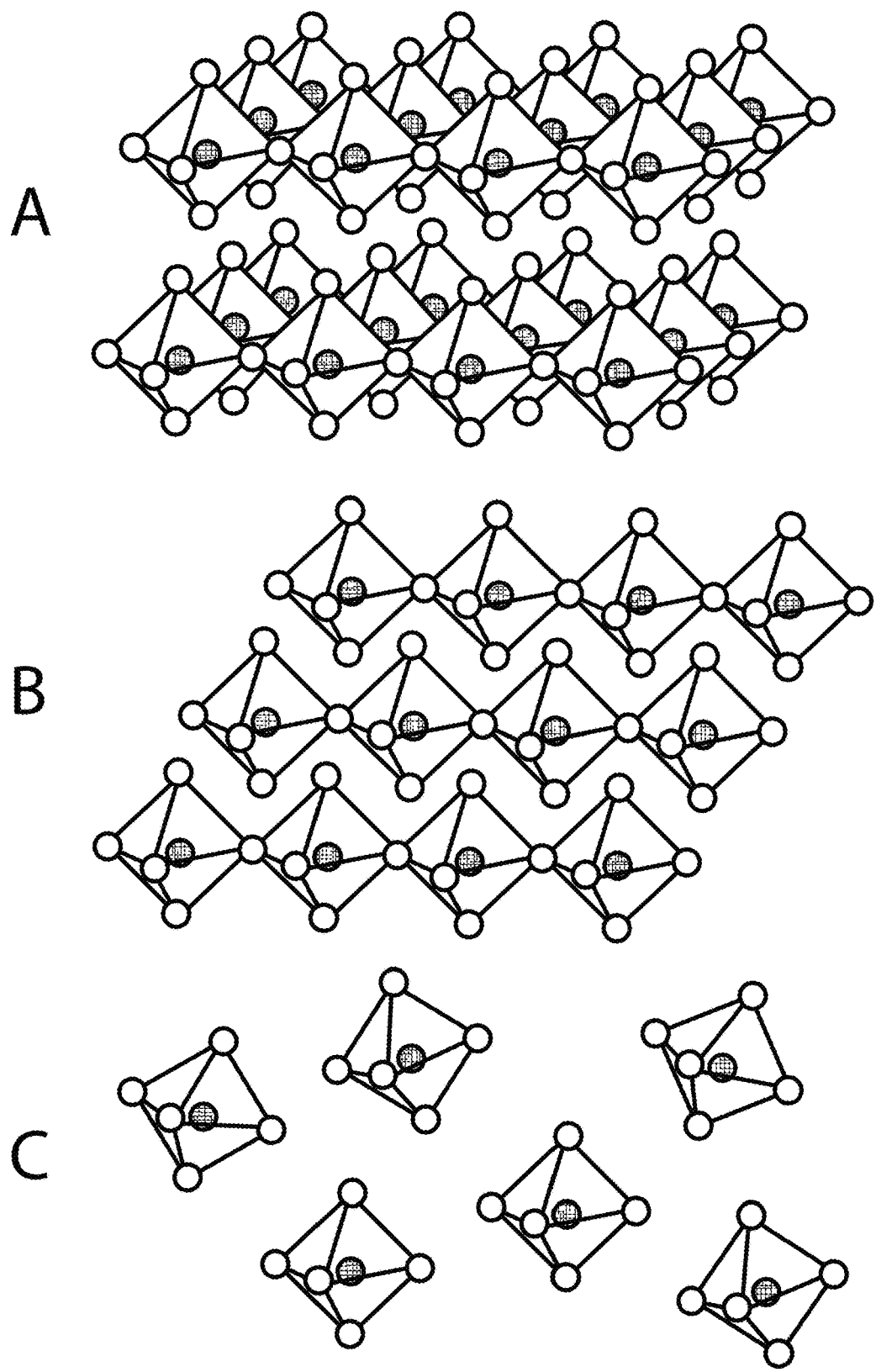
FIG. 2A illustrates 2D, 1D, and 0D perovskite structures, according to some embodiments of the present disclosure.

In some embodiments of the present disclosure, a perovskite may have a combination of a three-dimensional (3D) perovskite and a two-dimensional (2D) perovskite. FIG. 2A compares the structure of 3D perovskites (e.g. $CsPbI_3$) to 2D perovskites (e.g. $Cs_2PbI_4$), one-dimensional (1D) perovskites (e.g. $Cs_3PbI_5$), and zero-dimensional (0D) perovskites (e.g. $Cs_4PbI_6$). Referring to Panel A of FIG. 2A, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Thus, a 2D structure is generally described as $(A')_m(A)_{n-1}B_nX_{3n+1}$. When n is equal to 1, the general structure reduces to $A'_mBX_4$, where m=2 for a monovalent A' and m=1 for a divalent A'. When n>1, the perovskite structure is referred to herein as "quasi-2D".

Referring to Panel B of FIG. 2A, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 2A, typically, the 0D perovskites are consisted of isolated inorganic octahedral clusters and surrounded by small cations (not shown) which are connected via hydrogen bonding.

Figure 2B:
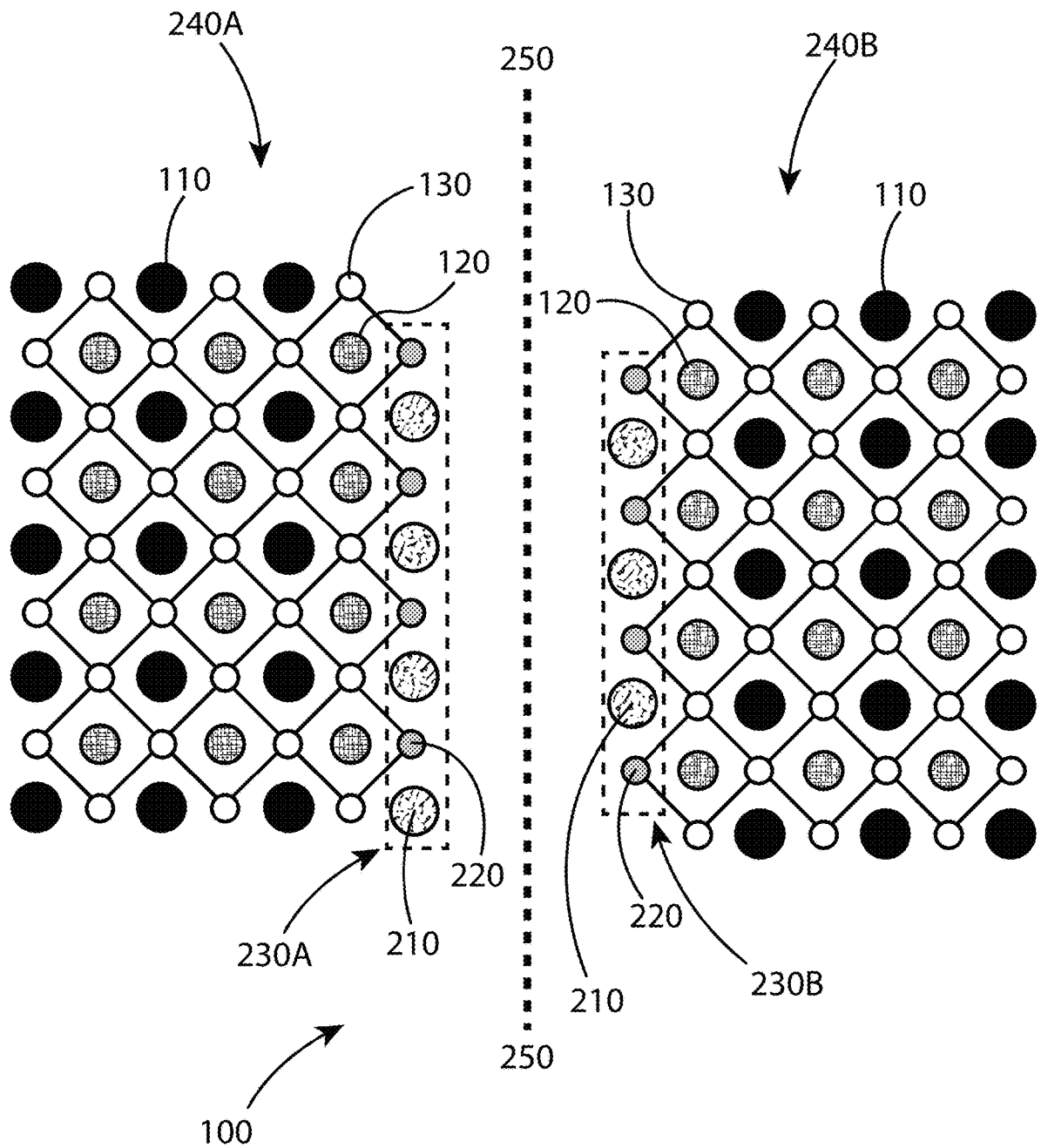
FIG. 2B illustrates a 3D perovskite that includes a two-dimensional (2D) structure, according to some embodiments of the present disclosure.

FIG. 2B illustrates an example of a perovskite 100 having a 3D perovskite structure as shown in FIGS. 1A-1C. The 3D structure of the perovskite 100 is contained within one or more crystalline grains, with two grains, 240A and 240B, illustrated in FIG. 2B. The two grains of FIG. 2B, 240A and 240B, are separated by a grain boundary 250. Positioned within and/or at the grain boundary 250 is at least one 2D perovskite structure 230, with two such structures illustrated in FIG. 2B, 230A and 230B. Among other things, a 2D perovskite structure 230 may include at least one of a A'-cation 210 and/or a X'-anion 220. In some embodiments of the present disclosure, a X'-anion may be associated with the X-anion site of the 3D structure of the perovskite. For example, as shown in FIG. 2B, at least some of the X'-anions 220 may replace the X-anions 130 in the 3D perovskite structure. The A'-cations 210 may be positioned within the space normally occupied by the A-cation 110 in the perovskite 3D structure. Together, the X'-anions 220 and the A'-cations 210 may balance the other ion's charge, resulting in the formation of the 2D perovskite structure 230 positioned at and/or within the grain boundaries 250 of neighboring 3D perovskite grains 240 (e.g. 240A and 240B).

Examples of possible A'-cations 210 include phenylethyl ammonium (PEA+), ethylammonium, guanidinium, acetamidinium, [n-, or iso-propylammonium], [n-, iso-, or t-butylammonium], n-butylammonium, [n-, iso-, or neo-pentylammonium], [n-, iso-, or neo-hexylammonium], [n-, iso-, tert- or neo-octylammonium], [n-, iso-, or neo-dodecylammonium], 2-pyrrolidin-1-ium-1-ylethylammonium, 5-azaspiro[4.4]nonan-5-ium, 1,4-benzene diammonium, benzylammonium, butane-1,4-diammonium, N,N-diethylpropane-1,3-diammonium, propane-1,3-diammonium, cyclohexyl ammonium, cyclohexylmethyl ammonium, 1,4-diazabicyclo[2,2,2]octane-1,4-diium, diethylammonium, dimethylammonium, N,N-dimethyl ethane-1,2-diammonium, N,N-dimethylpropane-1,3-di ammonium, ethane-1,2-diammonium, imidazolium, phenethylammonium, phenylammonium, piperazine-1,4-diium, piperidinium, pyridinium, pyrrolidinium, quinuclidin-1-ium, 4-fluorophenylammonium, 4-fluoro-benzylammonium, 4-fluorophenethylammonium, 4-m ethoxy-phenethylammonium iodide, 4-methoxy-phenylammonium, 4-trifluoromethylbenzylammonium, and/or 4-trifluoromethyl-phenylammonium. Examples of possible X'-anions 220 include thiocyanate ($SCN^-$), $SeCN^-$, and/or a psuedohalogen. Any of the above cations and/or anions may be provided by a suitable salt; for example, PEA+ may be provided by PEAI, PEABr, PEACl, and/or other anions such as $SCN^-$, etc.

Figure 3:
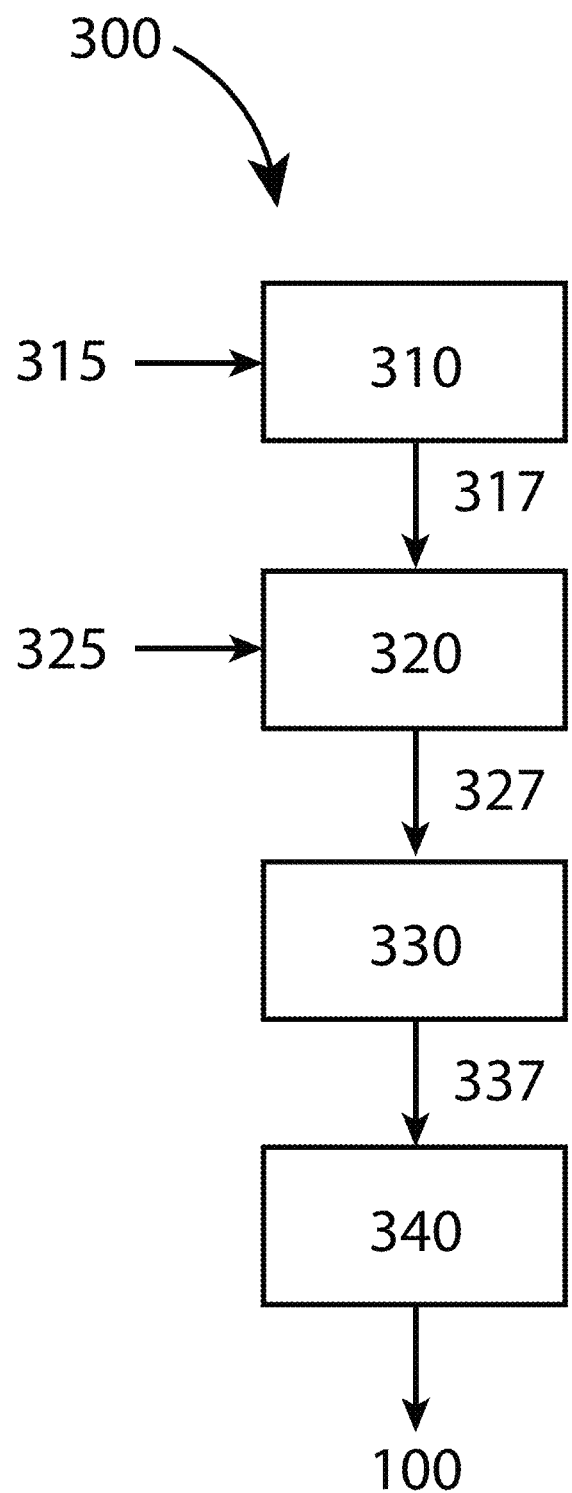
FIG. 3 illustrates a method for producing a 3D perovskite that includes a two-dimensional (2D) structure, according to some embodiments of the present disclosure.

FIG. 3 illustrates a method 300 for producing the perovskites 100 described above, perovskites having both a 3D crystalline structure and a 2D structure. The method 300 may begin with the combining 310 of the precursors 315 needed to produce the perovskite composition being targeted. For example, if the target perovskite 100 is $(FA_{0.65}MA_{0.20}Cs_{0.15})Pb(I_{0.8}Br_{0.2})_3$ (where FA=A-cation, MA=A'-cation, Cs=A"-cation, Pb=B-cation, I=X-anion, and Br=X'-anion), stoichiometric amounts of FAI, CsI, MABr, $PbI_2$, and $PbBr_2$ may be combined; e.g. 0.65 moles of FAI, 0.15 moles of CsI, 0.20 moles of MABr, 0.80 moles of $PbI_2$, and 0.20 moles of $PbBr_2$. In general, perovskite compositions having the following general composition may be produced by methods described herein: (AA'A")BB'(XX'X"). The precursors 315 may be combined with a solvent (not shown) to produce a first solution 317. Examples of suitable solvents include polar aprotic solvents which can form $SN_2$ reactions with perovskite salts such as N,N-dimethylformamide (DMF), N-methyl-2-pyrrolidone (NMP), γ-butyrolactone (GBL), N,N-dimethylacetamide (DMA), and/or acetonitrile (ACN) etc. The method 300 may continue with the adding 320 of at least one additive 325 to the first solution 317, resulting in a second solution 327. Examples of suitable additives 325 include at least one of PEAI, PEABr, PEACl, and/or any salt containing PEA+ balanced with an anion (e.g. X'-anion). Other examples of suitable additives 325 include at least one of $Pb(SCN)_2$, $Ge(SCN)_2$, $Sn(SCN)_2$, NaSCN, KSCN, and/or any salt containing $(SCN)_2^2$ balanced with a cation (e.g. A'-cation). The additive provided to the second solution 327 may vary depending upon the targeted final perovskite composition, but in general may be between greater than 0 mol % and about 50 mol %. In some embodiments of the present disclosure, the combining 310 and the adding 320 may be combined into a single step.

The amount of A'-cation may be defined relative to the amount of A-cation present in the targeted perovskite composition; e.g. $ABX_3$. Specifically, the mole percentage of the A'-cation present in a formulation may be calculated by the total number of moles of A'-cation present in the formulation, divided by the total number of moles of A-cation present in the targeted perovskite, with the fraction then multiplied by 100 to yield the mole percentage of A'-cation present in the formulation. In some embodiments of the present disclosure, the A'-cation may be present at a mole percentage between 0.001% and 50%, or at a mole percentage between 0.001% and 20%. In some embodiments of the present disclosure, the A'-cation may be present a mole percentage between 1% and 5%. The mole percentage of the X'-anion present may be calculated relative to the total amount of the B-cation present in the targeted final perovskite composition; e.g. $ABX_3$. Specifically, the mole percentage of the X'-anion present in a formulation may be calculated by the total number of moles of X'-anion present in the formulation, divided by the total number of moles of X-anion present in the targeted perovskite, with the fraction then multiplied by 100 to yield the mole percentage of X'-anion present in the formulation. In some embodiments of the present disclosure, the X'-anion may be present at a mole percentage between 0.001% and 50%, or at a mole percentage between 0.001% and 20%. In some embodiments of the present disclosure, the X'-anion may be present a mole percentage between 2% and 5%.

In some embodiments of the present disclosure, the methods described herein may be performed under inert conditions (e.g. nitrogen, helium, argon, etc.) or in an air environment. Further, at least one of the combining and/or treating may be performed at a temperature less than 300° C. In some embodiments of the present disclosure, at least one of the combining and/or treating may be performed at a temperature between 25° C. and 300° C.

Next, the method 300 may proceed to the applying 330 of the second solution 327 to a substrate (not shown), resulting in the forming of a liquid film 337 on the substrate. The applying 330 may be accomplished by at least one of spin-coating, curtain coating, dip-coating, blade-coating, slot-die coating, and/or spraying. The resultant liquid film 337 may have a thickness between 100 nm and 5000 nm, inclusively. Possible substrates include ITO, FTO, metal substrates, polyimide, PET, and/or PEN. Some substrates may be flexible. After the applying 330, the liquid film 337 may proceed to a treating 340, e.g. an annealing or thermal treating step, resulting in the formation of the target perovskite 100. Thermal treating may be performed at a temperature between 50° C. and 300° C. In some embodiments of the present disclosure, at least one of the combining 310, the adding 320, and/or the applying 330 may be performed by at least one of a solution processing method, a solid-state processing method, and/or a vapor-phase processing method (e.g. atomic layer deposition (ALD) and/or chemical vapor deposition (CVD).

As described below, the methods and additives described above can result in better performing perovskite materials, resulting in better performing solar cells. For example, an effective additive-engineering approach (described above for FIG. 3) is demonstrated herein to prepare highly efficient wide-bandgap (1.68 eV) PSCs. The average PSC performance was improved from 16.3% to 18.7%, with an optimized cell efficiency near 20% (stable power output of ~19.5%). The solution method used to achieve this improvement included the use of two complementary additives, phenylethyl ammonium iodide (PEAI) and lead II thiocyanate ($Pb(SCN)_2$), in the $(FA_{0.65}MA_{0.20}Cs_{0.15})Pb(I_{0.8}Br_{0.2})_3$ perovskite formulation, resulting in a three-dimensional (3D) perovskite grains separated at the grain boundaries by two-dimensional (2D) (or quasi-2D structures. The coupling of $PEA^+$ and $SCN^-$ overcomes the separate challenges associated with each additive, and significantly improves structural and optoelectronic properties of the resultant perovskite films. Improvements and advantages to the resultant perovskite material include increasing the perovskite crystallinity despite reduced grain size; reducing excess $PbI_2$ formation; and decreasing defect density and energy disorder from the unexpected synergistic/complementary effect of utilizing both $PEA^+$ and $SCN^-$ in the perovskite formulation. Ultimately, this method, resulted in a perovskite material having both 3D structures and 2D structures, which resulted in markedly improved charge-carrier mobility and lifetime, increasing from <10 $cm^2$ $V^{-1}s^{-1}$ and <1 μs for the control sample (e.g. The same perovskite formulation and method of making, but in the absence of $PEA^+$ and $SCN^-$) to near 50 $cm^2$ $V^{-1}s^{-1}$ and 3 μs by using both additives. As shown herein, such an improved 3D/2D perovskite material can be combined with a CIGS layer to yield a mechanically stacked four terminal (4-T) polycrystalline perovskite/CIGS (copper indium gallium selenide) thin-film tandem solar cell capable of 26.5% efficiency.

Figure 4A:
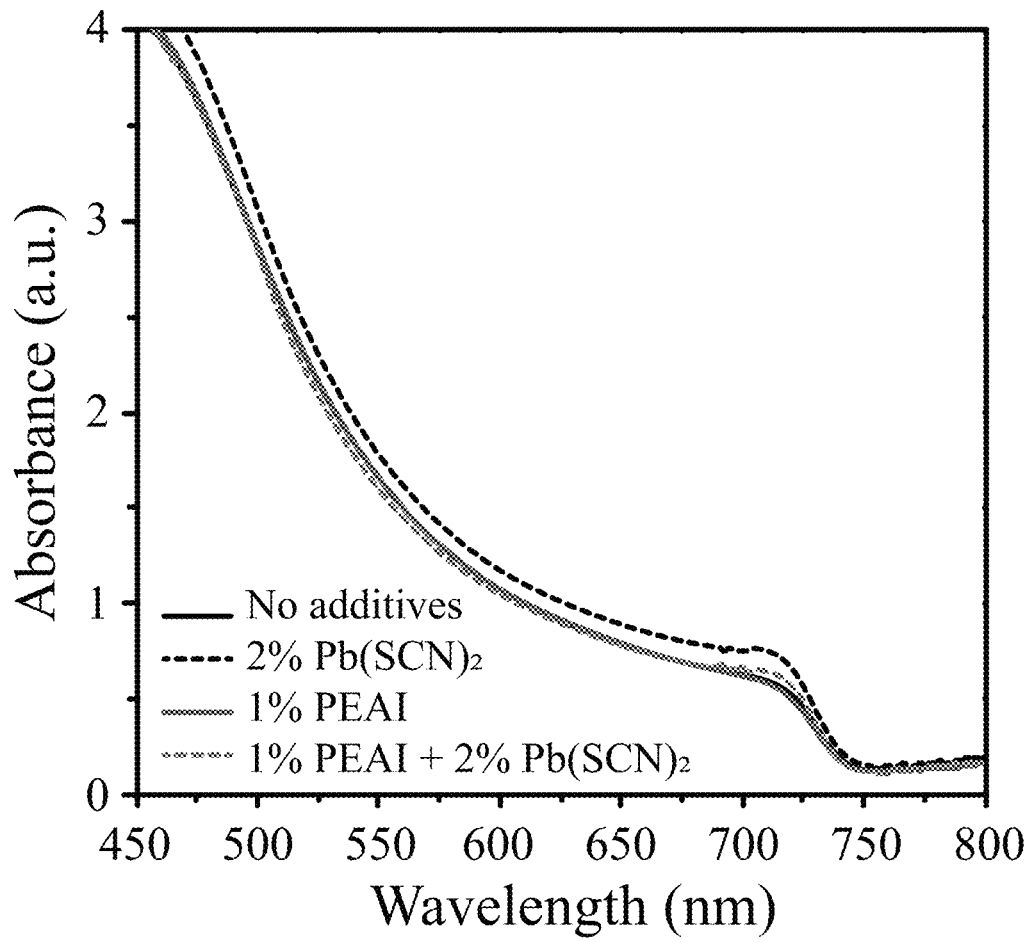
FIG. 4A illustrates a comparison of ultraviolet-visible absorption spectra of perovskite films prepared without and with additives, according to some embodiments of the present disclosure: 2 mol % $Pb(SCN)_2$, 1 mol % phenylethyl ammonium iodide (PEAT), or combining both 1 mol % PEAI and 2 mol % $Pb(SCN)_2$.
Figure 4B:
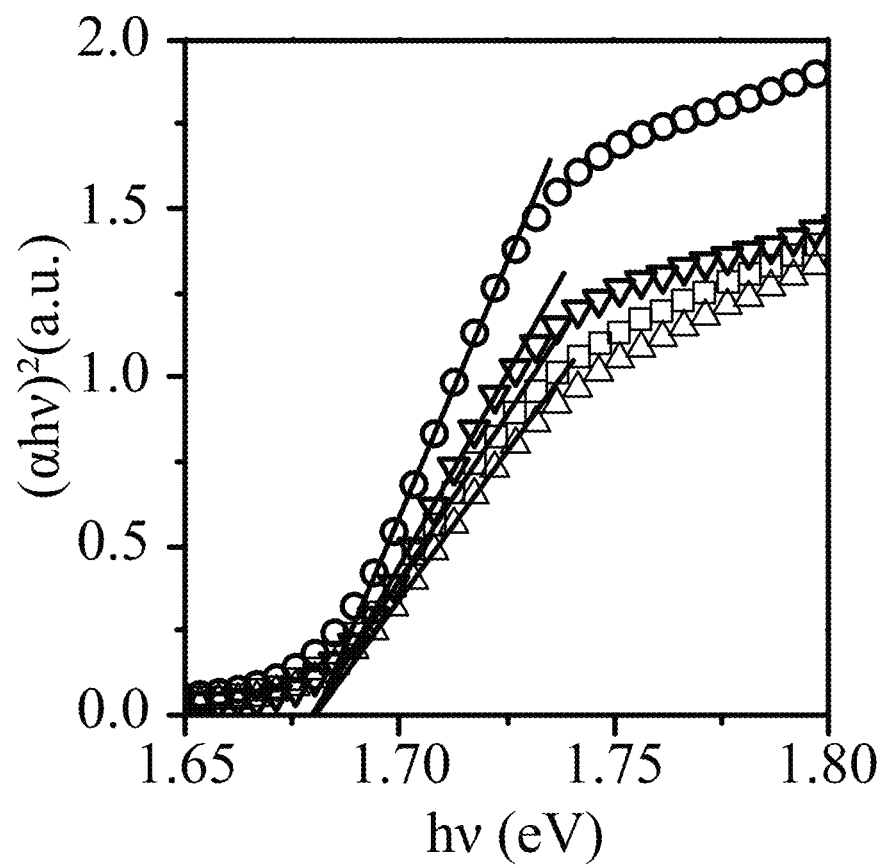
FIG. 4B illustrates Tauc plots of the absorption spectra to determine the bandgap (squares—no additives; circles—2% $Pb(SCN)_2$; triangles—1% PEAI; inverted triangles—1% PEAI+2% $Pb(SCN)_2$).
Figure 5A:
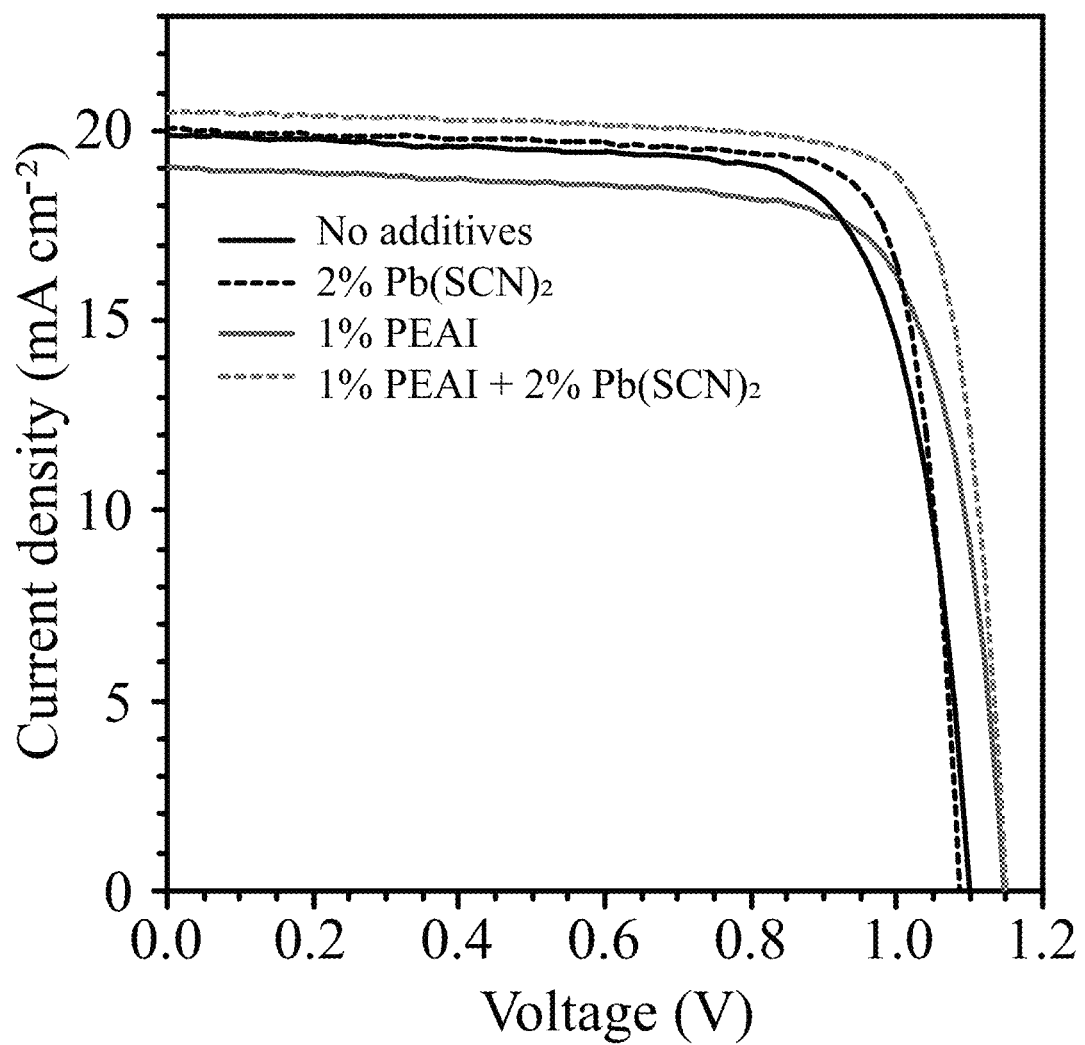
FIGS. 5A-5E illustrates a comparison of device characteristics, according to some embodiments of the present disclosure.
Figure 5B:
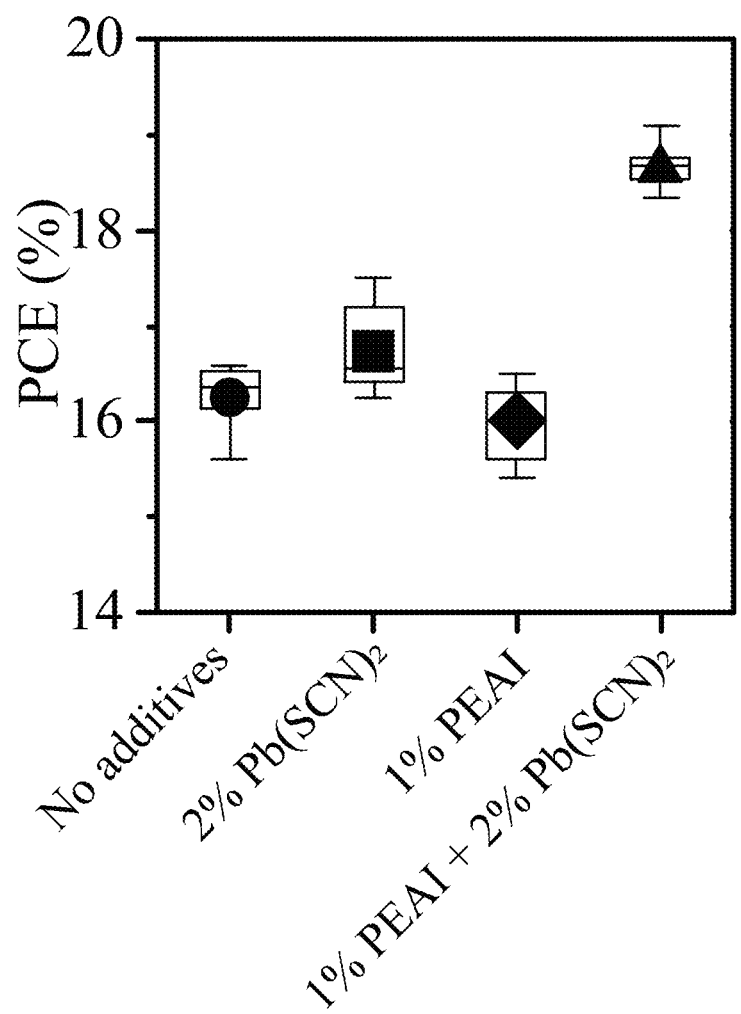
Figure 5C:
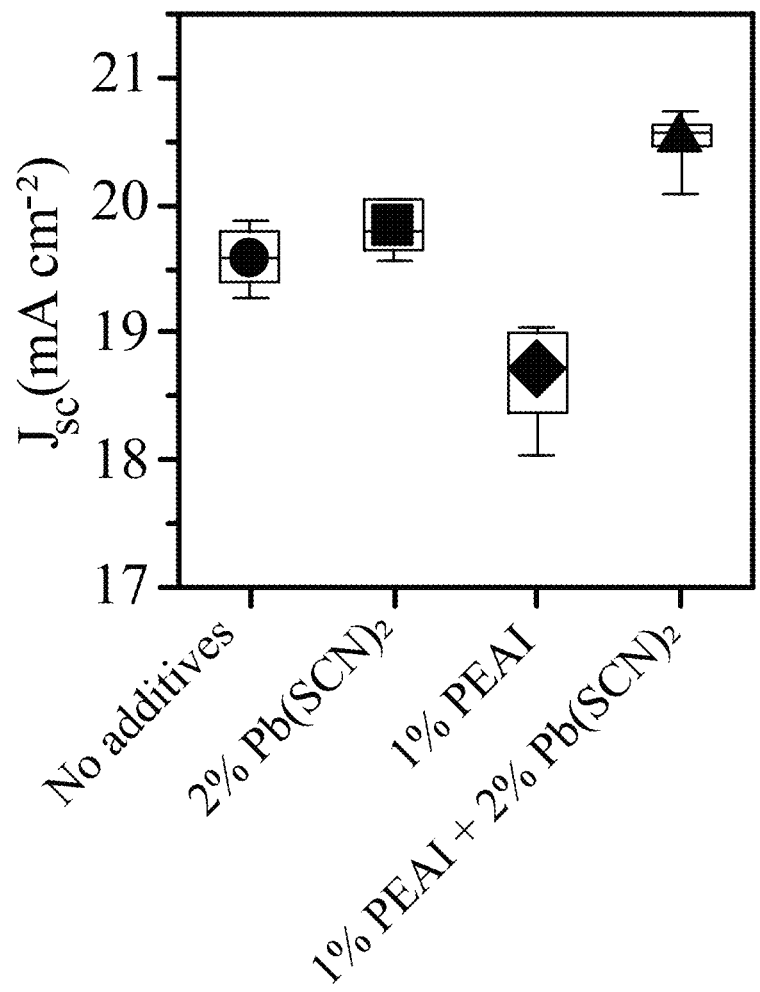
Figure 5D:
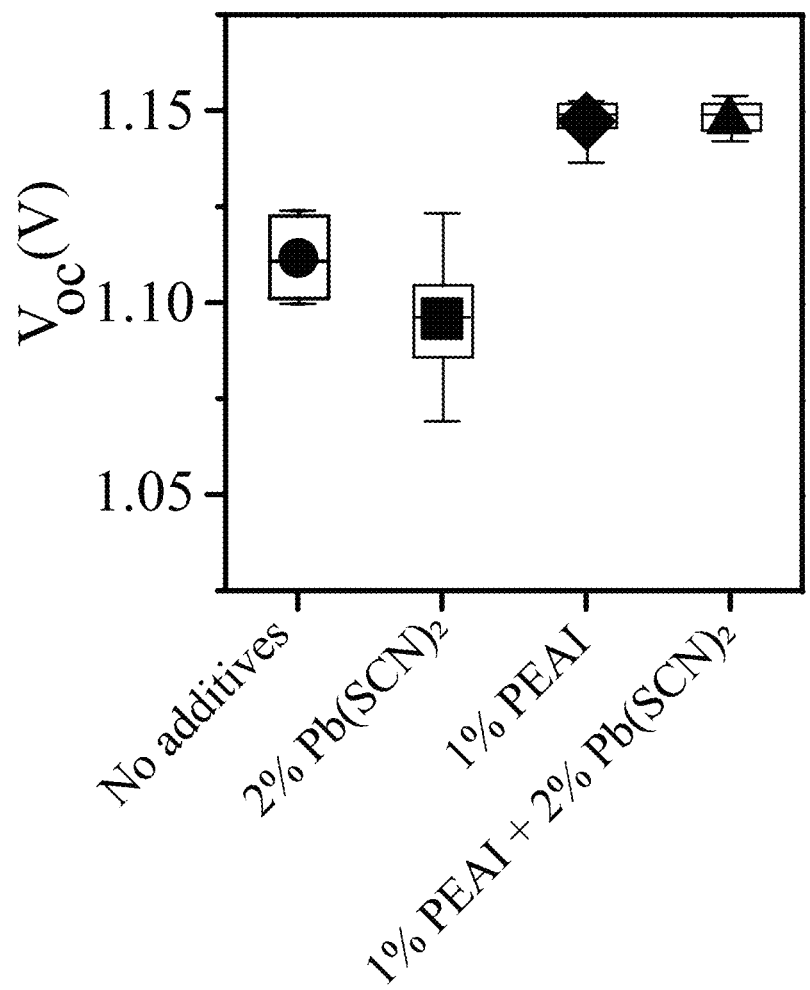
Figure 5E:
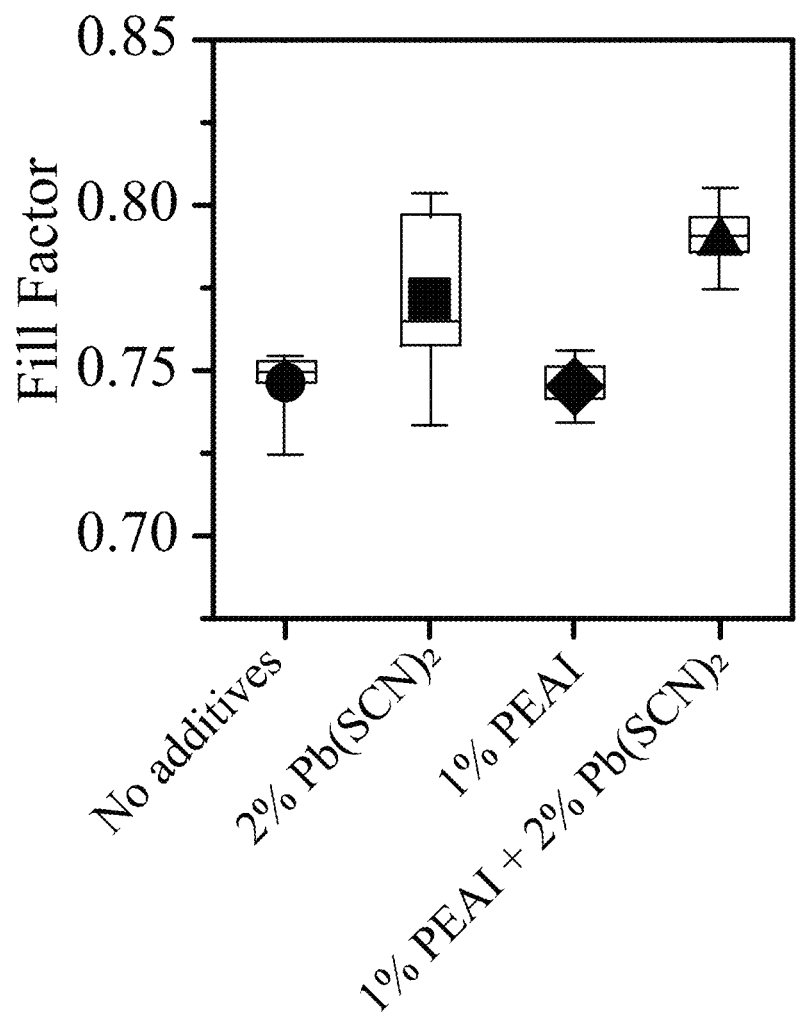
Figure 6:
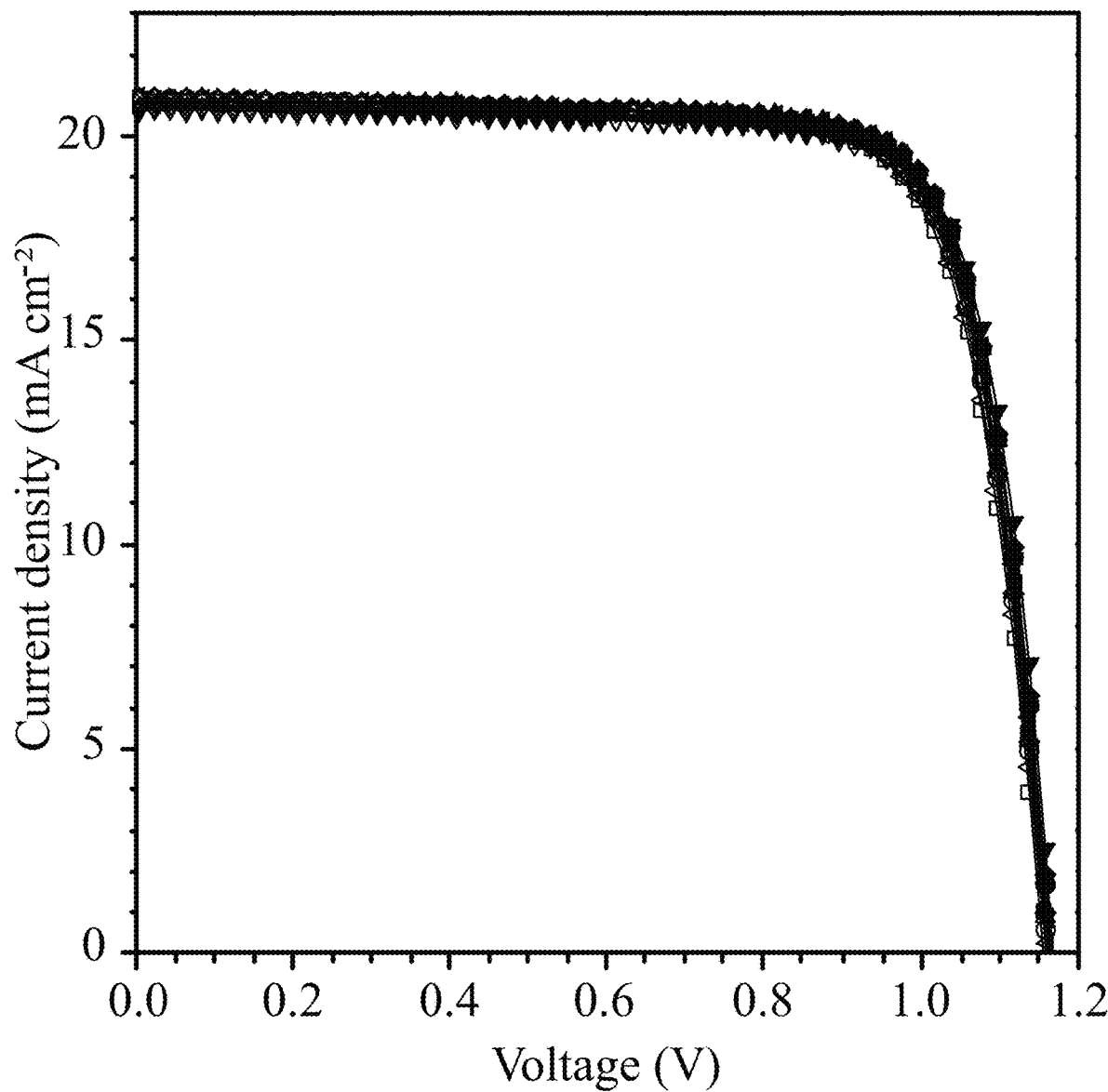
FIG. 6 illustrates the scan-rate dependence of J-V curves with both forward- and reverse-scan directions for perovskite solar cells described herein (for 0.05, 0.10, 0.20, 0.30, 0.50, and 1.0 V/s), according to some embodiments of the present disclosure. In this device, the perovskite film was prepared by combining additives of 1 mol % PEAI and 2 mol % $Pb(SCN)_2$.
Figure 7A:
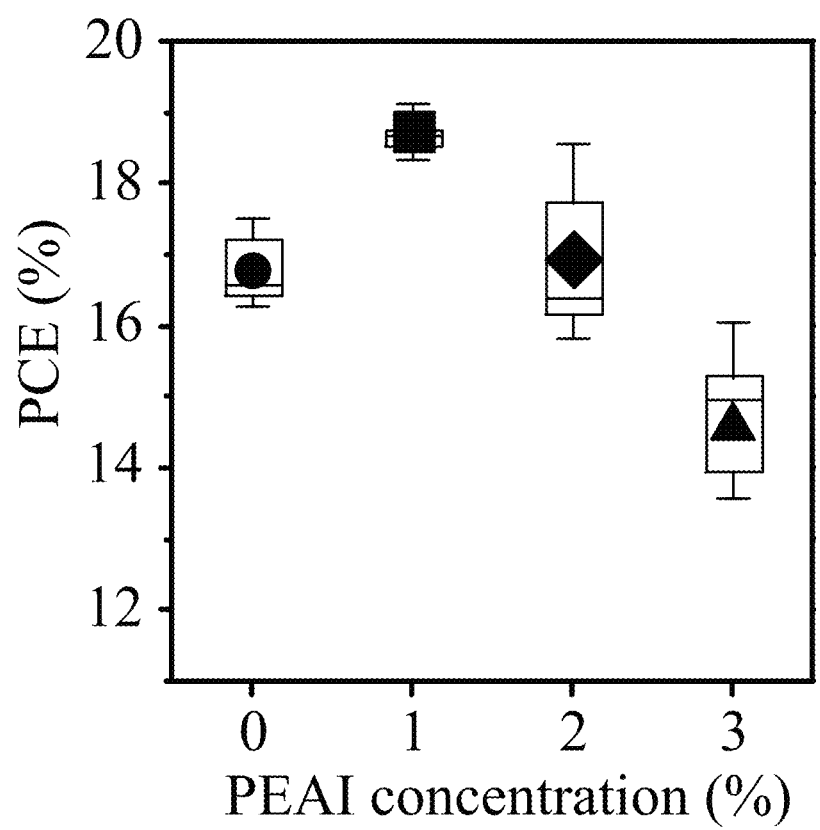
FIGS. 7A-7D illustrate the PEAI additive concentration effects on device characteristics, according to some embodiments of the present disclosure.
Figure 7B:
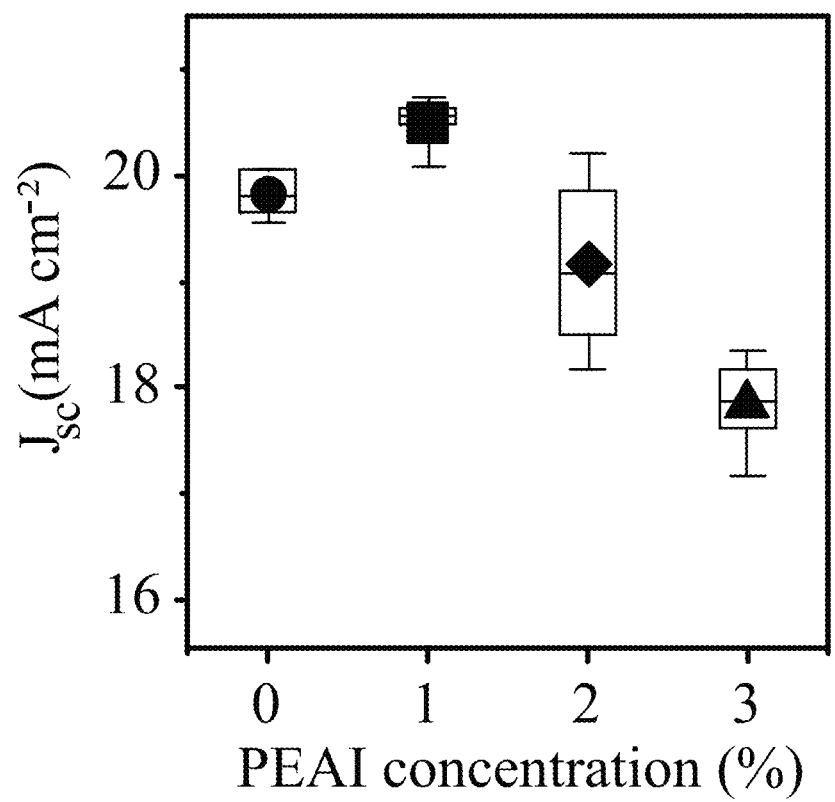
Figure 7C:
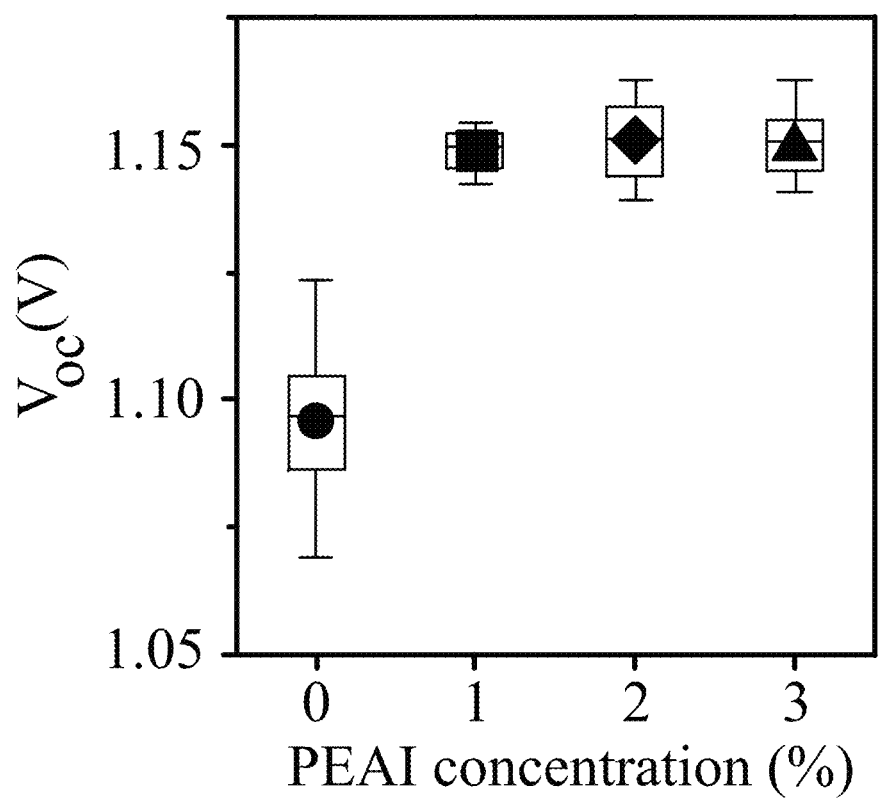
Figure 7D:
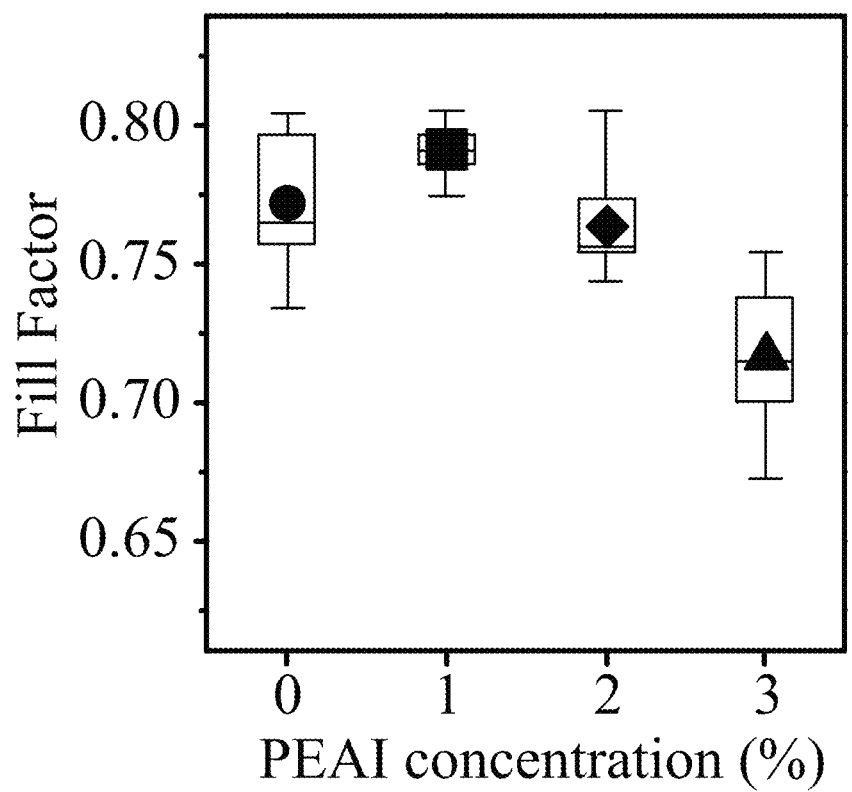

For purposes of illustration and feasibility, the perovskite composition described below was a lead-based mixed-halide (I—Br) and mixed-cation (Cs-MA-FA) perovskite $(FA_{0.65}MA_{0.20}Cs_{0.15})Pb(I_{0.8}Br_{0.2})_3$. However, other perovskite compositions can benefit from the methods described herein and fall within the scope of the present disclosure, for example, $(FA_{1-x-y}MA_xCs_y)(Pb_{1-z}Sn_z)(I_{1-m}Br_m)_3$, where x, y, z, m can each range between 0.0 to 1.0. The perovskite films were prepared by spin coating with a one-step precursor solution in a DMF/NMP mixed solvent. A typical ultraviolet-visible (UV-vis) absorption spectrum of a $(FA_{0.65}MA_{0.20}Cs_{0.15})Pb(I_{0.8}Br_{0.2})_3$ perovskite film is shown in FIG. 4A. The Tauc analysis of the absorption spectrum, shown in FIG. 4B, indicates that the optical bandgap is about 1.68 eV, which is close to the ideal bandgap (~1.7 eV) to pair with a ~1.1-eV bottom cell for tandem devices. FIG. 5A compares the typical photocurrent density-voltage (J-V) curves of perovskite solar cells (PSCs) based on $(FA_{0.65}MA_{0.20}Cs_{0.15})Pb(I_{0.8}Br_{0.2})_3$ perovskite films prepared without and with additives: 2 mol % $Pb(SCN)_2$, 1 mol % PEAI, or combining both additives 1 mol % PEAI and 2 mol % $Pb(SCN)_2$. These devices exhibited negligible hysteresis and scan-rate dependence; an example of the scan-rate dependence of both forward- and reverse-scan J-V characteristics is shown in FIG. 6. Statistics of this device are shown in FIGS. 5B-5E: short-circuit photocurrent density ($J_{sc}$) in FIG. 5B, open-circuit voltage ($V_{oc}$) in FIG. 5C, fill factor (FF) in FIG. 5D, and PCE and FIG. 5E. Note that using these additives did not significantly affect the absorption spectra and bandgap values of the perovskite films (see FIG. 4). The device stack used to collect the data of FIG. 5A was as follows: glass/ITO/PTAA/perovskite/C60/BCP/Ag, where ITO is indium tin oxide; PTAA is Poly(triarylamine) also known as Poly[bis(4-phenyl)(2,4,6-trimethylphenyl) amine]; C60 is a fullerene; and BCP is bathocuproine.

Figure 8A:
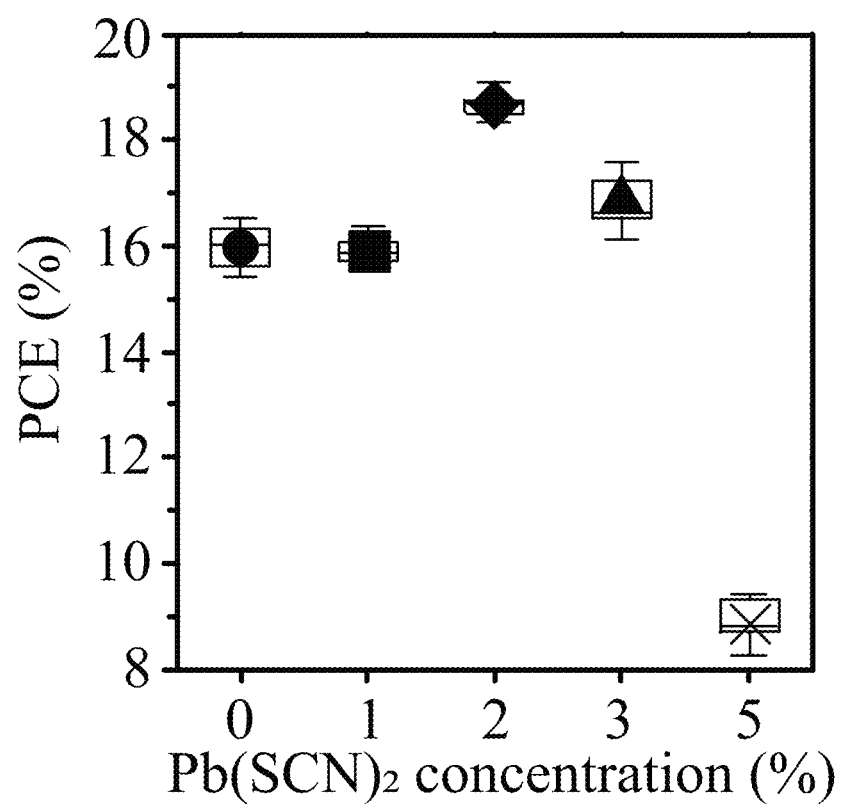
FIGS. 8A-8D illustrate $Pb(SCN)_2$ additive concentration effects on device characteristics, according to some embodiments of the present disclosure.
Figure 8B:
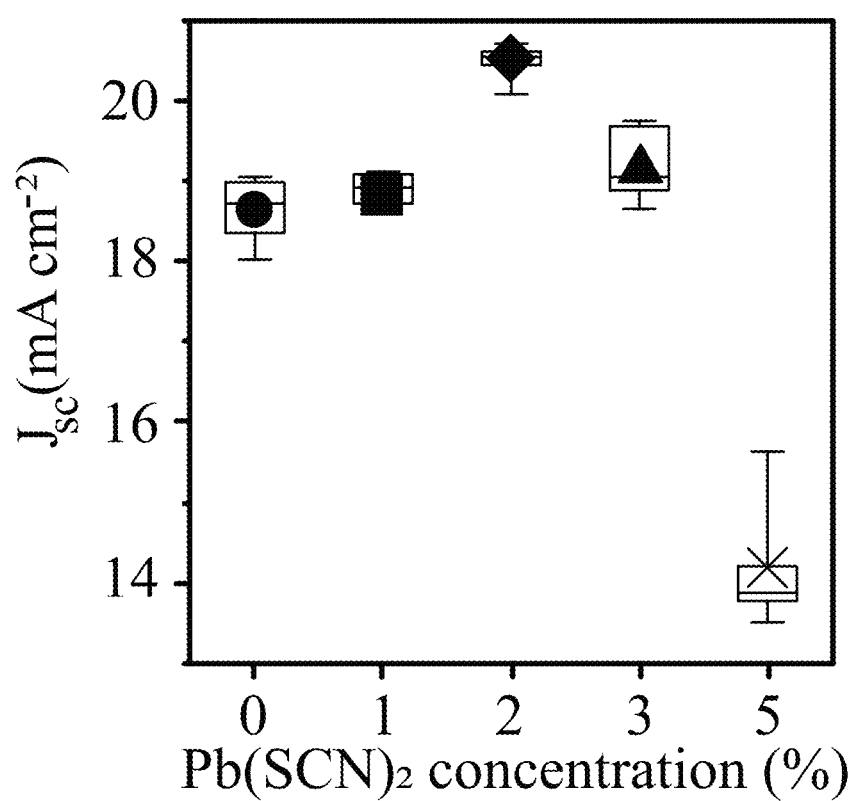
Figure 8C:
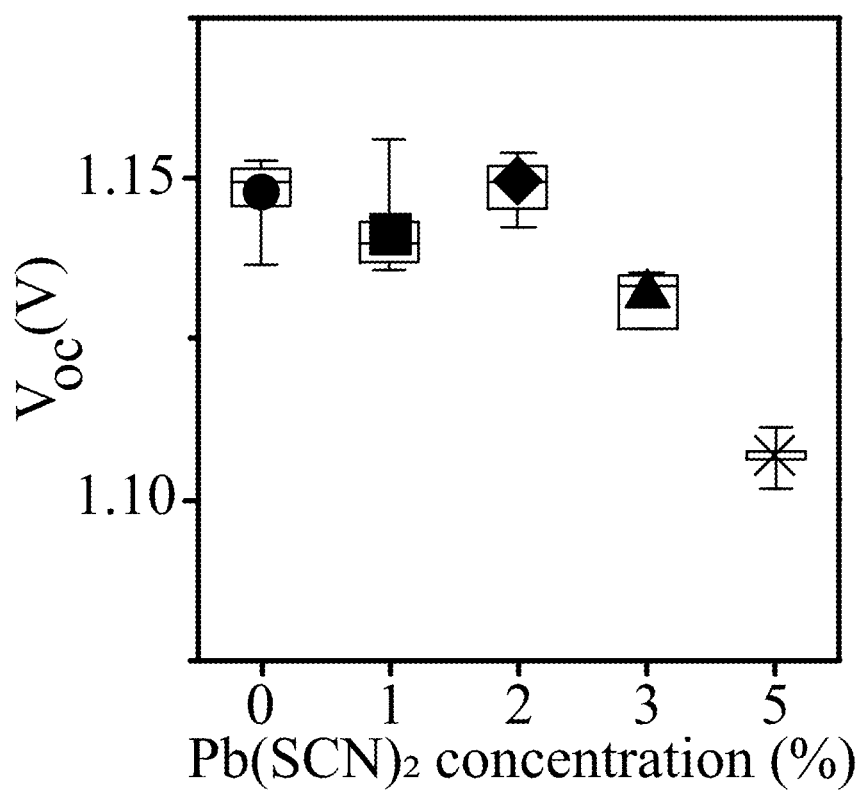
Figure 8D:
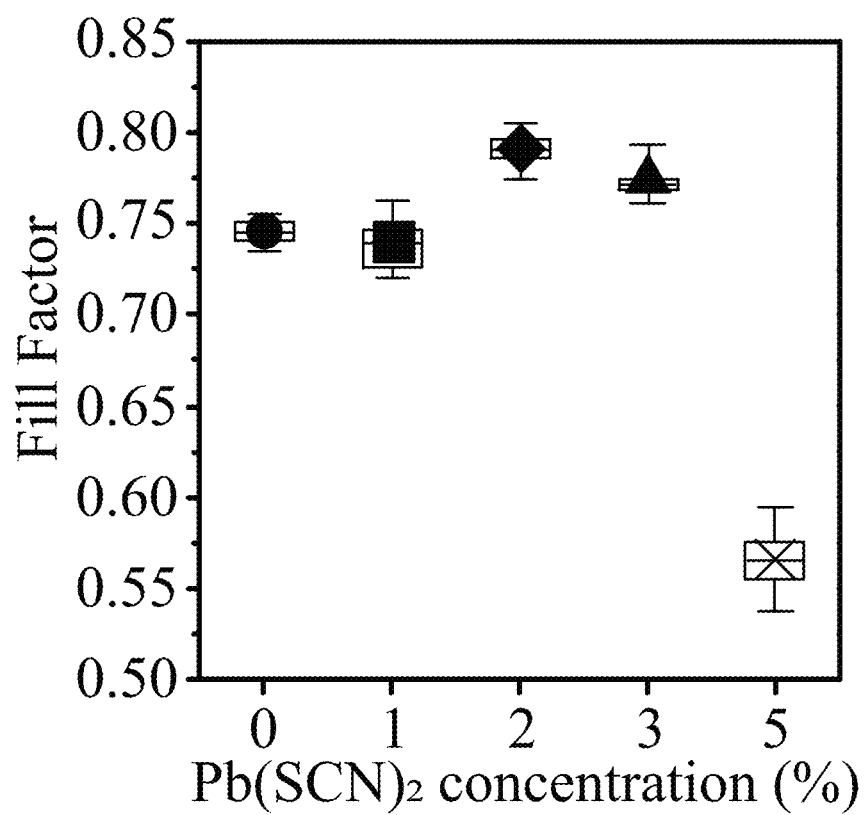

The synergistic effect of using both additives, PEAI and $Pb(SCN)_2$, is evident in the markedly improved device characteristics. Referring to FIGS. 7A-7D, using PEAI as the only additive increased the $V_{oc}$ by about 40-50 mV (see FIG. 7C), but reduced $J_{sc}$ by about 1 mA/$cm^2$ (see FIG. 7B), resulting in essentially no change in PCE (see FIG. 7A). In contrast, referring to FIGS. 8A-8D, using $Pb(SCN)_2$ as the only additive resulted in a clear increase of fill factor (FF) (see FIG. 8D and compare to FIG. 7D) and a slight increase of $J_{sc}$ (see FIG. 8B), but decreased $V_{oc}$ (see FIG. 4 8C), leading to an overall PCE improvement of about 0.5% to 1% (see FIG. 8A). When both additives, PEAI and $Pb(SCN)_2$, were used in the perovskite formulation, the average device PCE increased by >2% from 16.3% to 18.7% with improvements in all three photovoltaic parameters. The effect of PEAI and Pb(SCN)$_2$ concentrations on device characteristics were also evaluated. The effect of PEAI of increasing V$_{oc}$ remained essentially unchanged when the PEAI concentration is increased from 1 mol % to 3 mol %; however, both J$_{sc}$ and FF decreased substantially with higher PEAI concentrations, leading to significantly reduced PCE. Although using too little Pb(SCN)$_2$ (e.g., ~1 mol %) did not affect device performance, using about 5 mol % Pb(SCN)$_2$ significantly reduced the device performance.

Figure 9A:
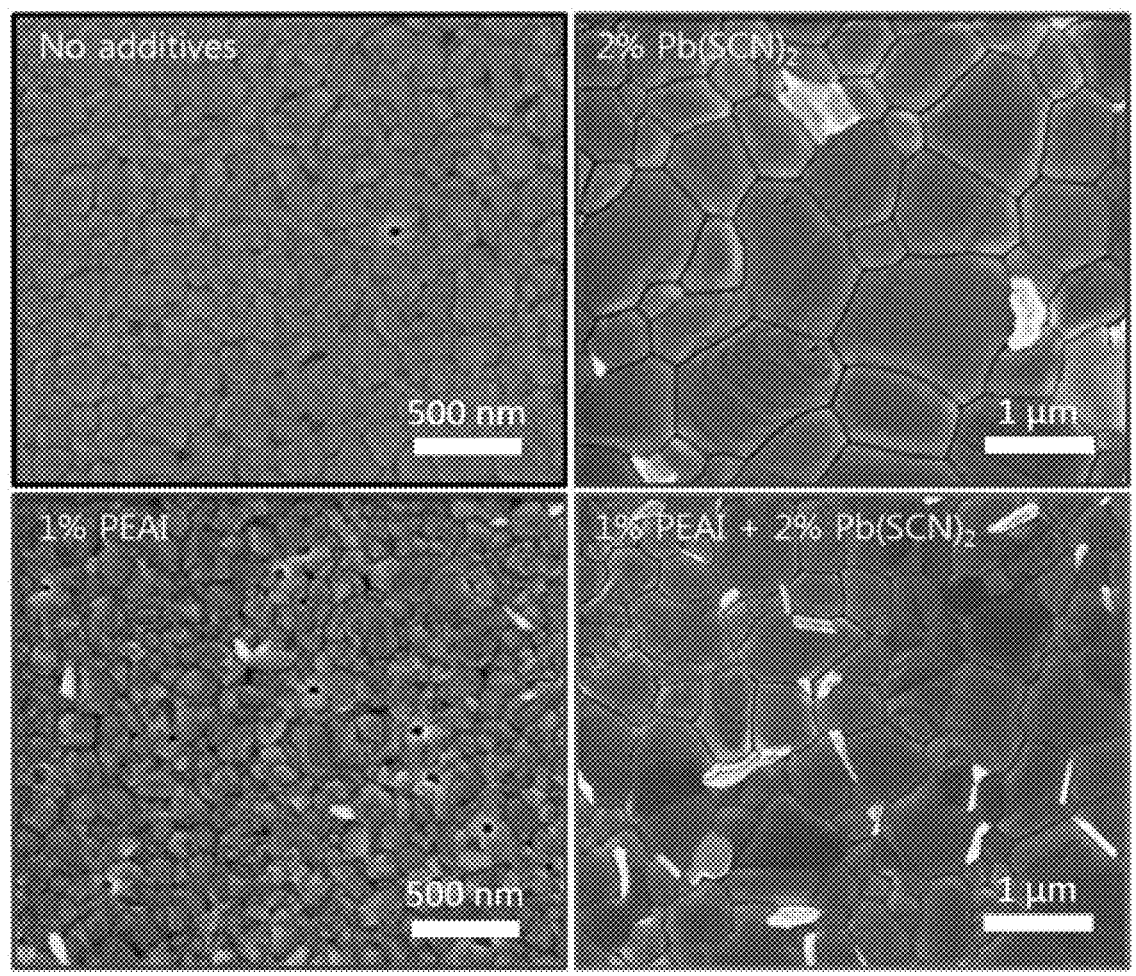
FIGS. 9A and 9B illustrate perovskite film morphology and crystal structure, according to some embodiments of the present disclosure.
Figure 9B:
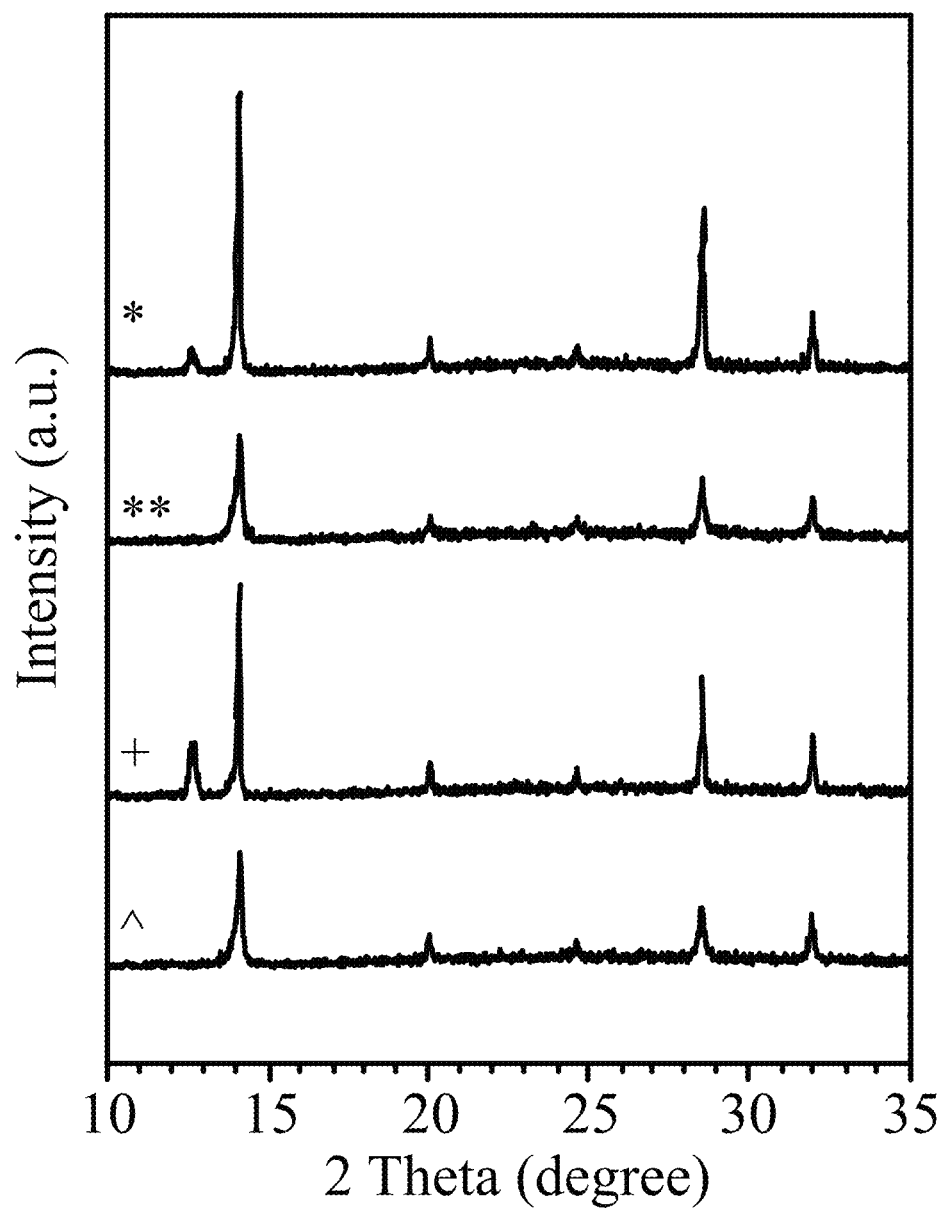
Figure 10:
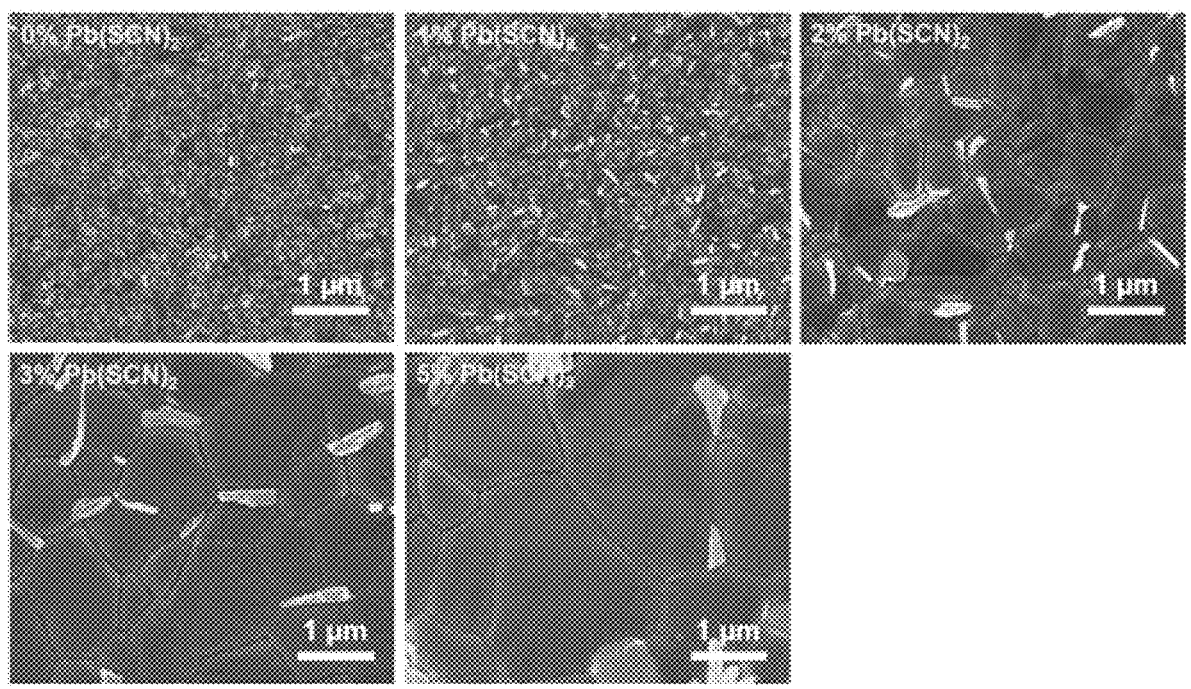
FIG. 10 illustrates top-view scanning electron microscopy (SEM) images of perovskite films with different $Pb(SCN)_2$ additive concentrations ranging from 0 mol % to 5 mol % (0, 1, 2, 3 and 5 mol %), according to some embodiments of the present disclosure. For all these films, 1 mol % PEAI was used.
Figure 11:
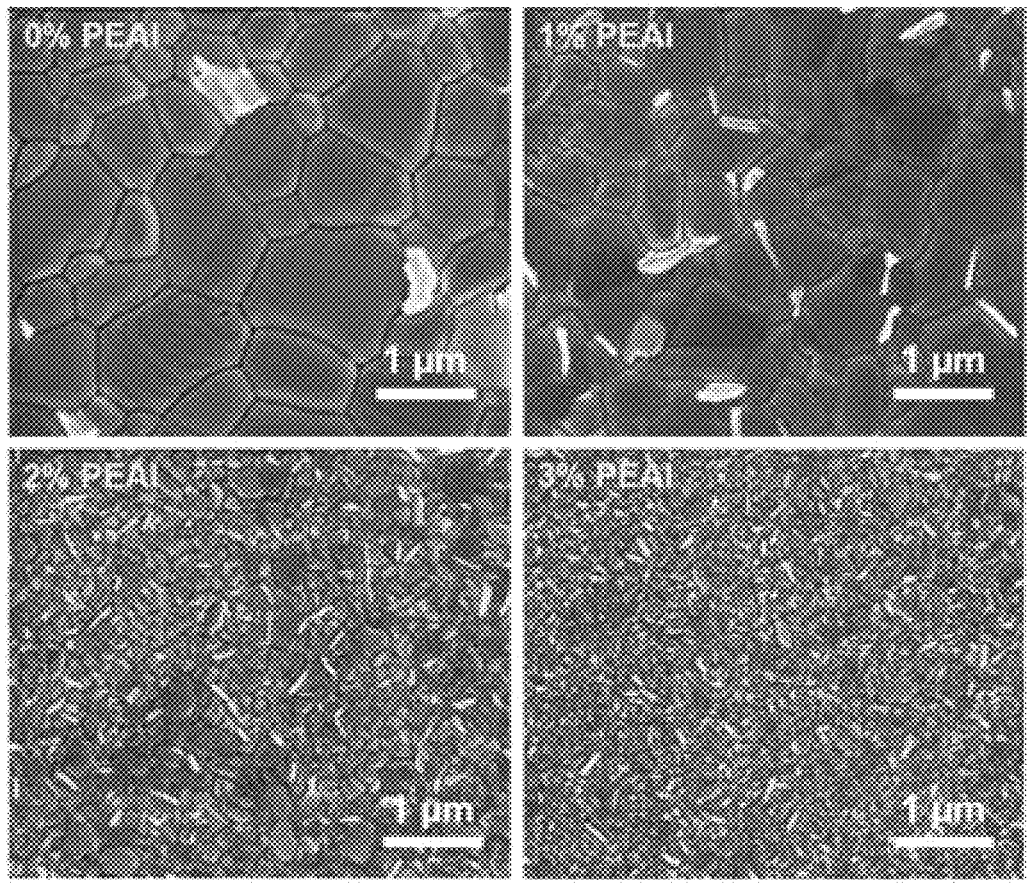
FIG. 11 illustrates top-view SEM images of perovskite films with different PEAI additive concentrations ranging from 0 mol % to 3 mol % (0, 1, 2, and 3 mol %), according to some embodiments of the present disclosure. For all these films, 2 mol % $Pb(SCN)_2$ was used.
Figure 12:
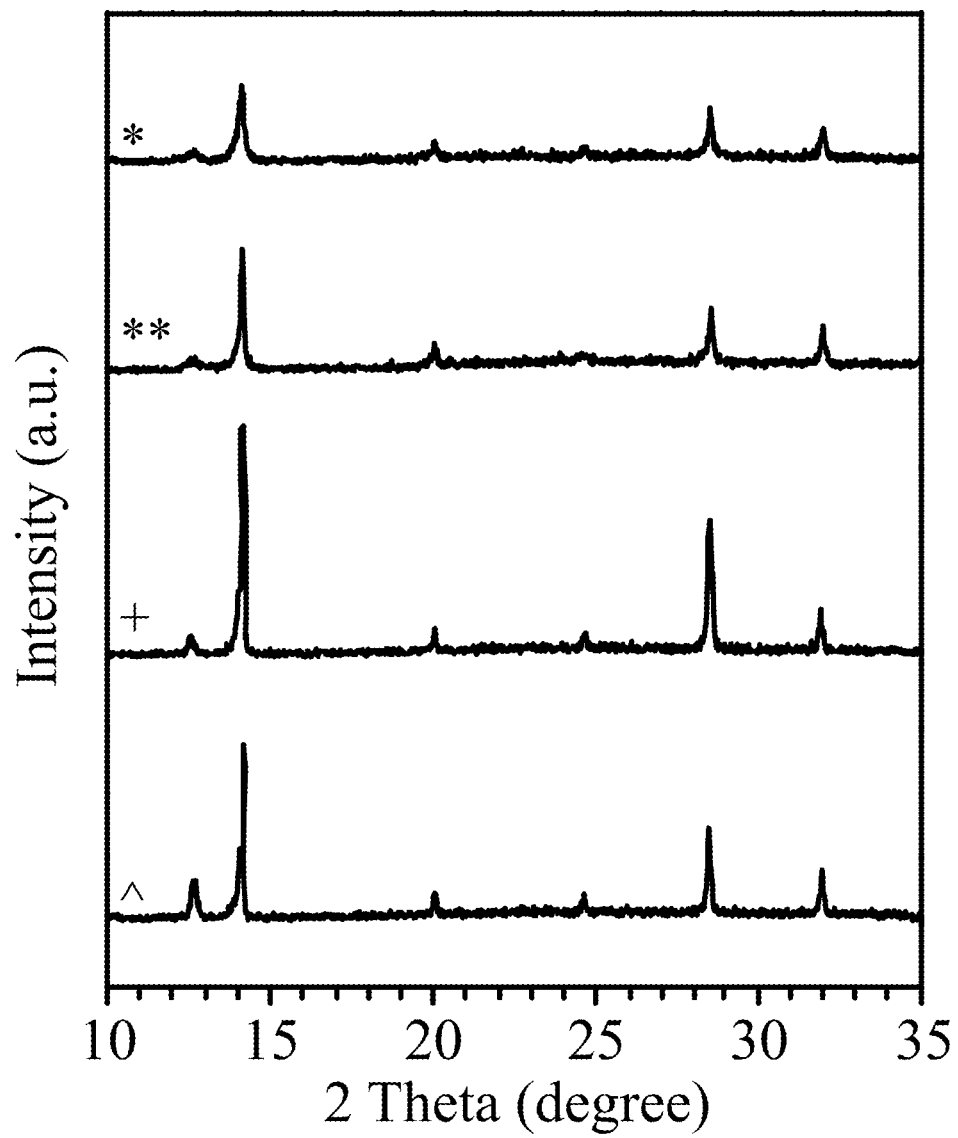
FIG. 12 illustrates X-ray diffraction (XRD) patterns of perovskite films produced using varying PEAI additive concentrations ranging from 0 mol % to 3 mol % (0 (^), 1 (+), 2 (**), and 3 (*) mol %), according to some embodiments of the present disclosure. For all these films, 2 mol % $Pb(SCN)_2$ was used.

To understand the effect of PEAI and Pb(SCN)$_2$ on improving device performance in the example perovskite material having 1.68 eV bandgap and a composition of (FA$_{0.65}$MA$_{0.20}$Cs$_{0.15}$)Pb(I$_{0.8}$Br$_{0.2}$)$_3$, several structural and optoelectronic characterizations were completed. FIG. 9A compares the scanning electron microscope (SEM) images of perovskite films prepared without and with the additives. Using 2 mol % Pb(SCN)$_2$ resulted in significant grain growth from a starting size (i.e. characteristic length) between about 200 nm and about 300 nm to a final size between 1 μm and 5 μm in size, versus a grain size of between about 300 nm to 10 μm, when using both PEAI and Pb(SCN)$_2$. This effect is more clearly demonstrated when the amount of Pb(SCN)$_2$ additive was changed over a wide range from 0 mol % to 5 mol % (see FIG. 10). However, the use of 1 mol % PEAI additive, in the absence of Pb(SCN)$_2$, reduced the perovskite grain size; the reduced grain size became more evident when the amount of PEAI was changed from 0 mol % to 3 mol % (see FIG. 11). The use of PEAI likely causes the disruption of the crystal growth of 3D perovskite due to the larger size of PEA than other A-site cations (e.g., FA, MA, or Cs). FIG. 9B compares the X-ray diffraction (XRD) patterns of the same samples as shown in FIG. 9A. Interestingly, the use of both PEAI and Pb(SCN)$_2$ substantially increased (by about 40% of the integrated peak area) the main XRD perovskite peak near 14° compared to the sample using only Pb(SCN)$_2$, despite the clear decrease of grain size. This illustrates that combining PEAI and Pb(SCN)$_2$ in perovskite formation has a synergistic effect on improving the perovskite crystallinity when compared to simply using Pb(SCN)$_2$, despite the limited grain growth caused by PEAI. The smaller grain size with increasing PEAI is consistent with the reduction of XRD peaks when the amount of PEAI was changed from 0 mol % to 3 mol % (see FIG. 12).

Figure 13:
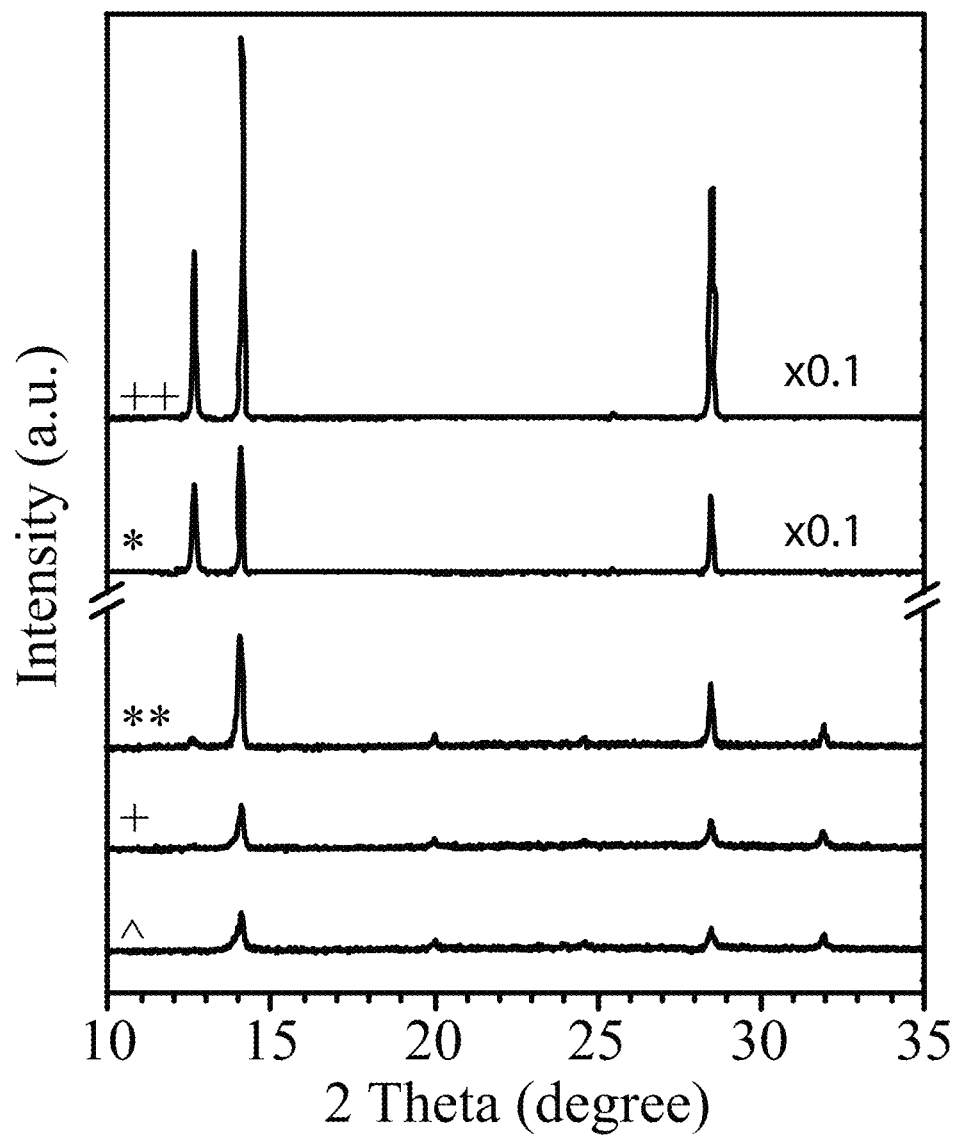
FIG. 13 illustrates XRD patterns of perovskite films produced using varying $Pb(SCN)_2$ additive concentrations ranging from 0 mol % to 5 mol % (0 (^), 1 (+), 2 (**), 3 (*), and 5 (++) mol %). For all these films, 1 mol % PEAI was used, according to some embodiments of the present disclosure.

One potential issue of using Pb(SCN)$_2$ additive is the formation of excess PbI$_2$. A small amount of excess PbI$_2$ is usually beneficial for PSC operation. However, too much PbI$_2$ is often detrimental to PSC performance. FIG. 13 shows that the amount of PbI$_2$ increased significantly along with the strong increase of the main perovskite diffraction peak; the formation of excess PbI$_2$ likely caused the decrease of the device characteristics at higher Pb(SCN)$_2$ concentrations (see FIGS. 8A-8D). In this context, it is important to note that combining 1 mol % PEAI and 2 mol % Pb(SCN)$_2$ in perovskite preparation reduced the formation of PbI$_2$ by more than two-fold (as inferred by the XRD peak area) than the sample using only 2 mol % Pb(SCN)$_2$ (see FIG. 9B).

The excess PbI$_2$ induced by Pb(SCN)$_2$ additive during perovskite formation can be located at/near the grain boundaries (GBs). The suppressed formation of PbI$_2$ when PEAI is added to the perovskite precursor, along with the use of Pb(SCN)$_2$ (see FIG. 2B), is likely caused by the strong molecular interaction between PEAI and PbI$_2$ because PEAI may react with PbI$_2$ as well as Pb(SCN)$_2$ to form 2D/qausi-2D structures, according to the following general reaction (1a) and specific exemplary reaction (1b):

$$2A'X + (1-x)BX_2 + xBX'_2 \rightarrow A'_2B(X_{4-2x}X'_{2x}) \quad (1a)$$

$$2PEAI + (1-x)PbI_2 + xPb(SCN)_2 \rightarrow (PEA)_2Pb(I_{4-2x}SCN_{2x}) \quad (1b)$$

where the form and/or stoichiometry of the final 2D structures may depend on the amount of PEAI, PbI$_2$, Pb(SCN)$_2$, or in other forms with participation from other A-site cations (e.g., MA or FA), and 0≤x≤1. The formation of 2D or quasi-2D perovskites at/near GBs in 3D perovskites can enhance the stability of PSCs based on mixed 3D/2D perovskites. From above, recall that a 2D structure is generally described, with two A cations (e.g. A=FA and A'=PEA+) and one anion (e.g. X'=SCN"), as $A'_mA_{n-1}B_nX'_{3n+1}$. When n is equal to 1, the general structure reduces to the 2D structure defined by $A'_mBX'_4$, where m=2 for a monovalent A' and m=1 for a divalent A'. When n>1, the perovskite structure is referred to herein as "quasi-2D".

Possible reactions that could lead to the formation of 2D or quasi-2D materials as predicted by Reaction (1) above were also evaluated. These were (each first in general form (2a-4a), followed by specific exemplary reactions (2b-4b):

$$2A'X + BX_2 \rightarrow A'_2BX_4 \quad (2a)$$

$$2PEAI + PbI_2 \rightarrow (PEA)_2PbI_4 \quad (2b)$$

$$2A'X + BY_2 \rightarrow A'_2BX_2X'_2 \quad (3a)$$

$$2PEAI + Pb(SCN)_2 \rightarrow (PEA)_2Pb(I_2SCN_2) \quad (3b)$$

$$2A'Y + BY_2 \rightarrow A'_2BX'_4 \quad (4a)$$

$$2PEA(SCN) + Pb(SCN)_2 \rightarrow (PEA)_2Pb(SCN_4). \quad (4b)$$

Figure 19:
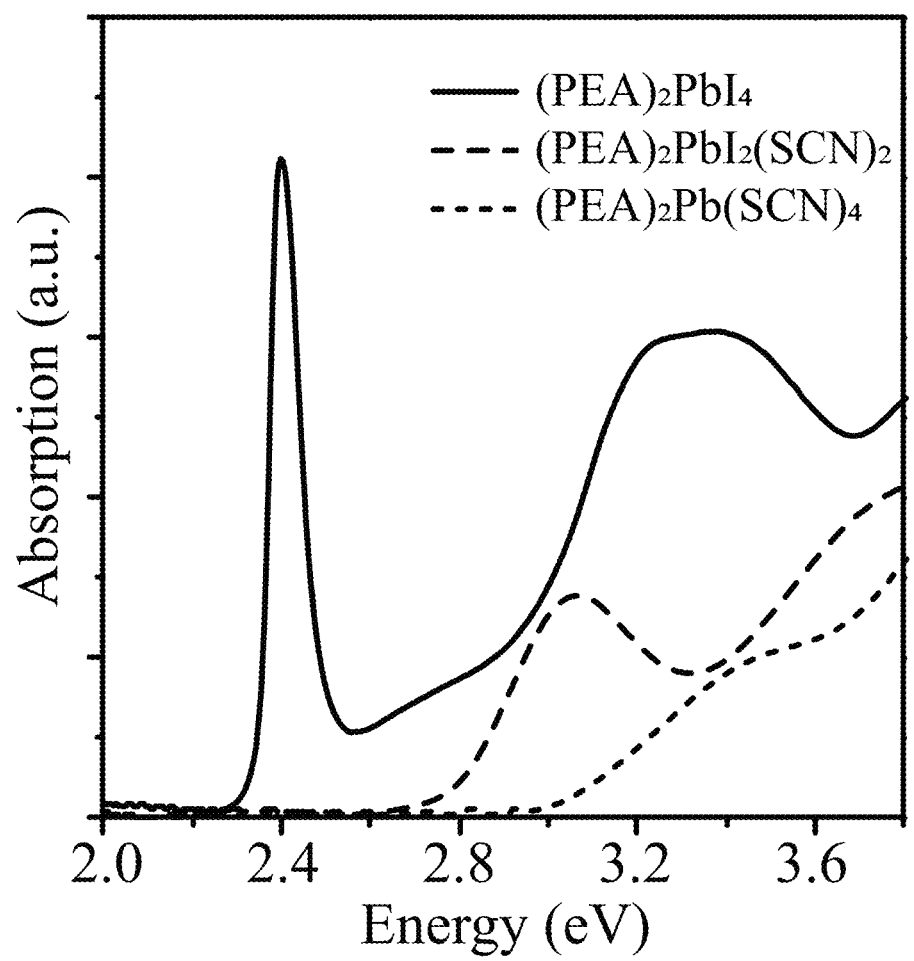
FIG. 19 illustrates absorption spectra for three reactions that may lead to the formation of 2D or quasi-2D materials, according to some embodiments of the present disclosure.

FIG. 19 illustrates the absorption spectra of these three reaction products. The bandgap values determined from these plots are 2.35 eV for (PEA)$_2$PbI$_4$, 2.78 eV for (PEA)$_2$PbI$_2$(SCN)$_2$, and 3.04 eV for (PEA)$_2$Pb(SCN)$_4$. It is worth noting that the exact reaction(s) during 3D-2D perovskite formation could be more complicated as the participation from MAI or FAI or CsI from the precursor could lead to formation of quasi-2D structures with higher layer numbers. For example, $$2A'X + (n-1)AX + nBX_2 \rightarrow A'_2A_{n-1}B_nX_{3n+1} \quad (5a)$$

$$2PEAI + (n-1)MAI + nPbI_2 \rightarrow (PEA)_2(MA)_{n-1}Pb_nI_{3n-1} \quad (5b)$$

where the layer number n can be adjusted by changing the molar ratios of the precursor components; when n=1, it reduces to Equations 2a and 2b shown above.

Reactions 1a through 5b illustrate that, depending on the ratios of reactants and additives provided in a mixture, not only can the composition of the final perovskite be tailored to a specific composition of interest, but the amount of 2D versus 3D perovskite structures contained in the final perovskite film or layer can also be determined. Thus, in general, some embodiments of the present disclosure describe perovskite solids having both a 3D structure portion, defined by $A_{1-w}A'_wB_{1-y}B'_y(X_{1-z}X'_z)_3$, and a 2D structure portion defined by $(A_{1-c}A'_c)_2B_{1-d}B'_d(X_{1-e}X'_e)_4$, where each of w, y, z, c, d, and e are between greater than or equal to zero and less than or equal to one, both A and A' are monovalent, both B and B' are divalent, and both X and X' are monovalent. The ratio of the 2D structure portion to the 3D structure portion contained in the overall perovskite solid (e.g. a film, layer, particle, etc.), and as determined by the relative amounts of the perovskite starting materials (e.g. AX, BX$_2$, A'X, BX'$_2$, A'X', etc.) may be represented by the following equation:

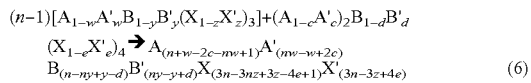

$$(n-1)[A_{1-w}A'_{w}B_{1-y}B'_{y}(X_{1-z}X'_{z})_3]+(A_{1-c}A'_c)_2B_{1-d}B'_d(X_{1-e}X'_e)_4 \rightarrow A_{(n+w-2c-nw+1)}A'_{(nw-w+2c)}B_{(n-ny+y-d)}B'_{(ny-y+d)}X_{(3n-3nz+3z-4e+1)}X'_{(3n-3z+4e)}$$ (6)

where, when n equals one, the perovskite is entirely in a 2D structure, and as n gets very large (e.g. approaches infinity, the perovskite is essentially entirely a 3D structure. In between these two extremes, the perovskite is a mixture of both 2D and 3D having the stoichiometry as shown in the product of Reaction 6.

Perovskite GBs (including surfaces) could have various types of structural defects, such as halide vacancies ($V_I$), A-site vacancies ($V_{MA}$), excess Pb$^{2+}$, and Pb—I antisite (PbI$_3^-$). Due to the ionic nature of perovskites, many of these defects are either positively or negatively charged. In addition to the reduced formation of excess PbI$_2$ arising from the interaction between PEAI and PbI$_2$, it can be hypothesized that the PEA$^+$ cations and SCN$^-$ anions could passivate certain charged defects. The lone pair of electrons from sulfur in the S-donor Lewis base (including SCN$^-$) can bind to under-coordinated Pb atoms, which could form via losses of A-site cations and/or halides during annealing. Defects associated with under-coordinated Pb or halide vacancies may be passivated by SCN$^-$ located at/near GBs. In addition, PEA$^+$ may fill in A-site vacancies (e.g., $V_{MA}$) during perovskite preparation and the thermal annealing process. Thus, defects associated with A-site vacancies are also expected to be reduced.

Figure 14A:
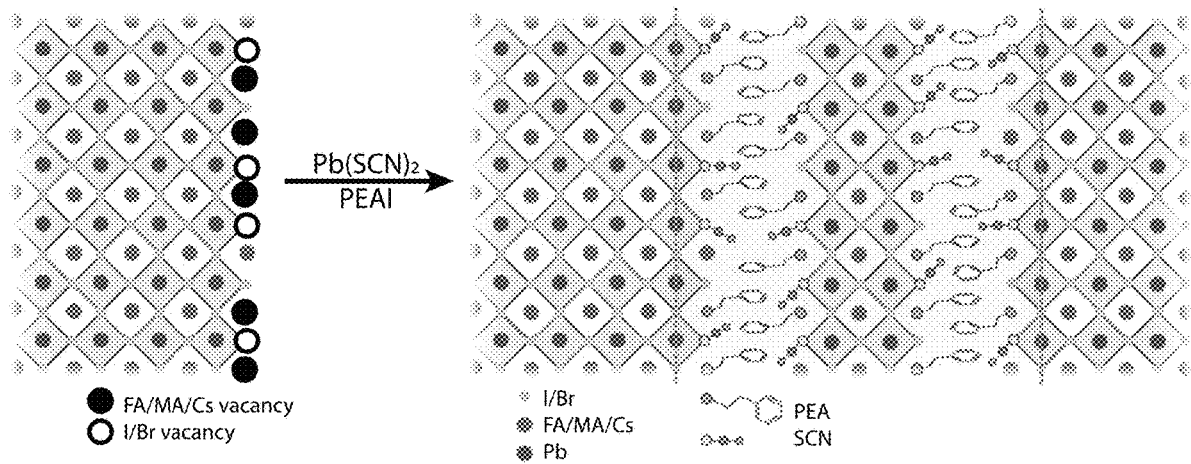
FIGS. 14A and 14B illustrate the synergistic effect of defect suppression, according to some embodiments of the present disclosure.
Figure 14B:
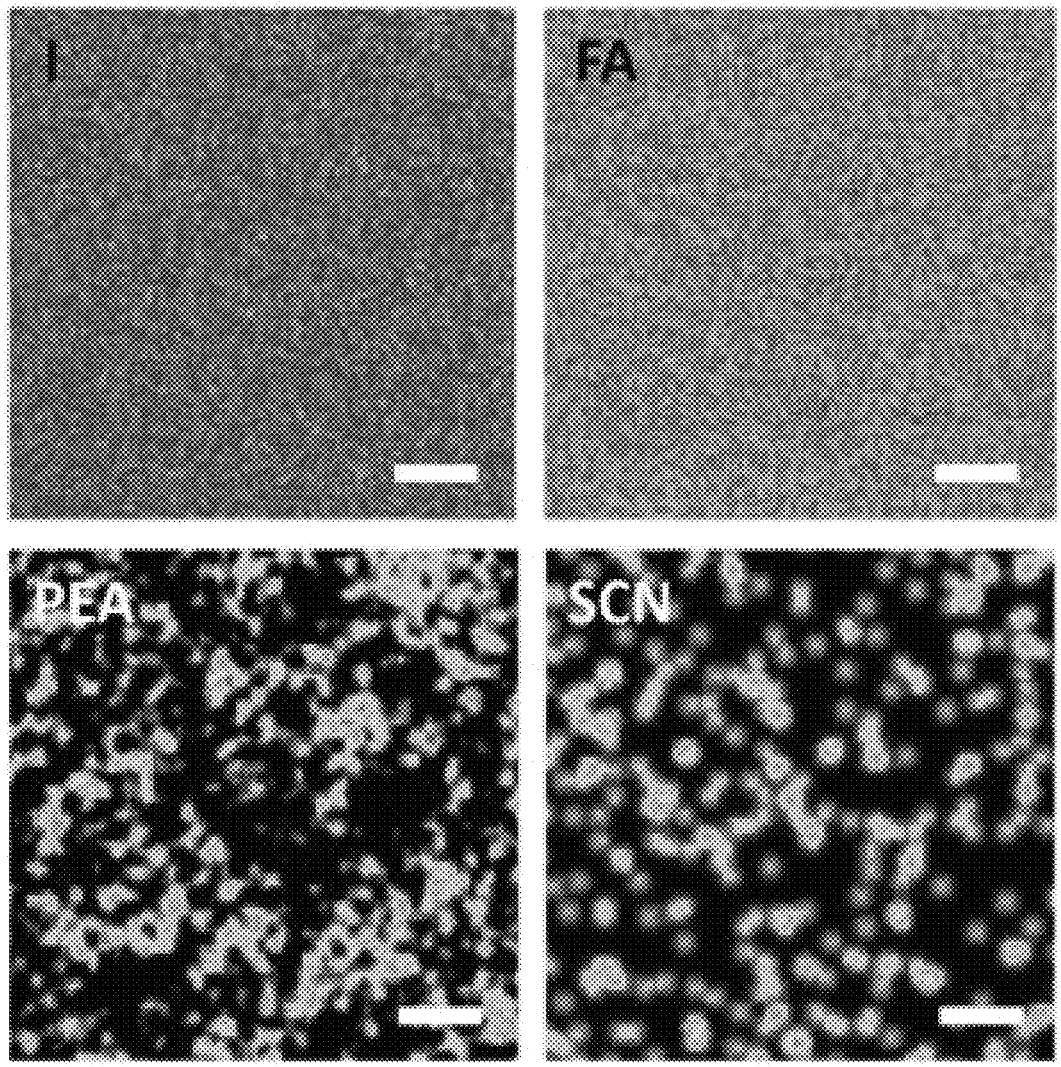

Without wishing to be bound by theory, one defect passivation mechanism suggests that both PEA$^+$ and SCN$^-$ can be primarily located at/near the GBs. To check this hypothesis, time-of-flight secondary-ion mass spectrometry (TOF-SIMS) tomography was used to study the exemplary (FA$_{0.65}$MA$_{0.20}$Cs$_{0.15}$)Pb(I$_{0.8}$Br$_{0.2}$)$_3$ perovskite thin film prepared by using both 1 mol % PEAI and 2 mol % Pb(SCN)$_2$ additives in the perovskite precursor. TOF-SIMS is one of the few characterization techniques that can provide chemical information with a spatial resolution of up to about 100 nm. FIG. 14B compares the TOF-SIMS 2D images of a few selected species (I, FA, PEA, and SCN). It is evident that both I and FA are distributed uniformly across perovskite grains, whereas PEA$^+$ and SCN$^-$ tend to segregate near GBs. This observation is consistent with the passivation mechanism discussed above.

Figure 15A:
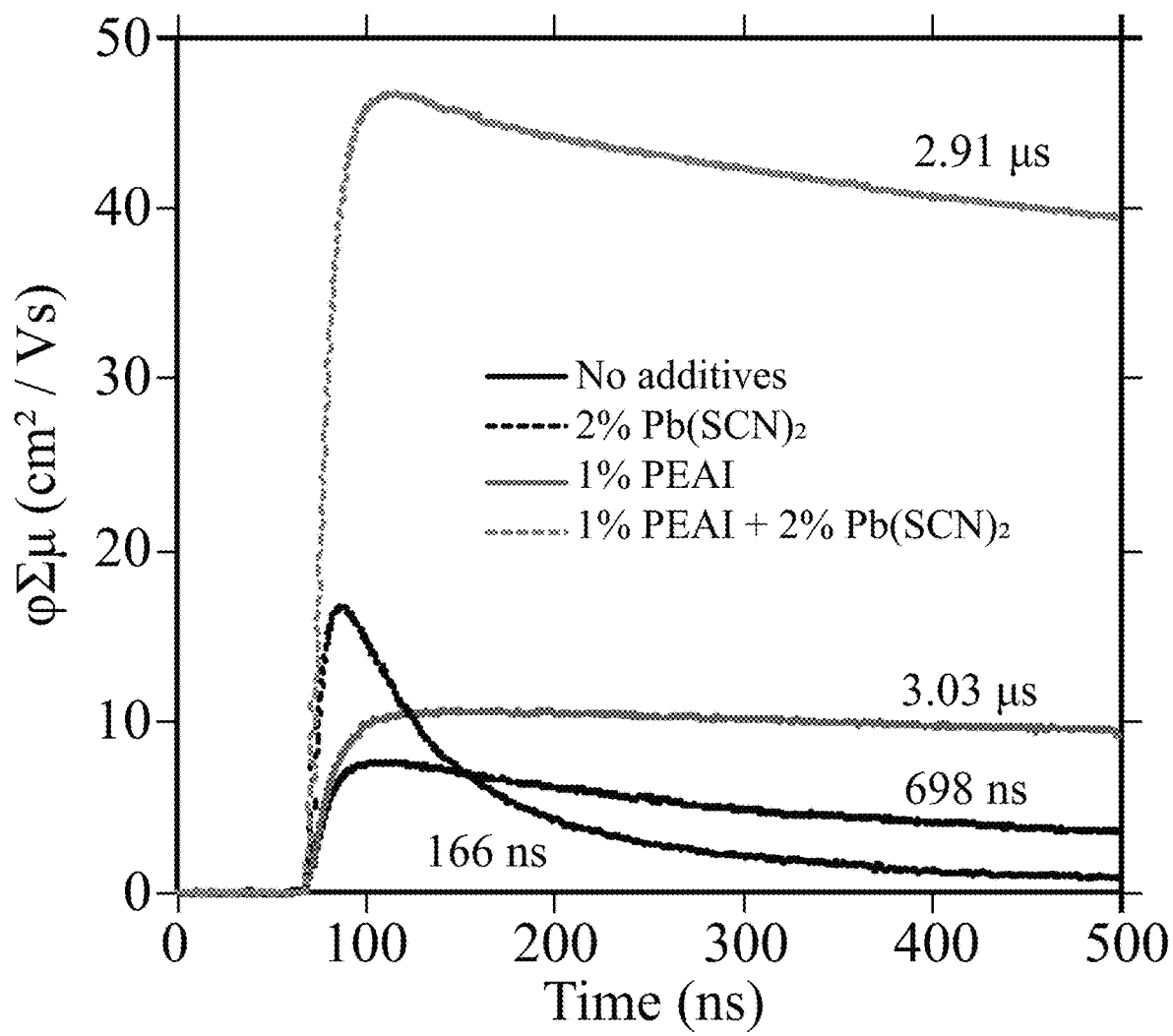
FIGS. 15A and 15B illustrate charge-carrier dynamics of perovskite films by time-resolved microwave conductivity characterization, according to some embodiments of the present disclosure.
Figure 15B:
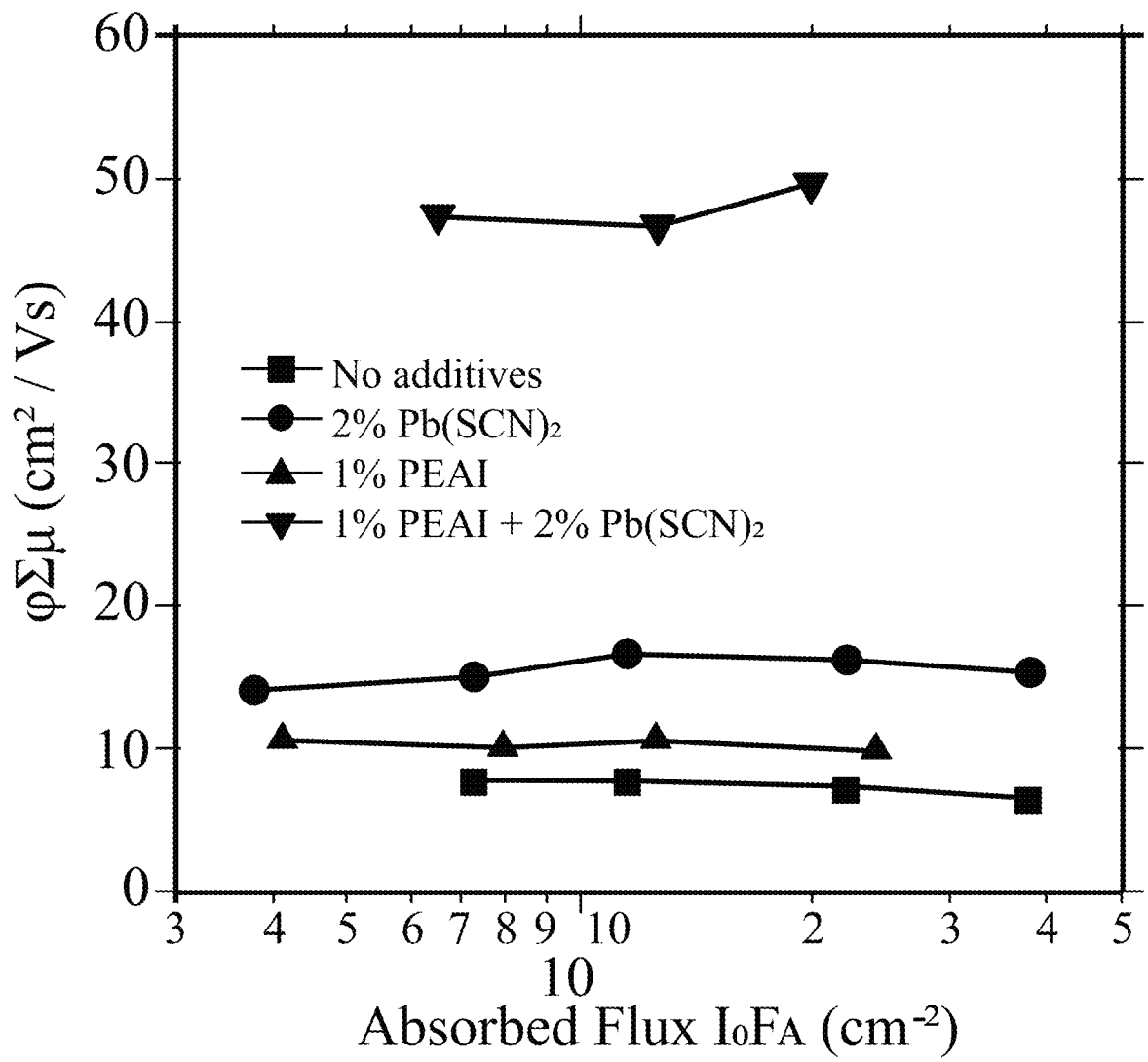
Figure 16:
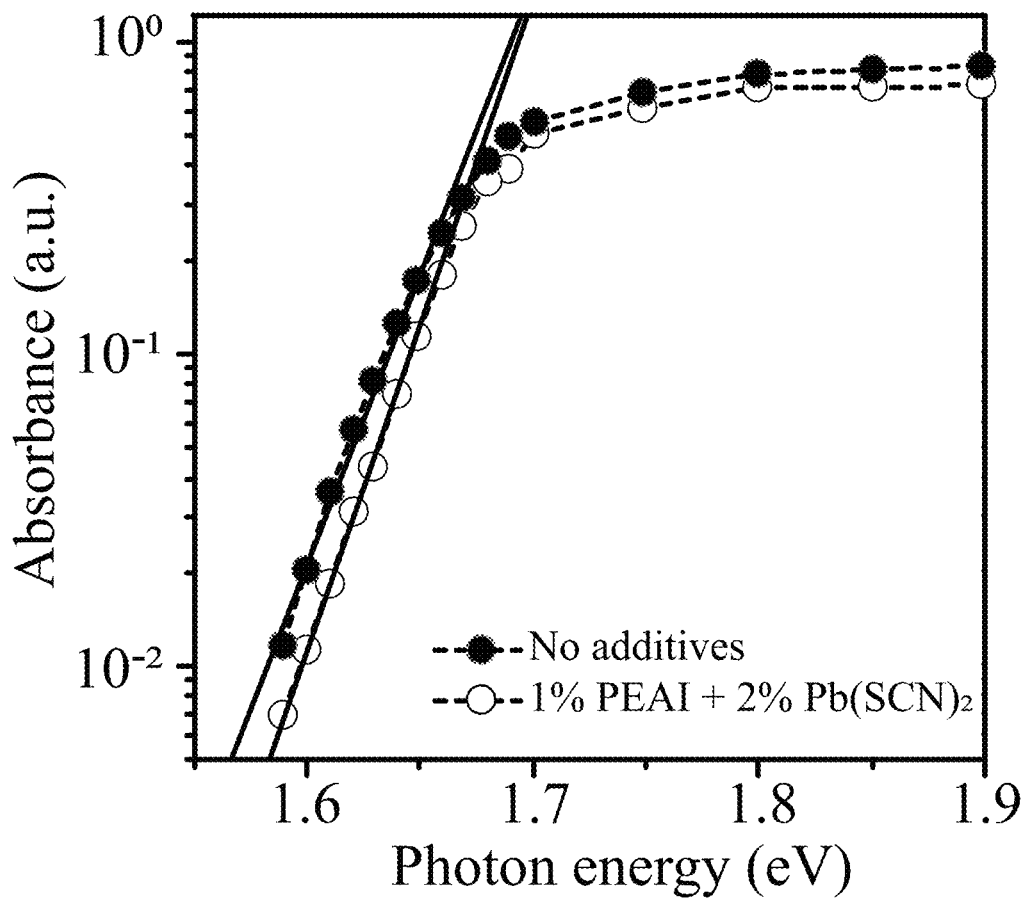
FIG. 16 illustrates a comparison of photothermal deflection spectroscopy (PDS) measurement of perovskite films without and with the use of PEAI and $Pb(SCN)_2$ additives, according to some embodiments of the present disclosure. The Urbach energies determined by the best fits are 21.5 meV±0.2 meV and 23.2 meV±0.6 meV for the samples with and without the use of PEAI and $Pb(SCN)_2$, respectively.

The effect of using PEAI and Pb(SCN)$_2$ additives on charge-carrier transport and lifetime were also evaluated by time-resolved microwave conductivity (TRMC) measurement. TRMC is a contactless technique that has been used to study charge-carrier dynamics in perovskite thin films. FIG. 15B compares the typical TRMC transients at excitation intensity near 1×10$^{10}$ cm$^{-2}$ absorbed photon flux. The microwave data are typically plotted as the yield-mobility product $\phi\Sigma\mu$. The carrier-generation yield is usually near unity for high-performance perovskite samples, so one can consider the yield-mobility product as a measure of the carrier mobility. FIG. 15A shows that the peak $\phi\Sigma\mu$ values are similar between the control sample (no additives) and the one with 1 mol % PEAI additive. The peak $\phi\Sigma\mu$ value is almost doubled from about 7-10 to 17 cm$^2$ V$^{-1}$s$^{-1}$ for the sample prepared using 2 mol % Pb(SCN)$_2$; this is consistent with the increased grain size and higher crystallinity (see FIG. 9A). Most striking is that the $\phi\Sigma\mu$ value increases almost 5-fold to 47 cm$^2$ V$^{-1}$s$^{-1}$ when both 1 mol % PEAI and 2 mol % Pb(SCN)$_2$ are used. As shown herein, using additives such as Pb(SCN)2 and PEAI can result in yield mobility products between greater than 30 cm$^2$ V$^{-1}$s$^{-1}$ and less than 100 cm$^2$ V$^{-1}$s$^{-1}$. It is again worth noting that this highest $\phi\Sigma\mu$ value is obtained even when the grain size is reduced in comparison to the sample prepared by using Pb(SCN)$_2$. Similar peak $\phi\Sigma\mu$ values for these samples are obtained over a wide range of excitation intensities (see FIG. 15B). In addition to the carrier mobility, the carrier lifetime is another figure-of-merit from the TRMC measurement. The average carrier lifetime $\tau_{avg}$ values are obtained based on bi-exponential fittings of the TRMC transients (see Table 1). It increased from 698 ns for the control sample without additives to 3.03 μs for the sample using 1 mol % PEAI additive, but decreased to only 166 ns for the sample using 2 mol % Pb(SCN)$_2$ additive. The $\tau_{avg}$ value increased remarkably to 2.91 μs for the sample when the combination of 1 mol % PEAI and 2 mol % Pb(SCN)$_2$ was used. The much-improved carrier mobility (47 cm$^2$ V$^{-1}$s$^{-1}$) and lifetime (2.91 μs) further confirm the significant synergistic cooperation at the molecular level between PEAI and Pb(SCN)$_2$. The improved photophysical property is consistent with the reduced Urbach energy ($E_u$=21.5 meV) and dark carrier density ($n_{d=9\times10^{15}}$ cm$^{-3}$) for the sample prepared using PEAI and Pb(SCN)$_2$ in comparison to the control sample ($E_u$=23.2 meV; $n_d$=3×10$^{16}$ cm$^{-3}$), as shown in FIGS. 16 and 17.

Figure 17:
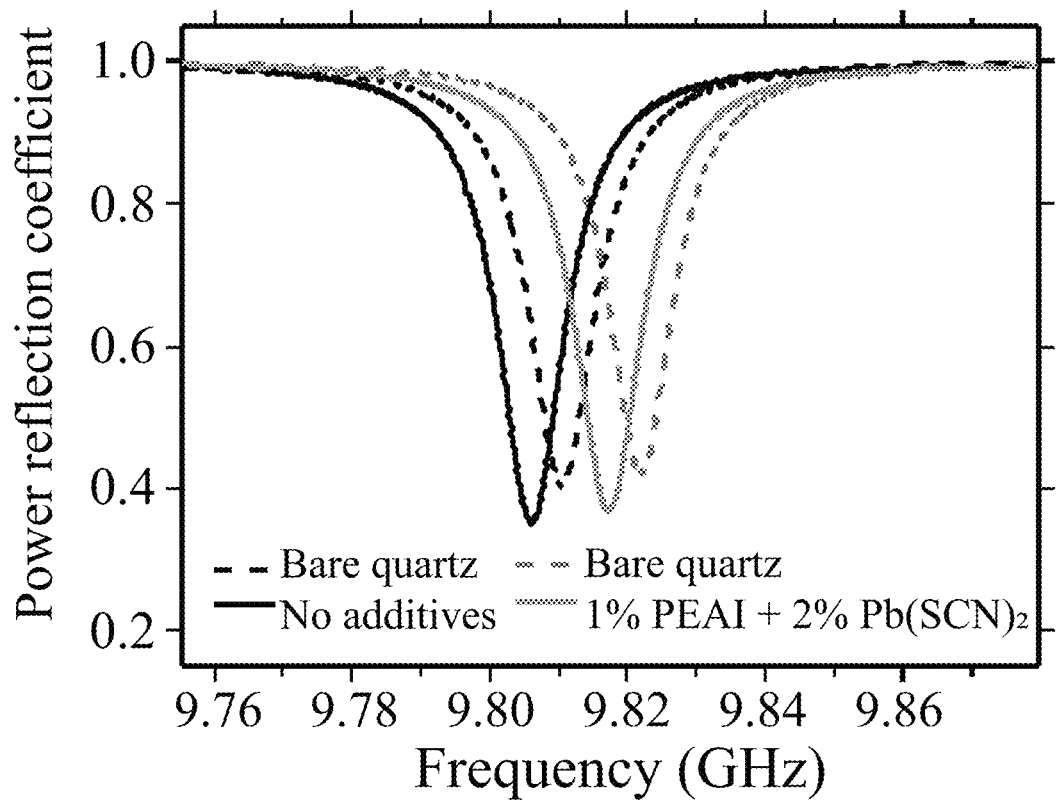
FIG. 17 illustrates power reflection coefficient versus frequency for control (no additives) and sample with PEAI and $Pb(SCN)_2$ additives by dark microwave conductivity measurement, according to some embodiments of the present disclosure.

Referring to FIG. 17, dark microwave conductivity (also referred to as steady-state microwave absorption) measurements were carried out to quantify the dark carrier density for perovskite thin-film samples. In brief, dark microwave conductivity is also a contact-free measurement (like time-resolved microwave conductivity, TRMC) that does not require a full device-stack architecture or electrodes of any kind. As such, one can evaluate certain intrinsic electrical properties—namely, the ~9-GHz conductivity of exclusively the perovskite absorber layer. In the dark conductivity experiment, the sample (first the unique substrate, then again with the film deposited on that substrate) was positioned within a well-defined microwave cavity to maximize interaction with the field and provide a high degree of sensitivity to changes in the sample composition and properties. For the dark experiments, the change in microwave power reflection coefficient was measured in the cavity relative to a control (the bare substrate). From the power-reflection curves, fitting procedures in IgorPro 6.7 were used to match the complex conductivity of simulated properties in a look-up table (from a series of solved Maxwell's equations using COMSOL) to the experimental data. From the sample thickness, carrier mobility, and dark conductivity, one can readily calculate the dark carrier density of each sample. Following these procedures, the dark carrier densities were 9×10$^{15}$ cm$^{-3}$ and 3×10$^{16}$ cm$^{-3}$ for the samples prepared without and with PEAI and Pb(SCN)$_2$ additives and without additives, respectively.

TABLE 1

Fitting results of TRMC transients for samples shown in FIG. 15A.

| Additives | $a_1$ ($f_1$)* | $\tau_1$ (μs) | $a_2$ ($f_2$) | $\tau_2$ (μs) | $\tau_{avg}$ (μs) |
|---|---|---|---|---|---|
| None | 2.5 (0.058) | 0.112 | 6.2 (0.942) | 0.734 | 0.698 |
| 2 mol % Pb(SCN)$_2$ | 17.2 (0.406) | 0.047 | 4.8 (0.594) | 0.247 | 0.166 |
| 1 mol % PEAI | 10.8 (1.0) | 3.03 | — | — | 3.03 |

TABLE 1-continued

Fitting results of TRMC transients for samples shown in FIG. 15A.

| Additives | $a_1$ $(f_1)$* | $\tau_1$ (µs) | $a_2$ $(f_2)$ | $\tau_2$ (µs) | $\tau_{avg}$ (µs) |
|---|---|---|---|---|---|
| 1 mol % PEAI + 2 mol % Pb(SCN)$_2$ | 3.7 (0.002) | 0.063 | 45.5 (0.998) | 2.91 | 2.91 |

*$a_i$ is the prefactor of exponential decay function in $\phi\Sigma\mu(t) = \Sigma_i a_i \exp(-t/\tau_i)$, and $f_i$ is the fractional contribution of each time constant ($\tau_i$)

Figure 18A:
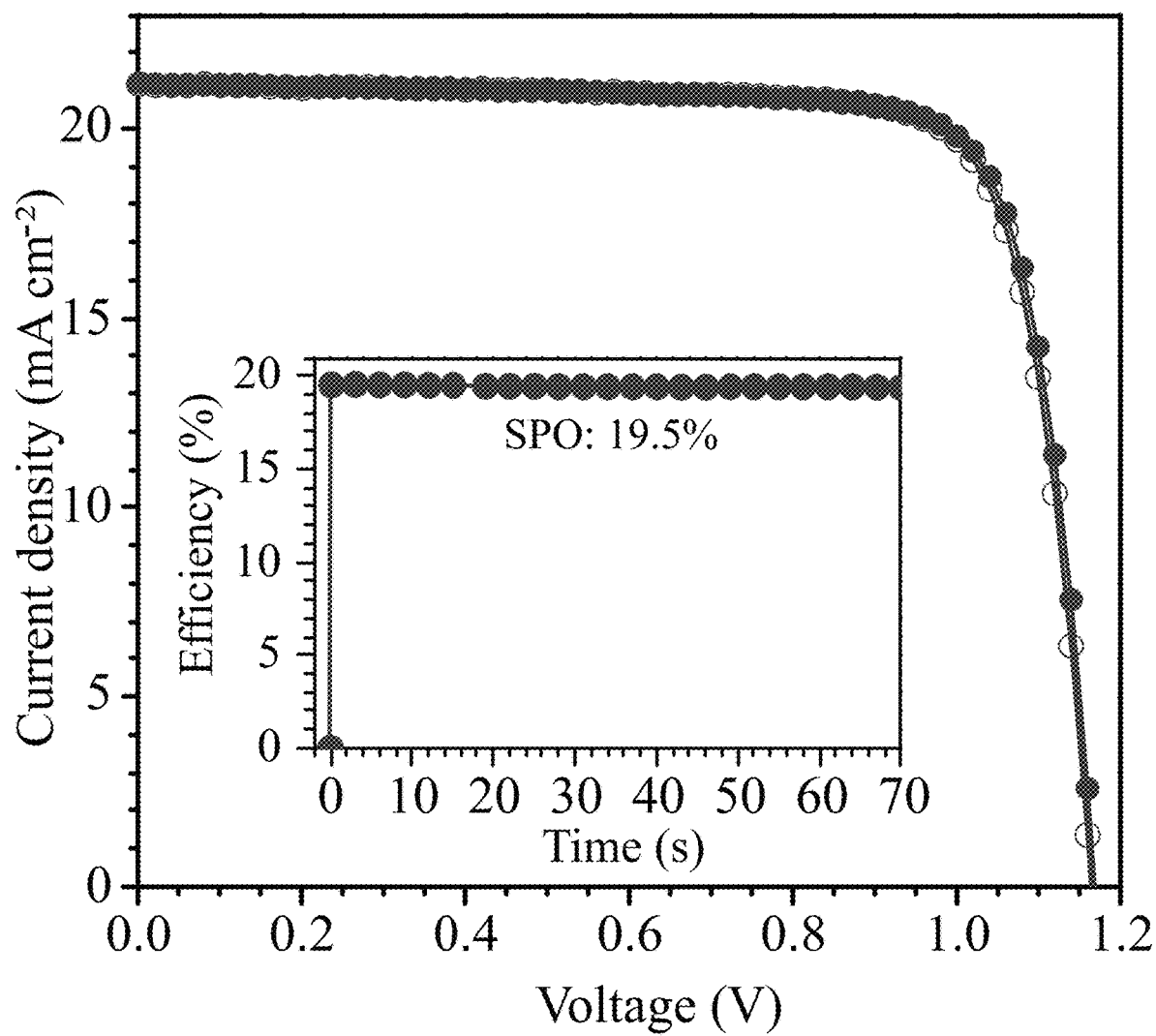
FIGS. 18A-18D illustrate results from the best-performing perovskite solar cell and 4-T perovskite-CIGS tandem device, according to some embodiments of the present disclosure.
Figure 18B:
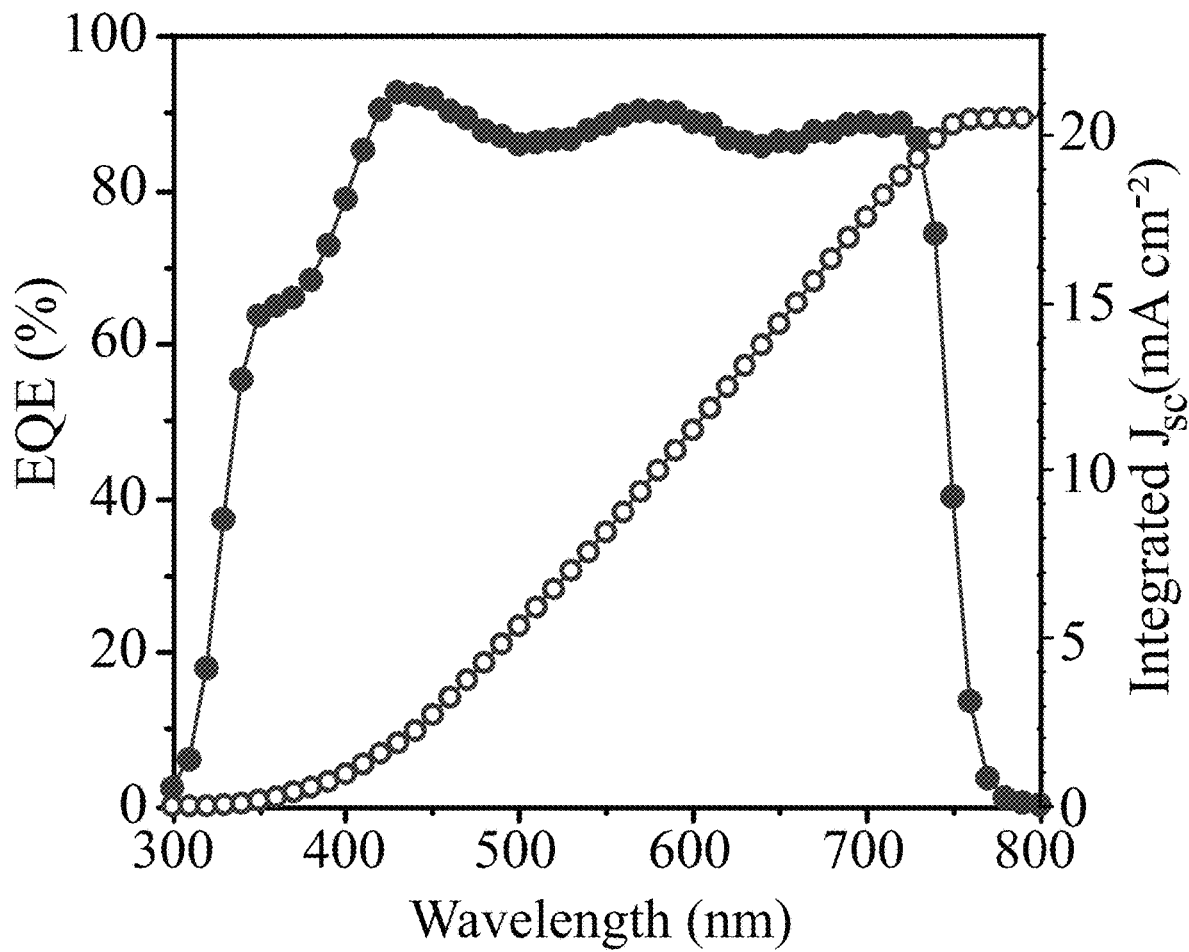

FIG. 18A shows the J-V curves for the champion perovskite solar cell with an opaque Ag top contact (glass/indium tin oxide (ITO)/poly(triaryl amine) (PTAA)/perovskite/C$_{60}$/bathocuproine (BCP)/Ag) based on the 1.68-eV perovskite composition (FA$_{0.65}$MA$_{0.20}$Cs$_{0.15}$)Pb(I$_{0.8}$Br$_{0.2}$)$_3$ prepared by using a combination of 1 mol % PEAI additive and 2 mol % Pb(SCN)$_2$ additive in the perovskite formulation. The J-V curves exhibited almost no hysteresis with reverse-scan PCE of 19.8% and forward-scan PCE of 19.7%. Both scan directions gave about the same J$_{sc}$ (21.2 mA cm$^-$) and FF (0.80), with a slight difference in V$_{oc}$ (1.17 V for reverse scan and 1.16 V for forward scan). The stabilized power output PCE was about 19.5%, which is essentially the same as the J-V scan PCE. FIG. 18B shows the external quantum efficiency (EQE) spectrum of the same device shown in FIG. 18A. Integrating the EQE spectrum over the solar spectrum yields a current density of 20.6 mA cm$^-$, which is very similar to the value (21.2 mA cm$^{-2}$) obtained from the J-V scan.

Figure 18C:
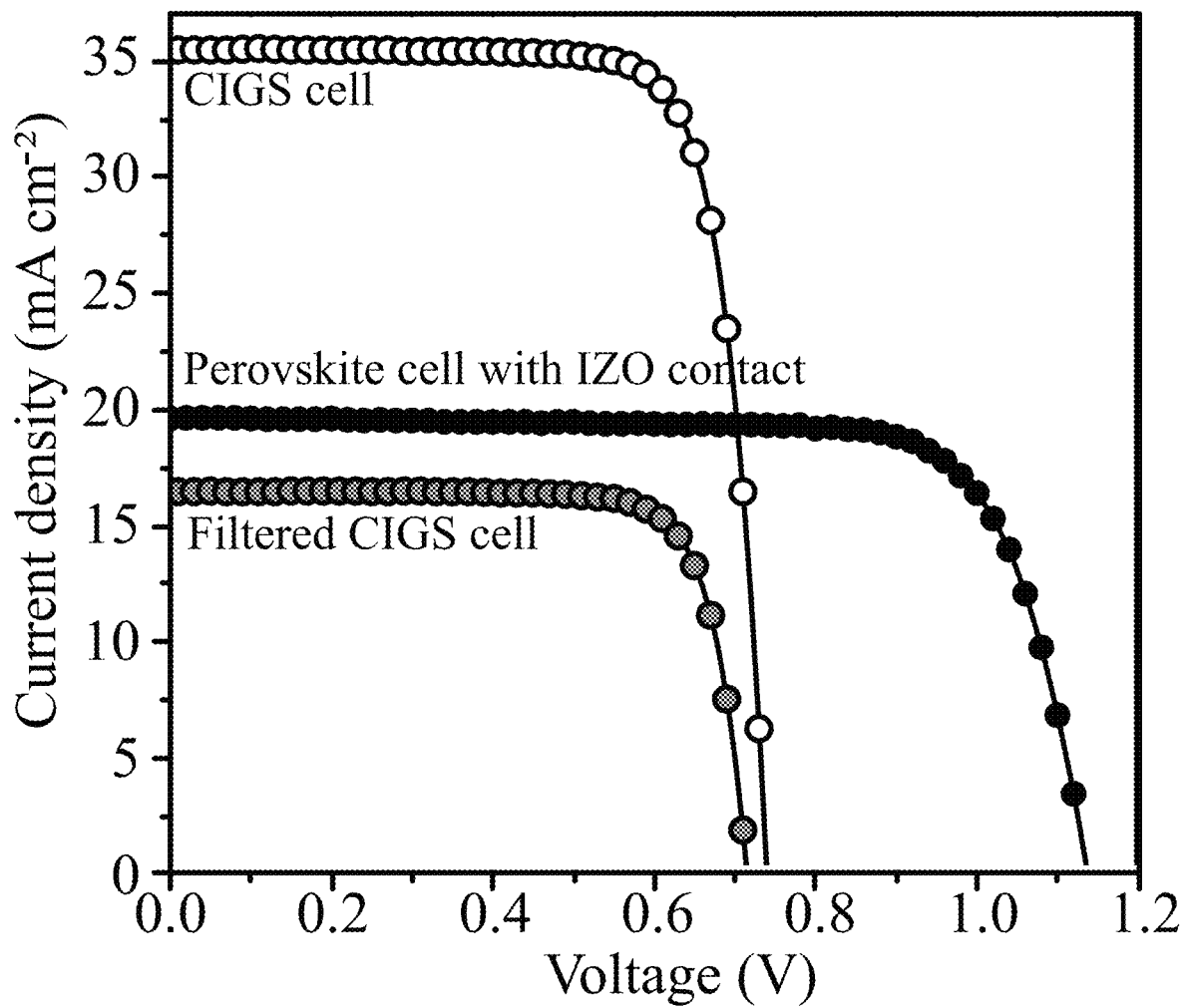
Figure 18D:
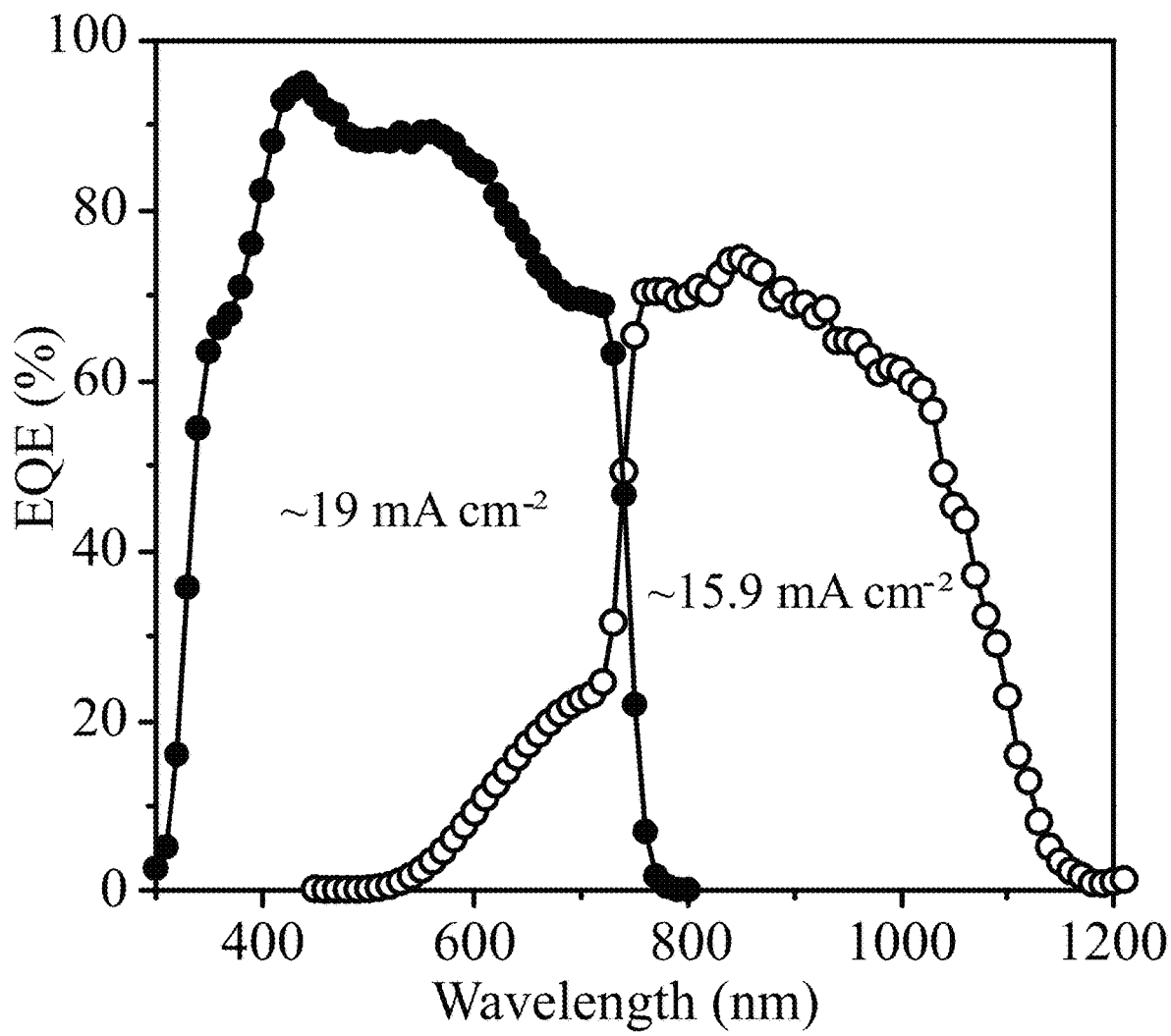

Semi-transparent PSCs were developed in order to construct perovskite/CIGS tandem solar cells in a 4-terminal configuration. The device stack constructed using the semi-transparent PSC was glass/ITO/PTAA/perovskite/C$_{60}$/SnO$_x$/Zn:SnO$_x$(ZTO)/IZO. A thin 6-nm SnO$_x$ layer followed by an ~1-nm ZTO layer was deposited by atomic layer deposition, whereas ~250 nm of IZO was deposited by sputtering. The J-V curve for the semi-transparent PSC is shown in FIG. 18C and the corresponding photovoltaic parameters are summarized in Table 2. In comparison to opaque devices, the PCE of semi-transparent PSC was about 2%-3% lower, resulting from reductions in all three parameters. The decrease of J$_{sc}$ is primarily attributed to the shorter optical path in the absence of strong reflection from the Ag contact; this deficiency is evident from the EQE spectrum in the long wavelength range (see FIG. 18D). The reduced V$_{oc}$ and FF is likely caused by the non-optimum contact interface in comparison to the opaque device. A state-of-the-art CIGS (about 1.12-eV bandgap) solar cell was used as the bottom cell in a 4-T tandem configuration with the semi-transparent PSC as the top cell. The CIGS absorber layer was deposited by 3-stage co-evaporation at 615° C. followed by a post-deposition treatment of KF at 330° C. for 10 min. The standalone CIGS solar cell shows a PCE of 20.68%, with a J$_{sc}$ of 35.5 mA cm$^{-2}$, V$_{oc}$ of 0.740 V, and FF of 0.787. The filtered CIGS cell yields a PCE of 9.38% with a filtered J$_{sc}$ of 16.6 mA cm$^{-2}$, which is consistent with the integrated current density based on the filtered EQE spectrum (see FIG. 18D). The 4-T tandem device produced a PCE of 26.52%, which is about 5.84% (absolute efficiency) higher than the standalone CIGS solar cell, and it is also significantly higher than the highest-reported single-junction CIGS solar cell.

TABLE 2

PV parameters of champion opaque and semi-transparent PSCs and perovskite-CIGS tandem solar cells.

| Device | J$_{sc}$ (mA cm$^{-2}$) | V$_{oc}$ (V) | FF | PCE (%) |
|---|---|---|---|---|
| 1.68-eV perovskite (opaque Ag) | 21.2 | 1.17 | 0.80 | 19.8 |
| 1.68-eV perovskite (semi-transparent IZO) | 19.6 | 1.137 | 0.768 | 17.14 |
| CIGS cell | 35.5 | 0.740 | 0.787 | 20.68 |
| Filtered CIGS cell | 16.6 | 0.714 | 0.792 | 9.38 |
| 4-terminal tandem | — | — | — | 26.52 |

Finally, Table 3 illustrates characteristics for the perovskite solar cells illustrated FIG. 18A.

TABLE 3

Device photovoltaic parameters of perovskite solar cells shown in FIG. 18A.

| Additives | J$_{sc}$ (mA/cm$^2$) | V$_{oc}$ (V) | FF | PCE (%) |
|---|---|---|---|---|
| None | 19.9 | 1.10 | 0.748 | 16.4 |
| 2 mol % Pb(SCN)$_2$ | 20.0 | 1.09 | 0.804 | 17.5 |
| 1 mol % PEAI | 19.0 | 1.15 | 0.756 | 16.5 |
| 1 mol % PEAI + 2 mol % Pb(SCN)$_2$ | 20.6 | 1.15 | 0.798 | 18.9 |

In summary, an effective solution chemistry is demonstrated herein to prepare highly efficient wide-bandgap (1.68-eV) PSCs by incorporating both PEA$^+$ and SCN$^-$ to form a 3D perovskite structure containing 2D (or quasi-2D) structures located primarily at/near grain boundaries. The coupling of PEA$^+$ (from PEAI) and SCN$^-$ (from Pb(SCN)$_2$) overcomes the separate challenges associated with each additive, leading to enhanced perovskite crystallinity and reduced PbI$_2$ formation along with reduced defect density and energy disorder. As a result, the charge-carrier mobility and lifetime increase from <10 cm$^2$ V$^{-1}$s$^{-1}$ and <1 µs for the control sample to near 50 cm$^2$ V$^{-1}$s$^{-1}$ and 3 µs by using both additives. The average PSC performance increases from 16.3% to 18.7%, with optimized cell efficiency of ~20%. When semi-transparent PSC with an IZO top contact were coupled with a 1.12-eV CIGS bottom cell, ~26.5% perovskite/CIGS 4-terminal thin-film tandem solar cells resulted. These results demonstrate the feasibility of PSC enabling >30% all-thin-film tandem devices with a CIGS bottom cell.

In addition, low-bandgap perovskite films were also prepared. In one embodiment of the present disclosure, an (FASnI$_3$)$_{0.6}$(MAPbI$_3$)$_{0.4}$ precursor was prepared by mixing formamidinium iodide (FAI) (Dyesol, 0.6 mmol), SnI$_2$ (Alfa, 0.6 mmol), SnF$_2$ (Sigma-Aldrich, 0.06 mmol), CH$_3$NH$_3$I (MAI) (Dyesol, 0.4 mmol), PbI$_2$ (Alfa, 0.4 mmol) in 800 µL N,N-dimethylmethanamide (DMF) (anhydrous, Sigma-Aldrich) and 200 µL dimethyl sulfoxide (DMSO) (anhydrous, Sigma-Aldrich). In some examples, the perovskite formulation was modified by the addition of guanidinium thiocyanate (GuaSCN) as an additive. GuaSCN powder (Sigma-Aldrich) was directly added to the low-bandgap perovskite powders in different molar ratios. Different thicknesses of the resultant perovskite films were realized by changing the precursor concentration. For perovskite precursors with high concentrations, thermal annealing at 65° C. for about 30 minutes was applied to assist dissolving the precursors. The perovskite precursors with different molar concentrations were spin-coated onto the ITO/PEDOT:PSS substrate at 5000 rpm for 30 seconds. During the spin-coating, 400 μL of toluene was dropped onto the spinning substrates. The resulting perovskite films were then annealed at 100° C. for 10 min to form $(FASnI_3)_{0.6}(MAPbI_3)_{0.4}$ or GuaSCN-modified $(FASnI_3)_{0.6}(MAPbI_3)_{0.4}$ perovskite thin films.

Thus, in some embodiments of the present disclosure, a perovskite containing a 3D structure and a 2D structure may be produced by using a single additive, GauSCN, according to the following reaction:

$$2GuaSCN + PbI_2 \rightarrow (Gua)_2Pb(I_2SCN_2) \quad (7a)$$

Reaction (7a) may be written generally as,

$$2A'Y + BX_2 \rightarrow A'_2BX_2X'_2 \quad (7b)$$

which is equivalent to Reaction (3a) above.

Figure 20A:
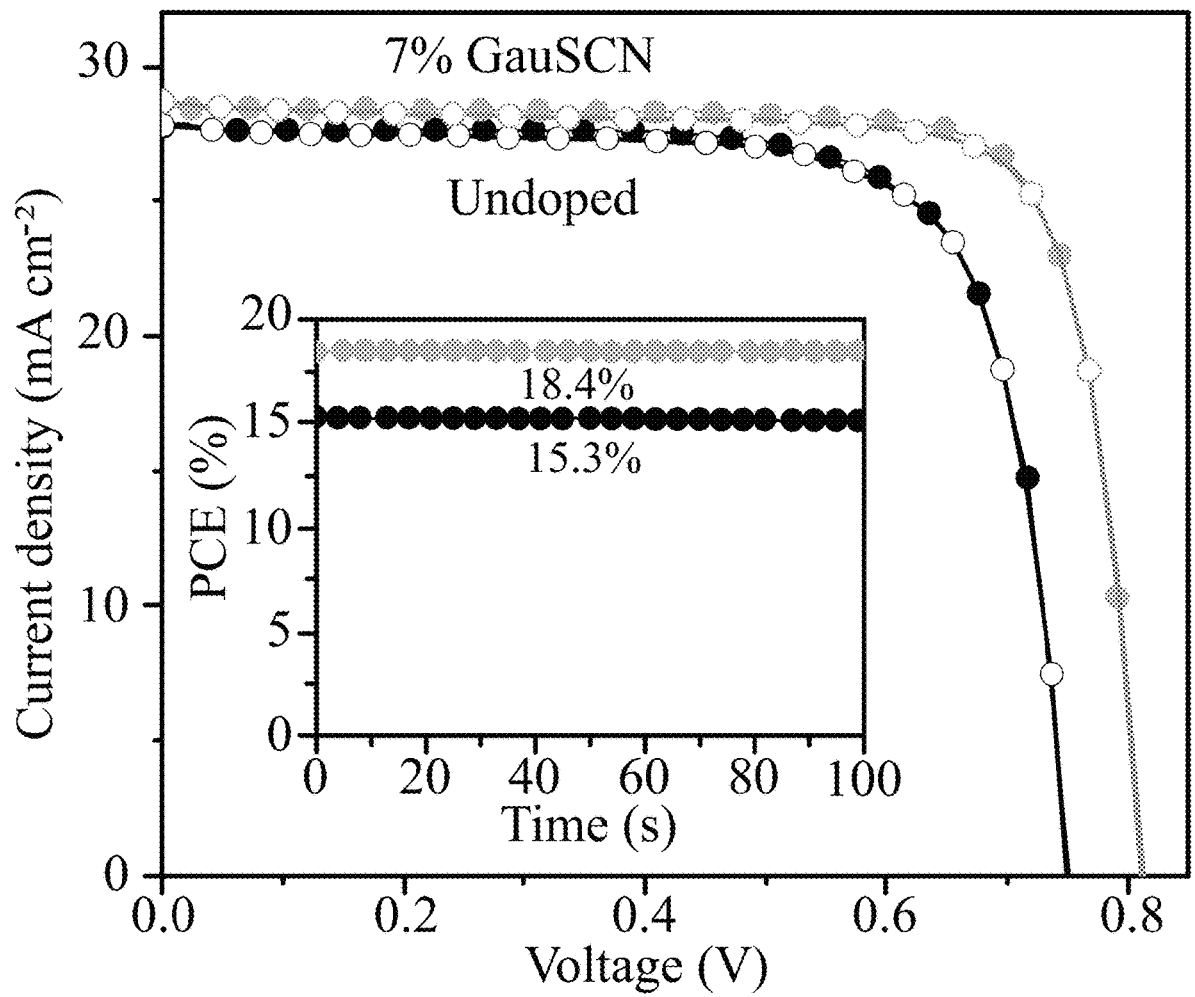
FIGS. 20A, 20B, and 20C illustrate device characteristics of devices constructed with perovskite films synthesized with and without guanidinium thiocyanate as an additive, according to some embodiments of the present disclosure.
Figure 20B:
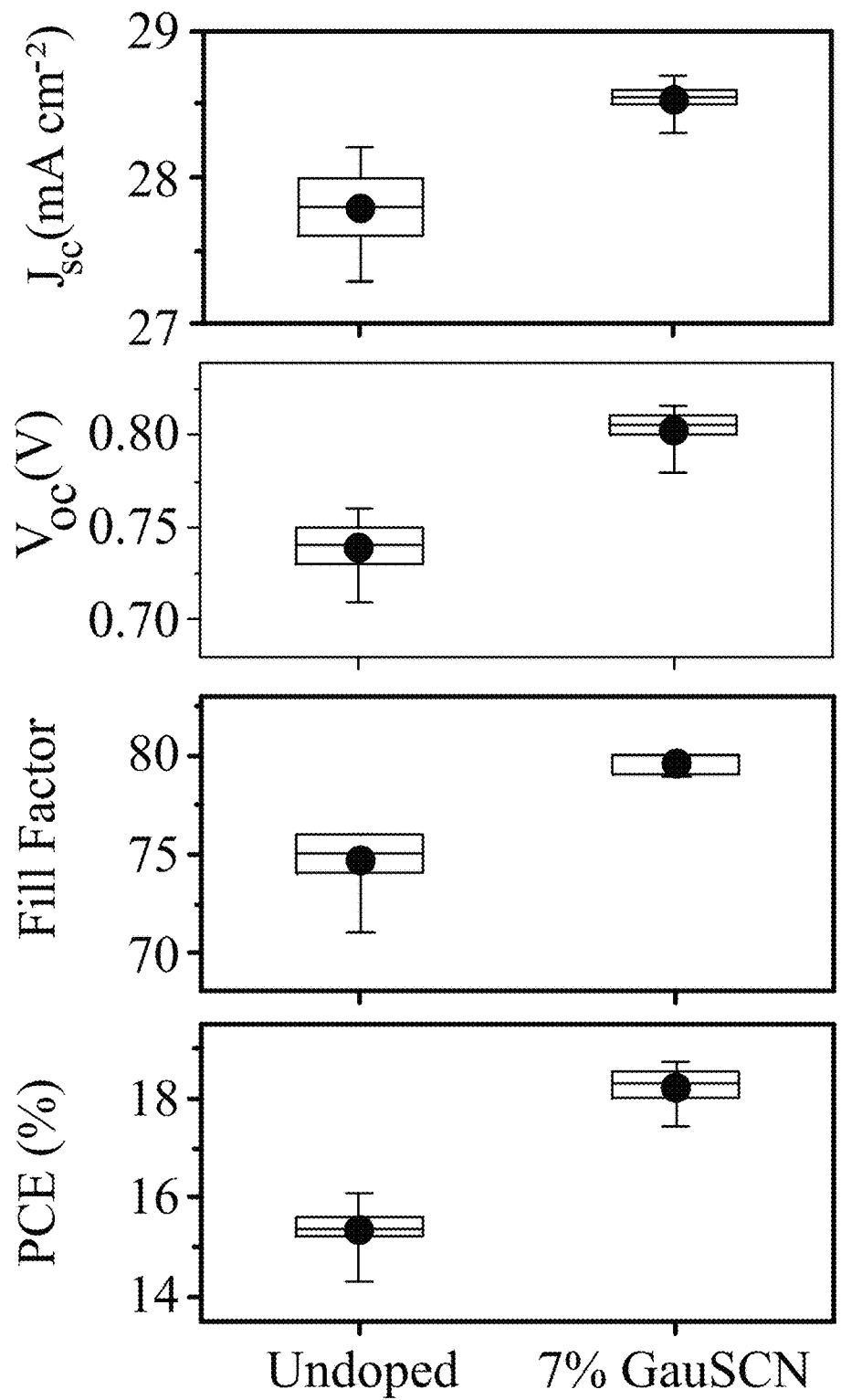
Figure 20C:
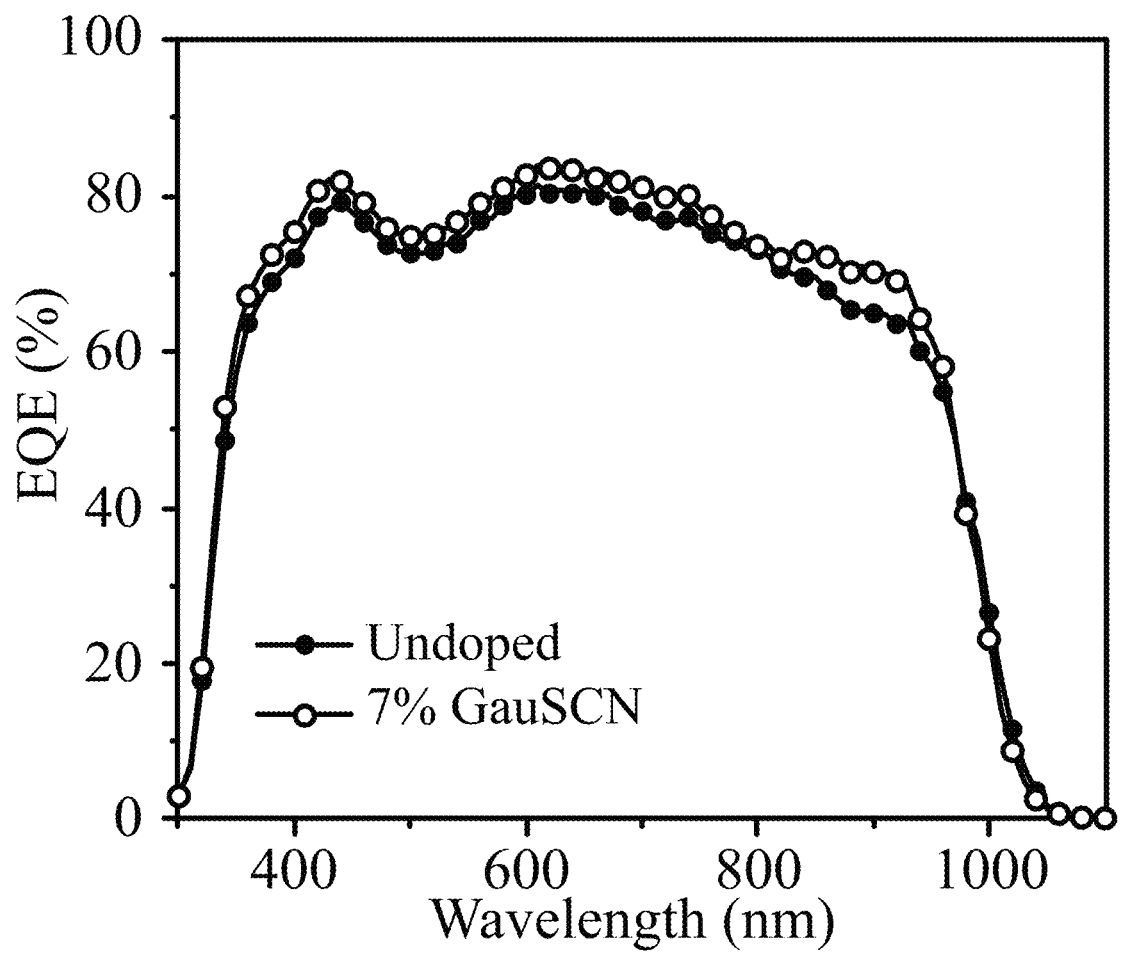

FIGS. 20A-20C illustrate a comparison of device characteristics for these perovskite compositions, made with and without GuaSCN additives. FIG. 20A illustrates photocurrent density-voltage (J-V) curves (with inset showing the stable power outputs). FIG. 20B illustrates a statistical comparison of J-V parameters of low-bandgap perovskite solar cells prepared by using 7% GuaSCN additive or without using the GuaSCN additive (referred to as undoped). FIG. 20C illustrates external quantum efficiencies of the two devices shown in FIG. 20A with the integrated current density indicated.

Figure 21A:
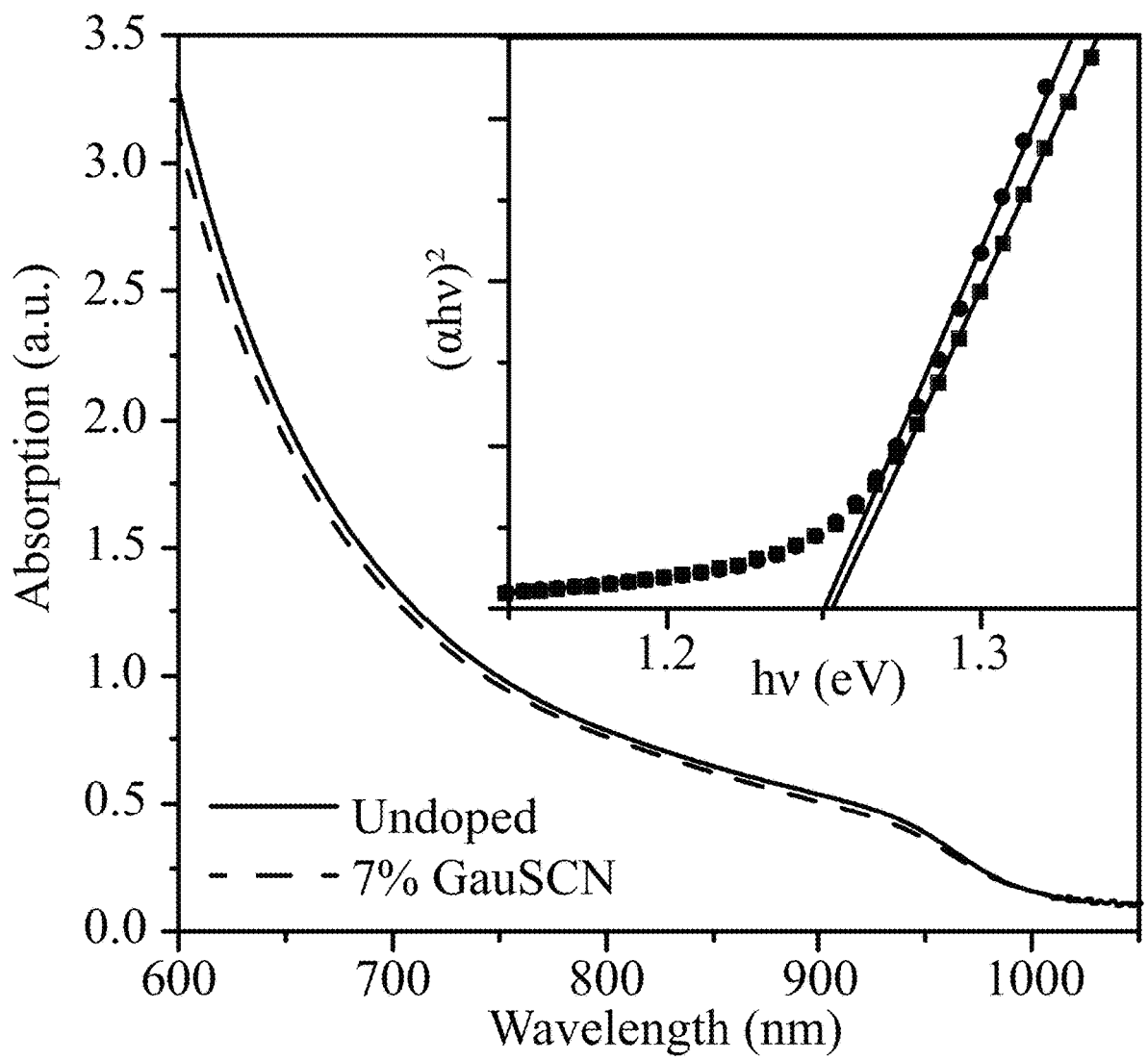
FIGS. 21A-21F illustrate optical and structural characteristics of devices constructed with perovskite films synthesized with and without guanidinium thiocyanate as an additive, according to some embodiments of the present disclosure.
Figure 21B:
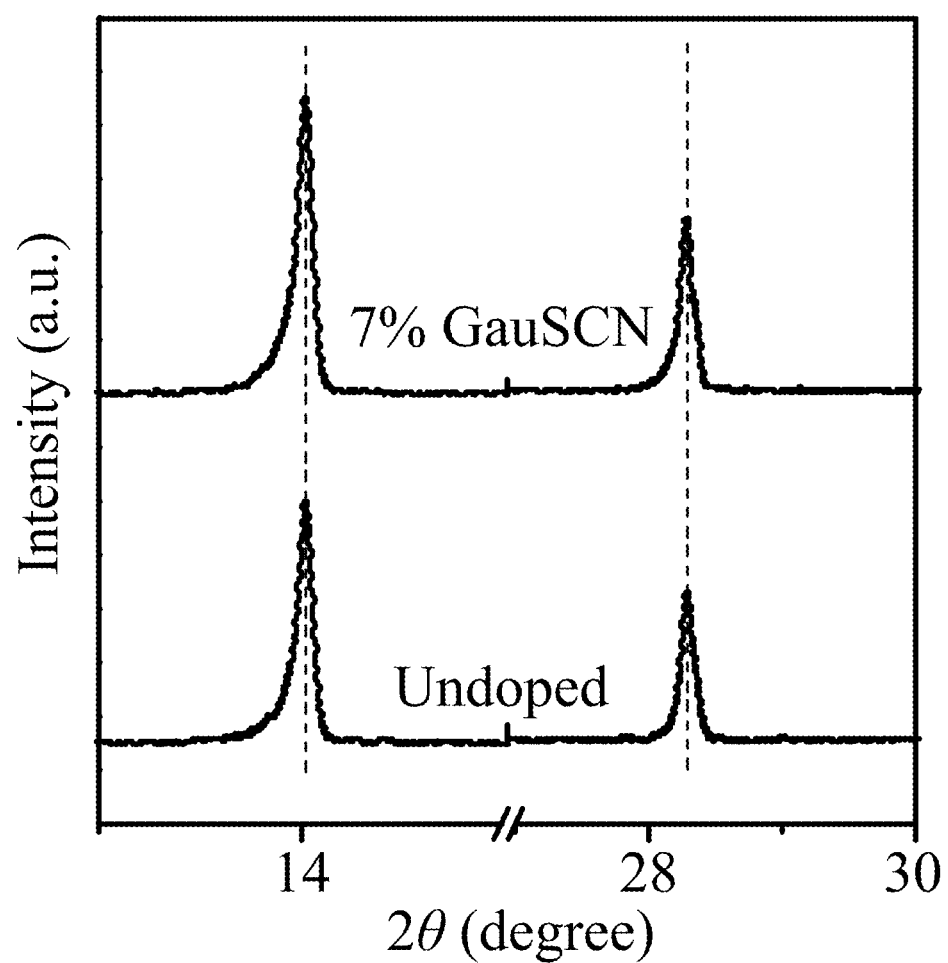
Figure 21C:
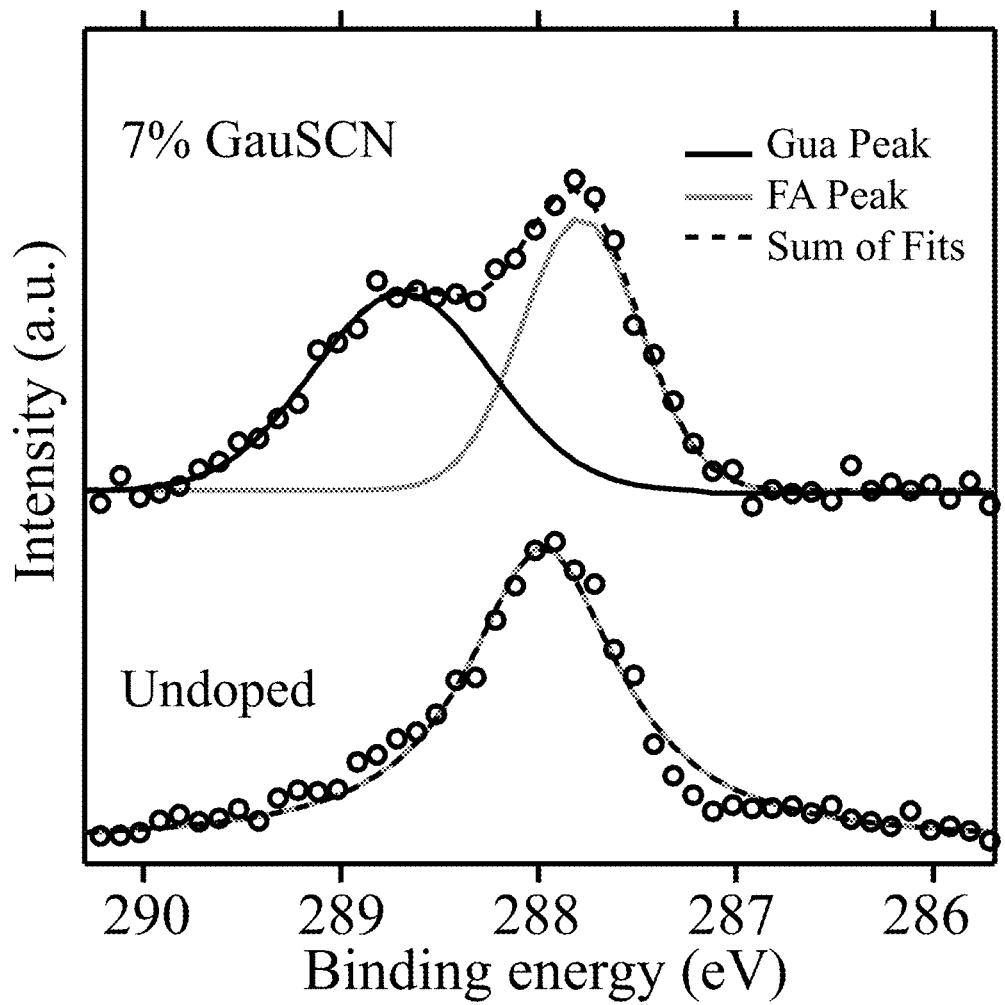
Figure 21D:
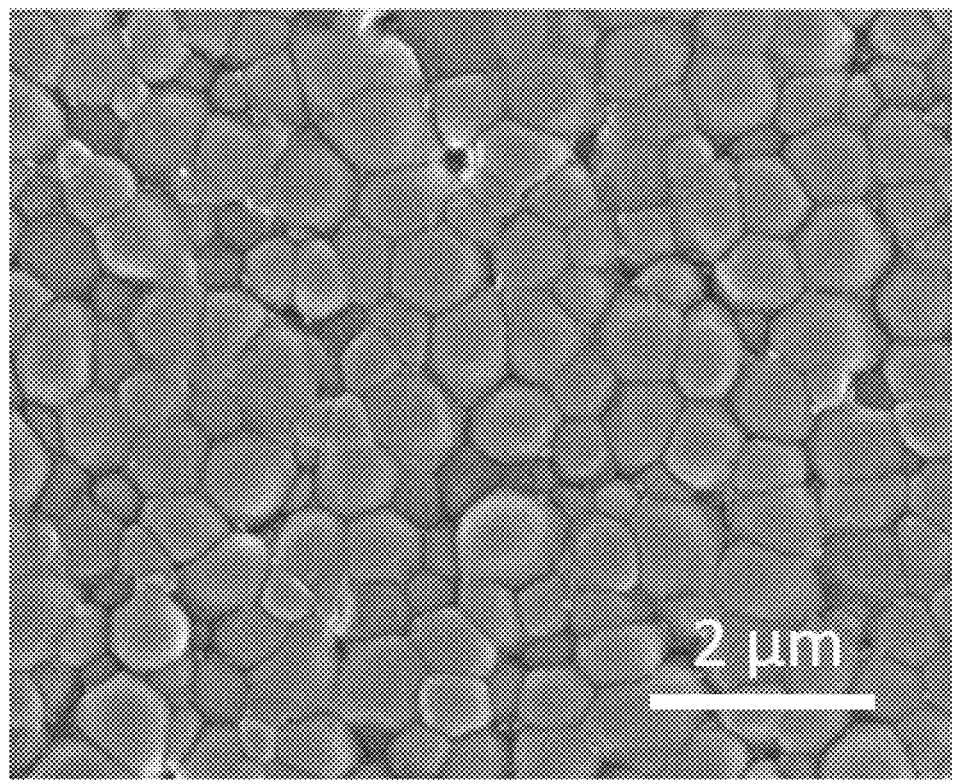
Figure 21E:
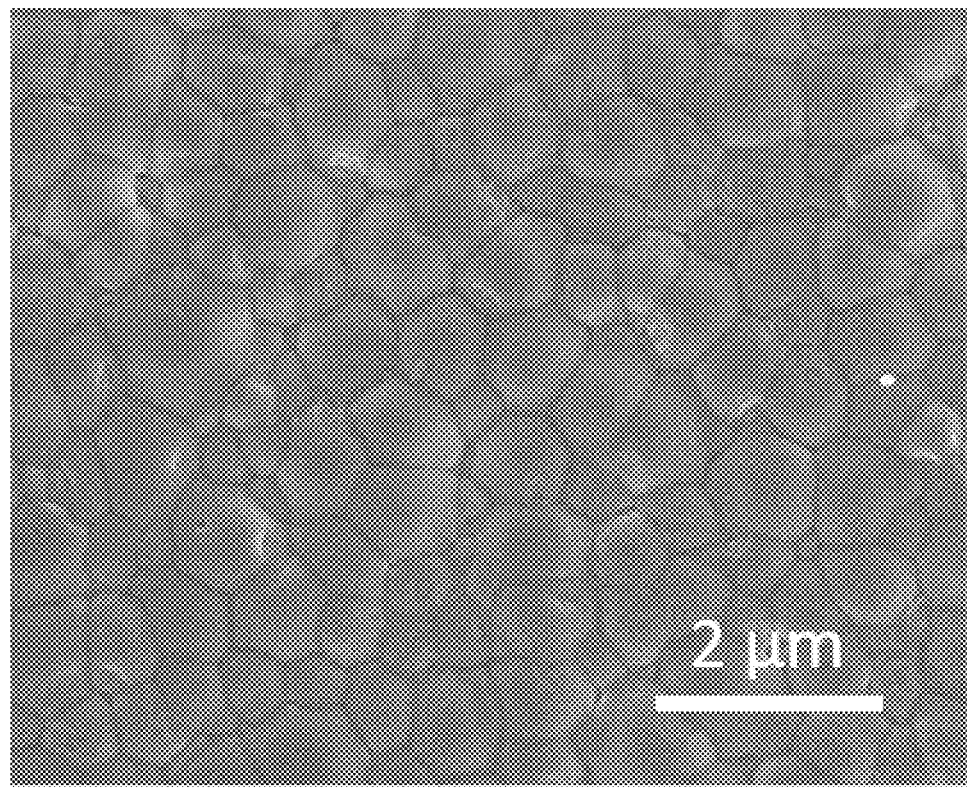
Figure 21F:
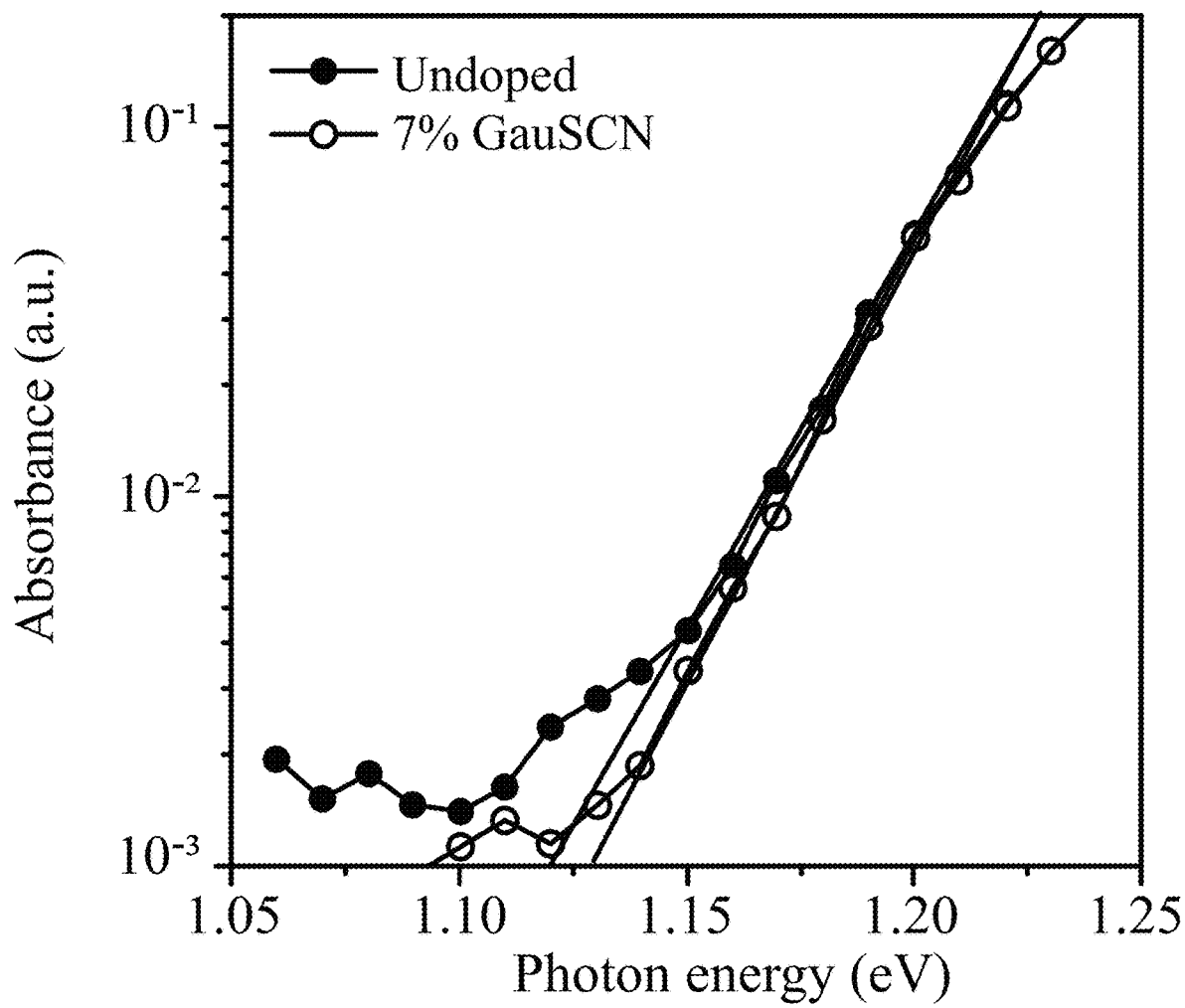
Figure 22A:
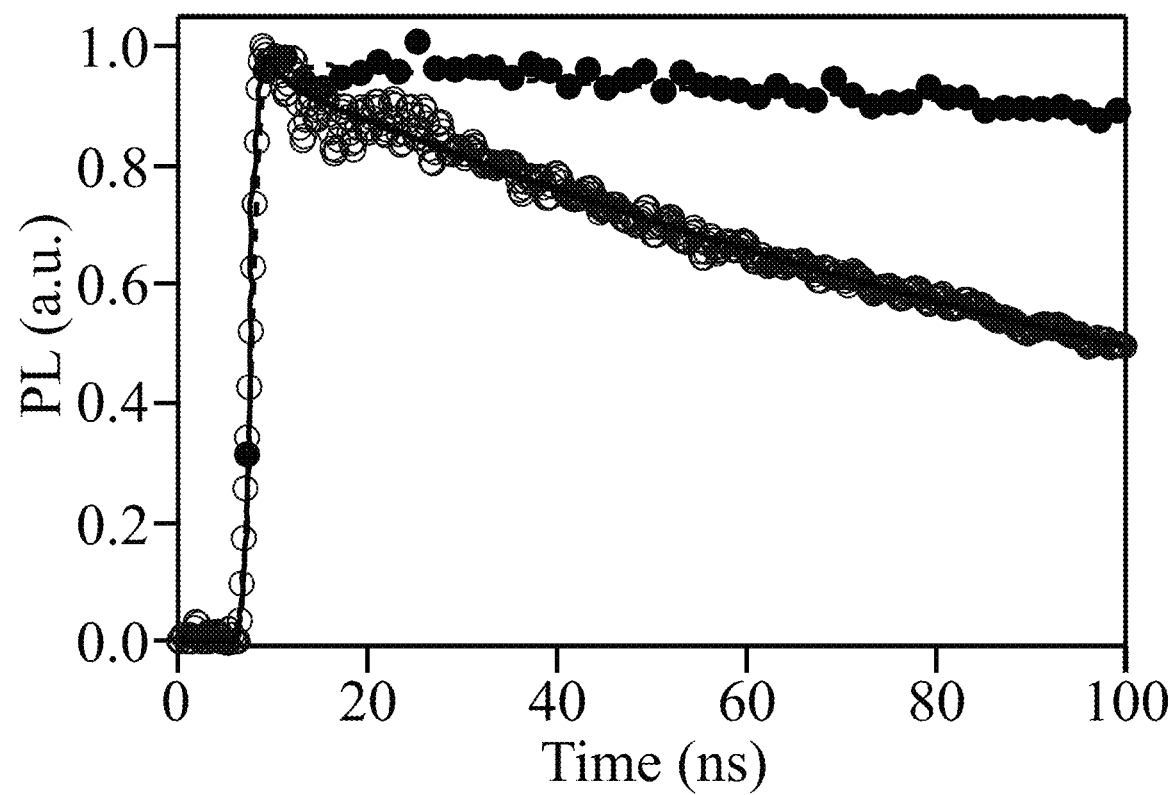
FIGS. 22A-22D illustrate charger carrier dynamics for devices constructed with perovskite films synthesized with and without guanidinium thiocyanate as an additive, according to some embodiments of the present disclosure.
Figure 22B:
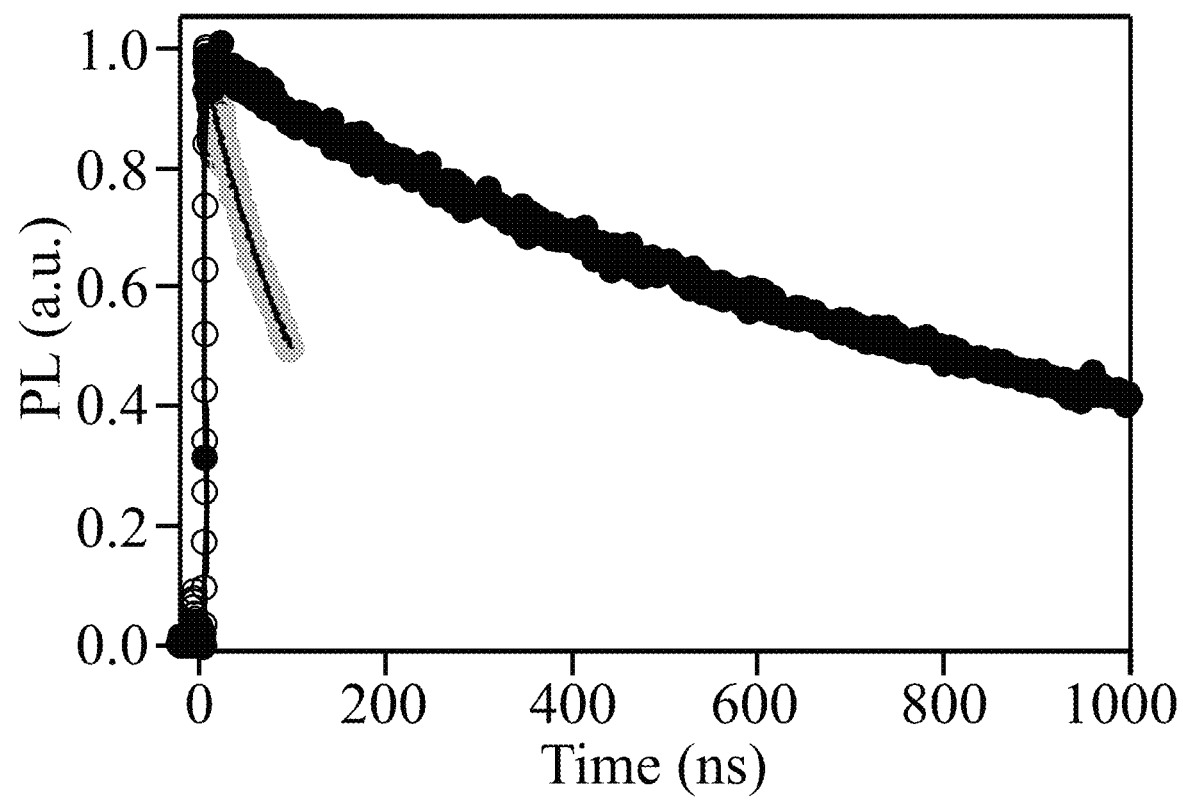
Figure 22C:
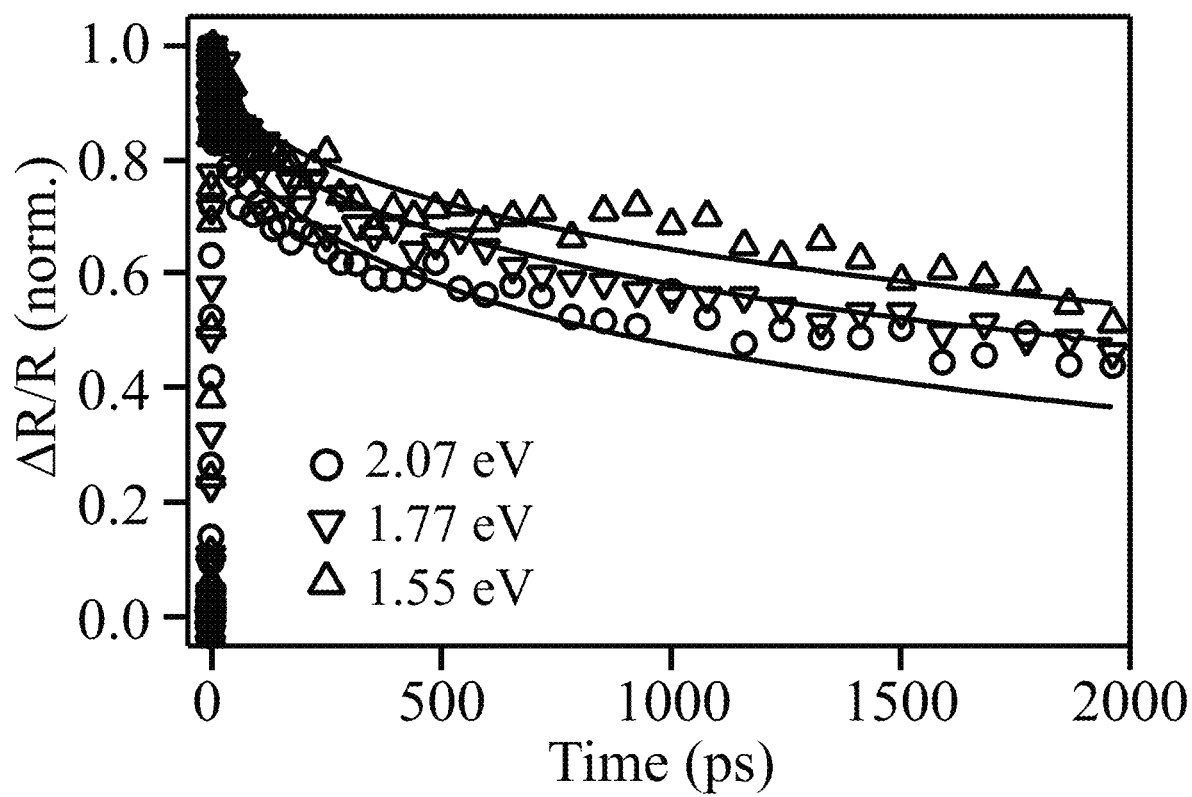
Figure 22D:
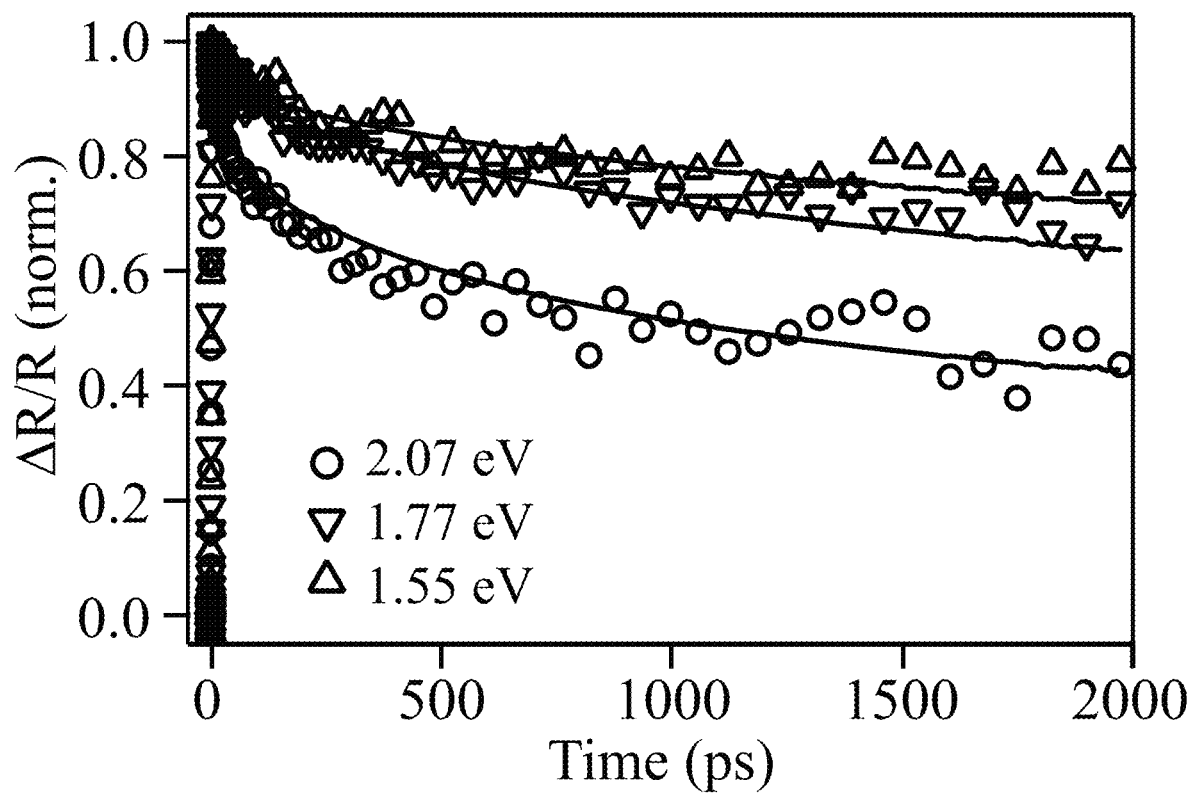

FIGS. 21A-F show a comparison of optical and structural characteristics for these perovskite compositions, made with and without GuaSCN additives. FIG. 21A illustrates ultraviolet-visible (UV-vis) absorption spectra (with inset showing the Tauc analyses). FIG. 21B illustrates X-ray diffraction (XRD) patterns, and FIG. 21C shows X-ray photoelectron spectroscopy (XPS) measurement of low-bandgap perovskite thin films prepared by using 7% GuaSCN additive or without using the GuaSCN additive (referred to as undoped). XPS data clearly shows the existence of guanidinium (Gua) in the perovskite film prepared by using 7% GuaSCN. In contrast, the undoped sample does not show the existence of Gua. Scanning electron microscope (SEM) images of perovskite films prepared without and with 7% GuaSCN additive (see FIGS. 21D and 21E). The perovskite film with 7% GuaSCN shows slight increase of grain size and the film is also more densely and smoothly packed in comparison to the sample without GuaSCN additive. FIG. 21F compares the photothermal deflection spectroscopy (PDS) measurements. The Urbach energies determined by the best fits are 19.4 meV±0.4 meV and 22.9 meV±0.7 meV for the samples with and without the use of 7% GuaSCN, respectively.

FIGS. 22A-22D illustrate charge carrier dynamics for these perovskite compositions, made with and without GuaSCN additives. Time-resolved photoluminescence (TRPL) measurement of the carrier lifetime of low-bandgap perovskite thin films prepared (see of FIG. 22A) without and (see FIG. 22B with the use of 7% GuaSCN additive. The average carrier lifetime (τ) determined from bi-exponential fittings (blue solid lines) are 139 ns and 1232 ns for the samples without and with the use of 7% GuaSCN, respectively. Comparison of transient reflectance (TR) spectroscopy measurement of carrier diffusion and surface recombination of low-bandgap perovskite thin films prepared (see FIG. 22C) without and (see FIG. 22D) with the use of 7% GuaSCN additive. The blue solid lines are nonlinear least-squares global best-fit curves for the two samples. The carrier diffusion coefficient (D) and surface recombination velocity (SRV; denoted as 5) determined from the global fittings are D=0.02 cm²/s and S=1.3×10³ cm/s for the undoped sample, and they are D=0.05 cm²/s and S=1.0×10² cm/s for the sample using 7% GuaSCN additive. The carrier diffusion length can be determined by the expression $L_D = \sqrt{D \times \tau}$, yielding 0.53 μm and 2.5 μm for the samples without and with the use of 7% GuaSCN, respectively.

Figure 23A:
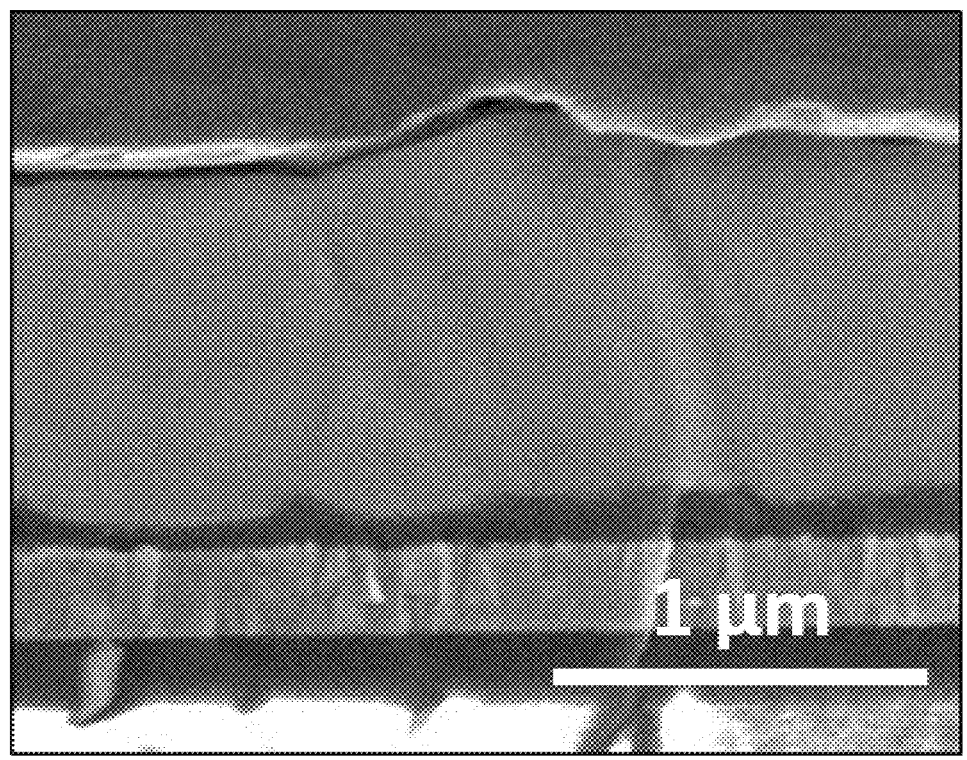
FIGS. 23A-23F illustrate characteristics for best-performing low-bandgap perovskite single junction and perovskite-perovskite tandem solar cells, according to some embodiments of the present disclosure.
Figure 23B:
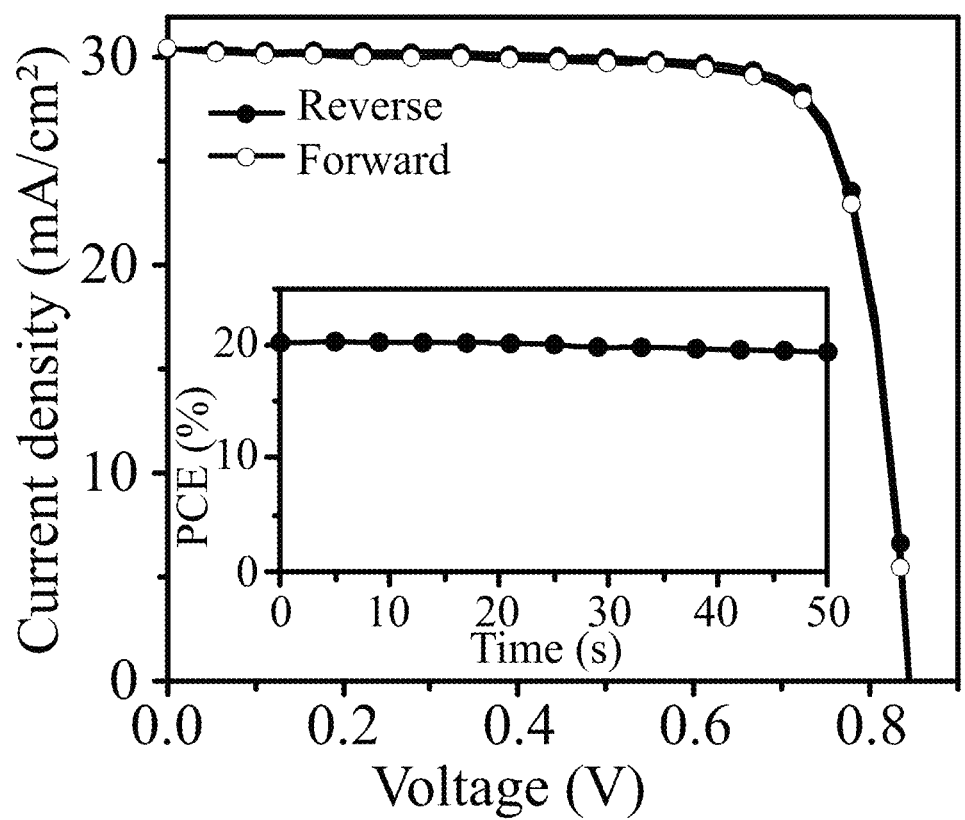
Figure 23C:
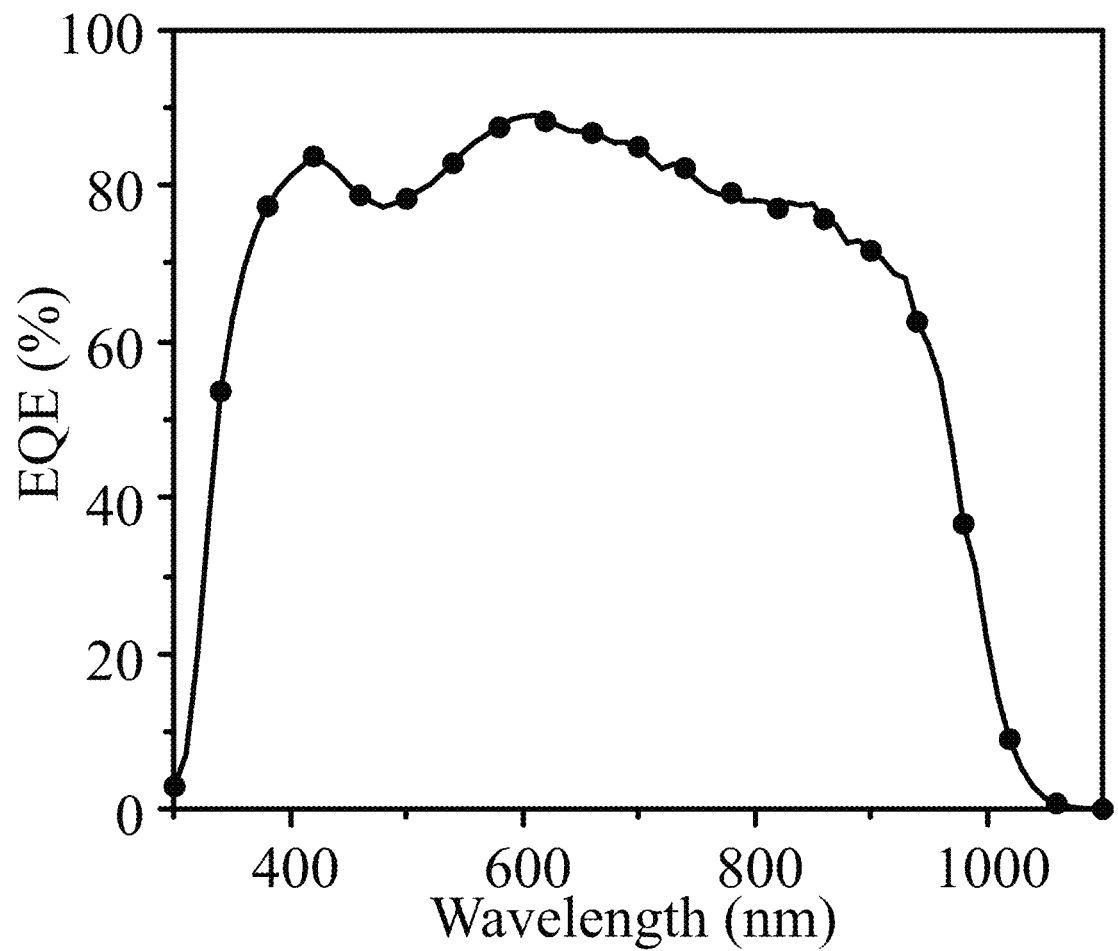
Figure 23D:
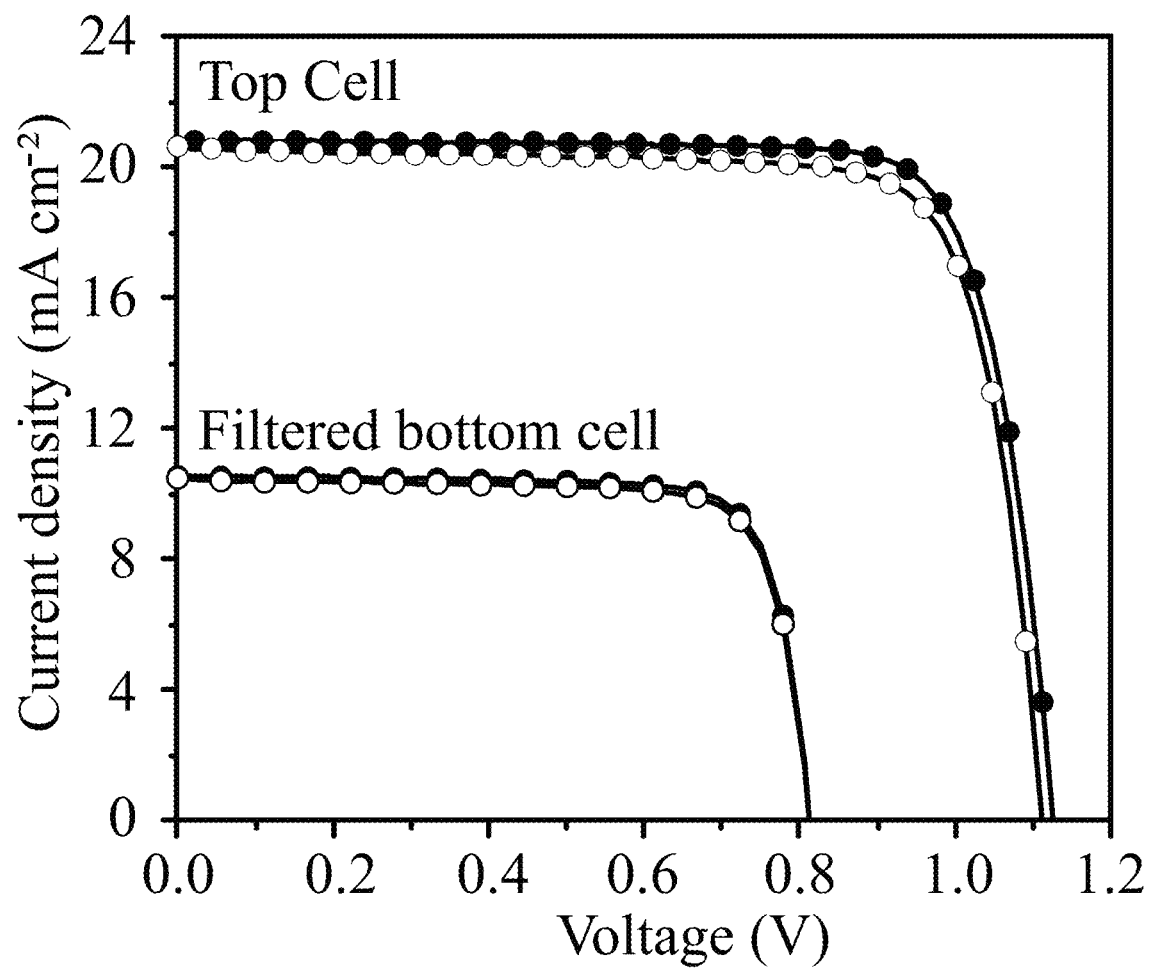
Figure 23E:
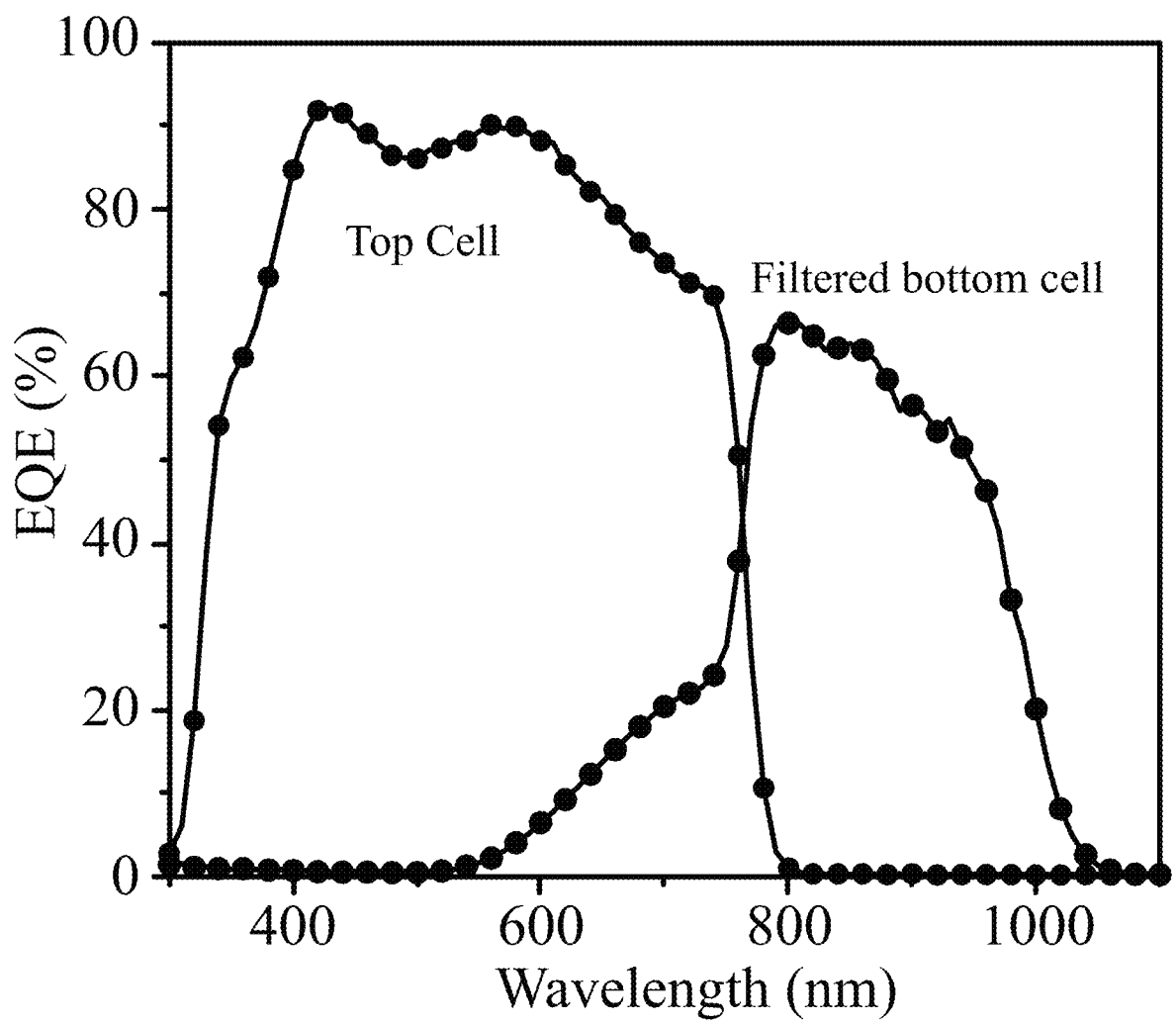
Figure 23F:
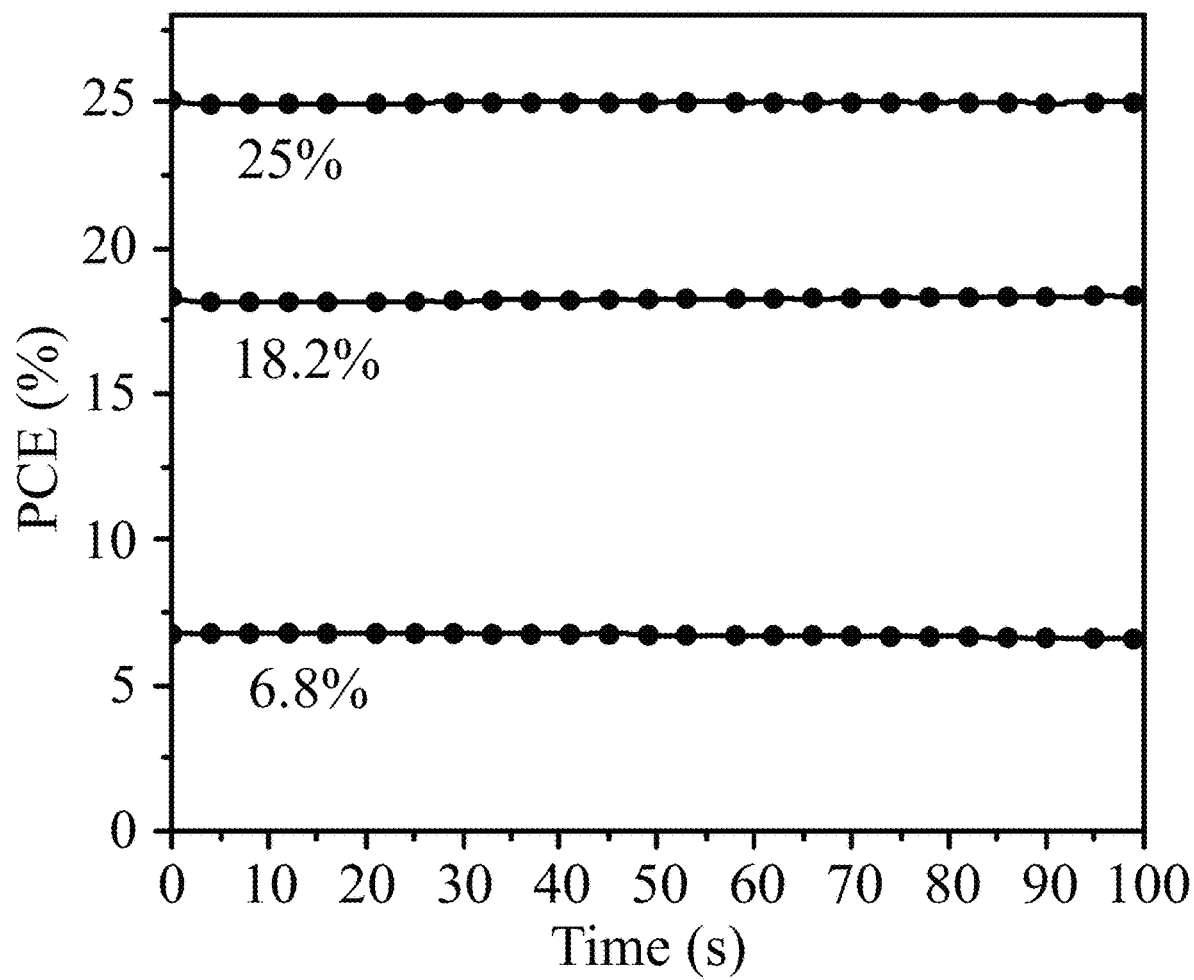

FIGS. 23A-23F illustrate various metrics for both a perovskite single-junction solar cell and a perovskite-perovskite tandem solar cell, using the low bandgap material described above, $(FASnI_3)_{0.6}(MAPbI_3)_{0.4}$. FIG. 23A illustrates cross-sectional SEM image of the low-bandgap perovskite solar cell using the GuaSCN modified $(FASnI_3)_{0.6}(MAPbI_3)_{0.4}$ perovskite absorber. FIG. 23B illustrates the J-V curve of the best-performing low-bandgap perovskite solar cell with both the forward and reverse voltage scans. The inset shows the SPO efficiency measured near the maximum power point. FIG. 23C illustrates the EQE spectrum of the device shown in FIG. 23B. The integrate photocurrent density is 29.6 mA/cm². FIG. 23D illustrates J-V curves of a semi-transparent wide-bandgap perovskite solar cell using a transparent IZO top contact and the filtered low-bandgap perovskite solar cell using the top semi-transparent perovskite solar cell as the optical filter. Both forward and reverse voltage scans are shown. FIG. 23E illustrates EQE spectra of the semi-transparent top wide-bandgap perovskite solar cell and the filtered bottom low-bandgap perovskite solar cell. The integrated photocurrent densities are indicated. FIG. 23F illustrates the SPO efficiencies for the semi-transparent wide-bandgap top perovskite solar cell, filtered bottom low-bandgap perovskite solar cell, and the 4-terminal tandem device.

Figure 24:
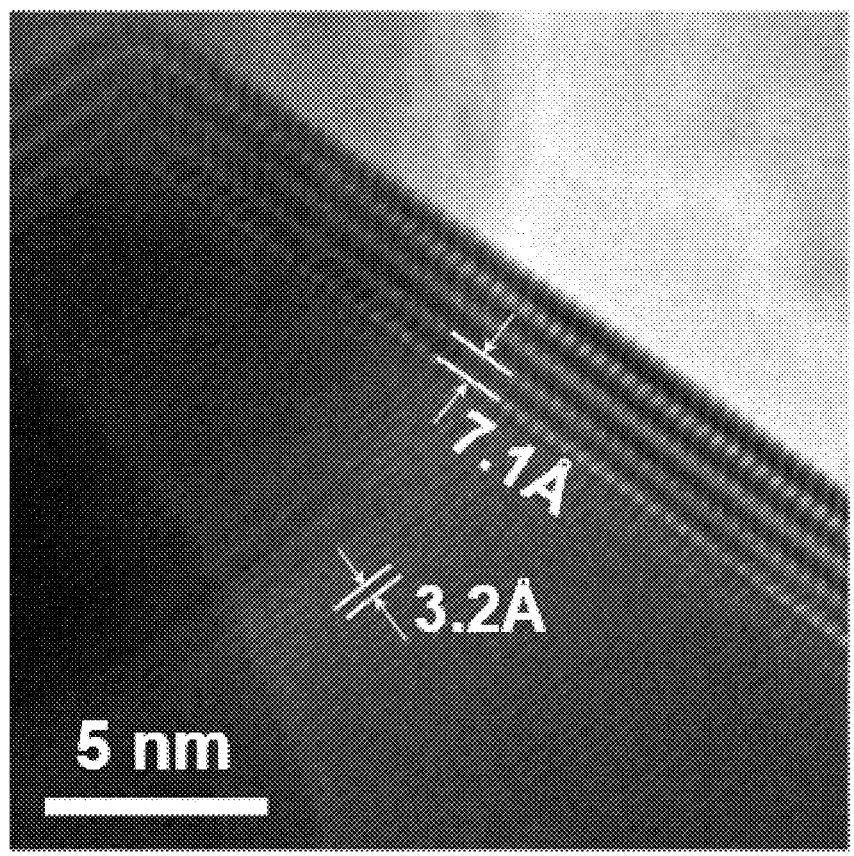
FIG. 24 illustrates a high-resolution transmission electron microscope (HRTEM) image of the grain boundary region of a perovskite prepared with 7% of an additive, according to some embodiments of the present disclosure.
Figure 25:
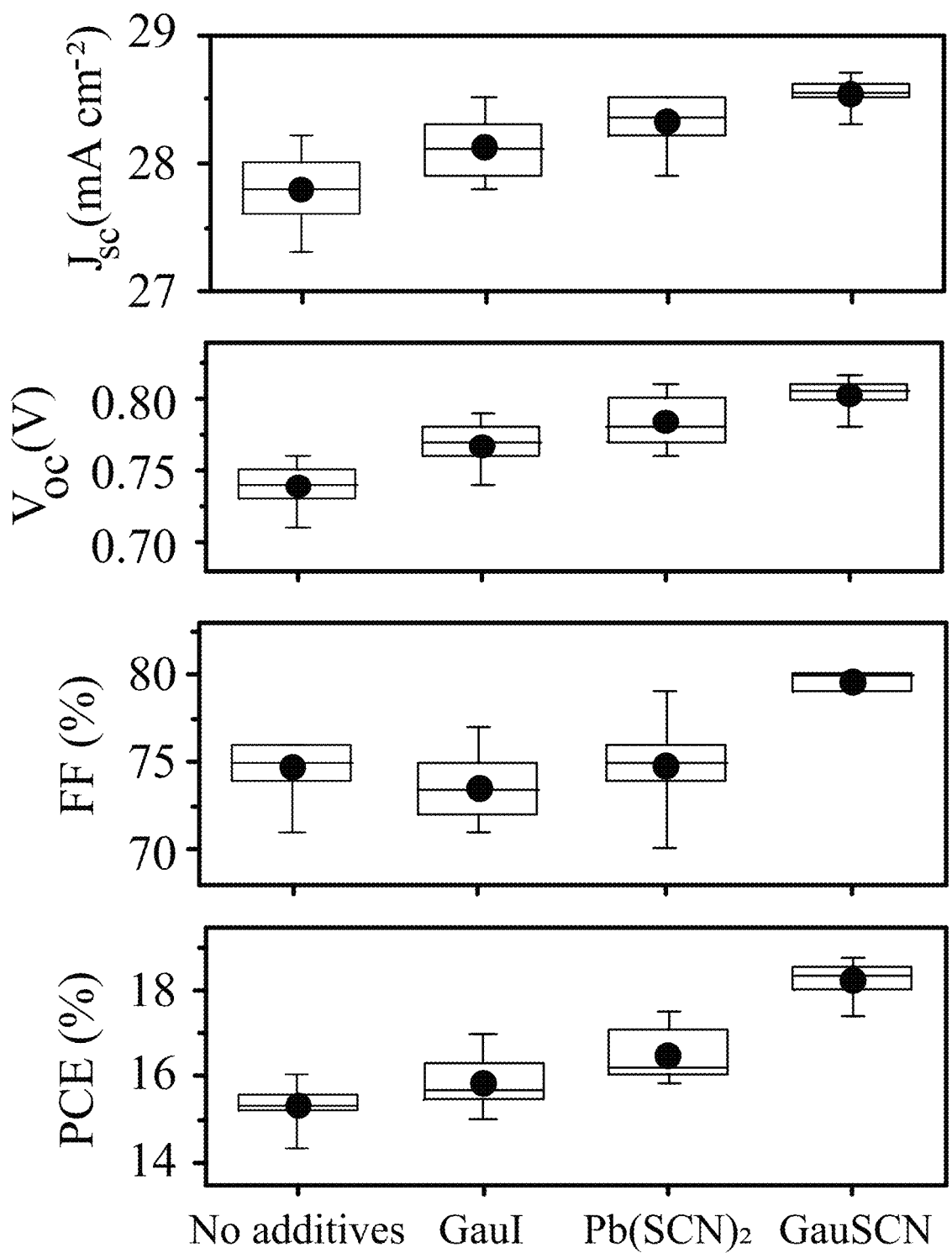
FIG. 25 illustrates compares device characteristics for devices containing perovskite films, with and without additives, according to some embodiments of the present disclosure.
Figure 26A:
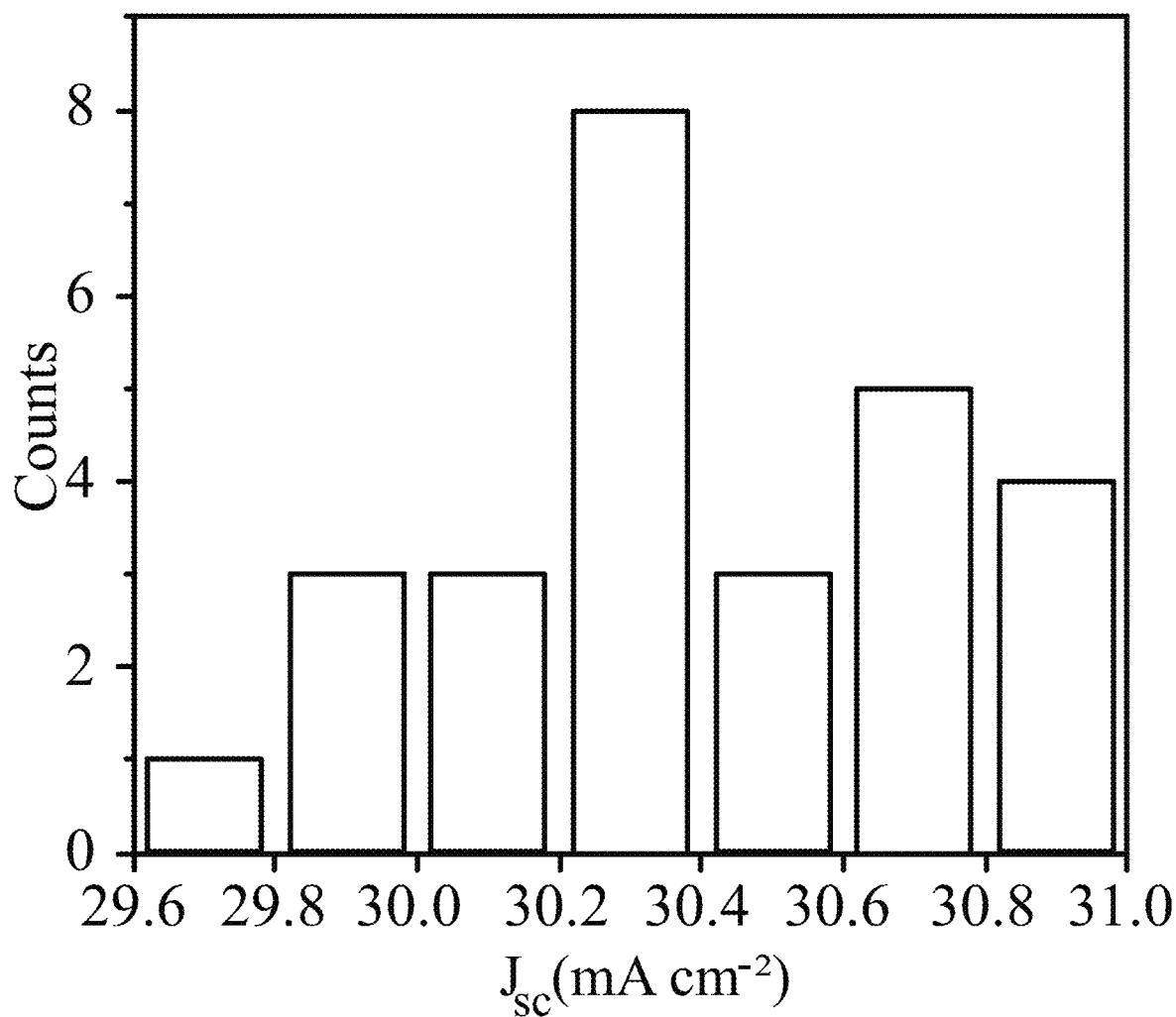
FIGS. 26A-D illustrate statistical distributions of device characteristics for devices containing perovskite films containing additives, according to some embodiments of the present disclosure.
Figure 26B:
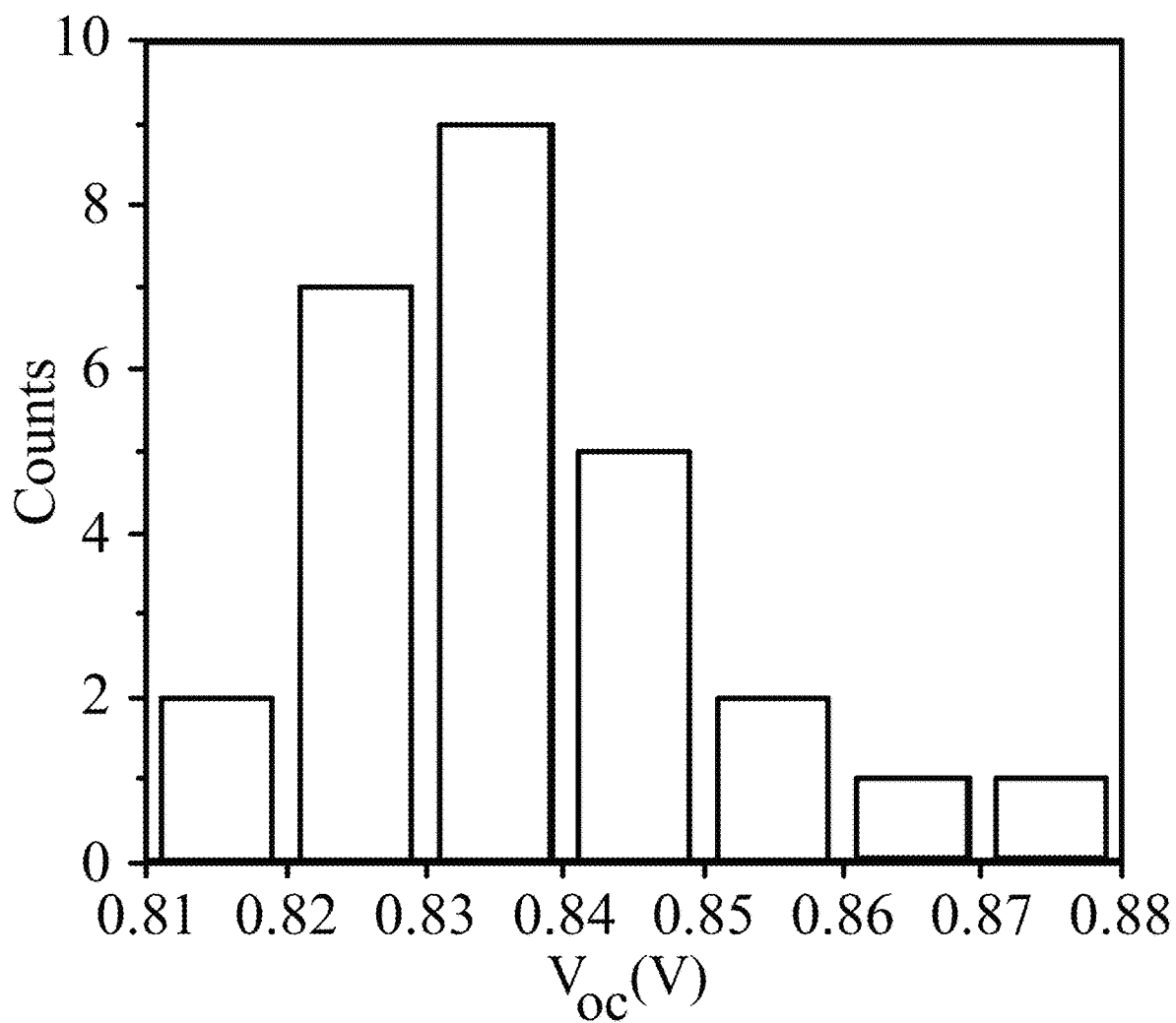
Figure 26C:
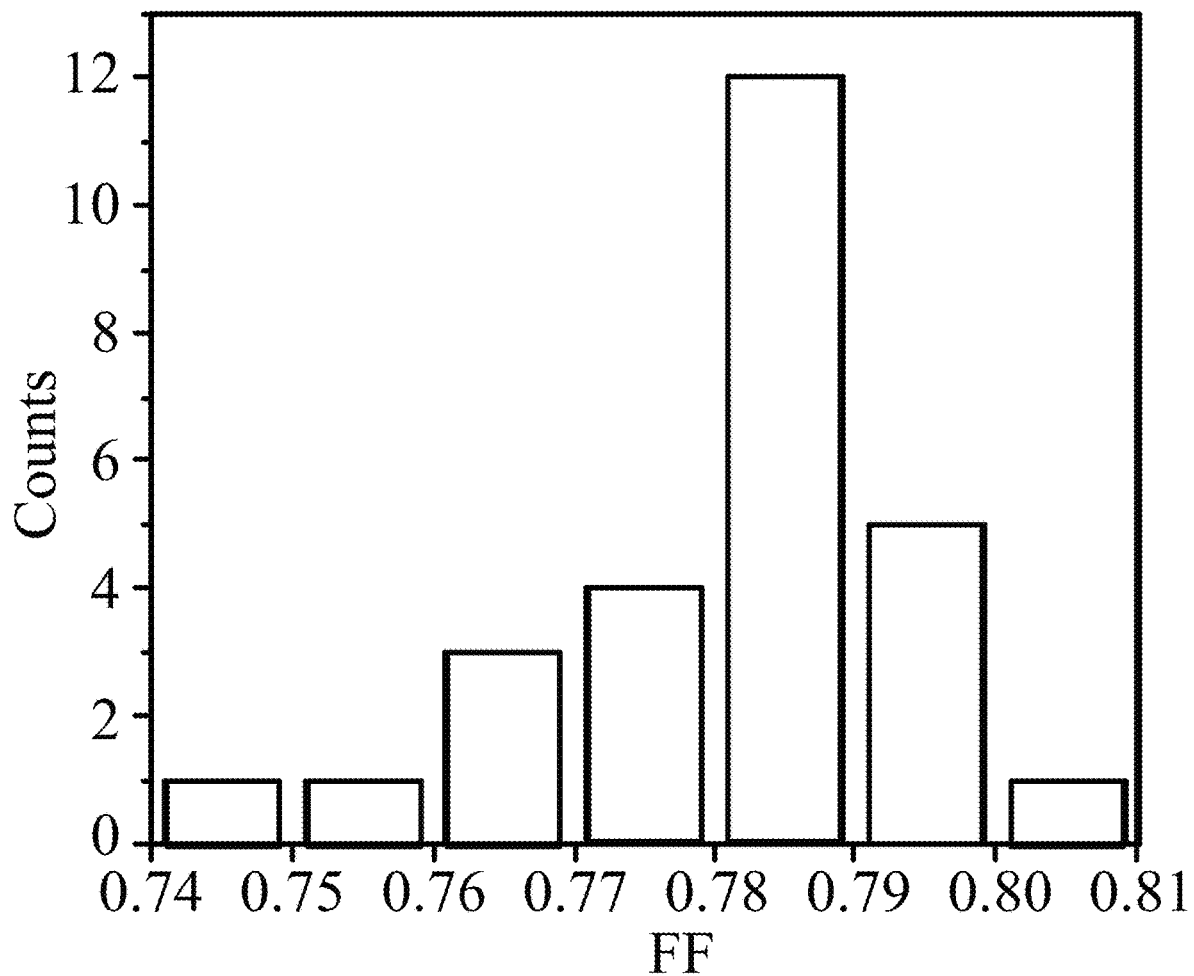
Figure 26D:
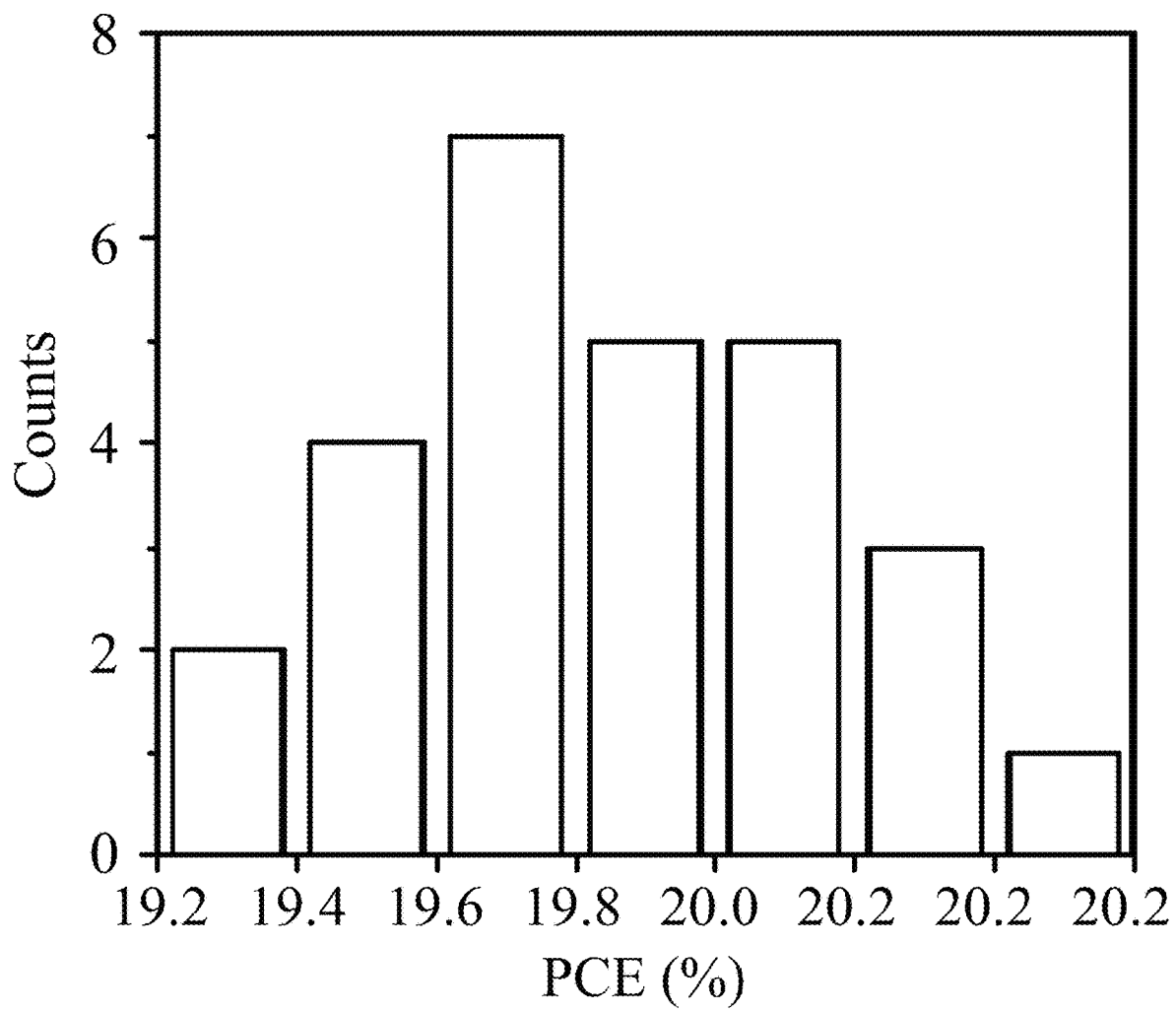

FIG. 24 illustrates a high-resolution transmission electron microscope (HRTEM) image of the grain boundary region of the perovskite (e.g. $Gua_2Pb(I_2SCN_2)$ or quasi-2D (e.g. $[FA_{0.6}MA_{0.4}Sn_{0.6}Pb_{0.4}I_3][(Gua)_2Pb(I_2SCN_2)])$ prepared with 7% GuaSCN additive. This confirms that a 2D structure is formed at GBs when a small amount GuaSCN additive is used. FIG. 25 illustrates a comparison of device characteristics based on low-bandgap perovskite thin films (~580 nm) prepared without and with different additives as indicted. The improvement of the device performance associated with the use of GuaSCN additive may be attributed to a combination of effects resulting from the GuaSCN, rather than the individual effect of $Gua^+$ and $SCN^-$ when used separately. FIG. 25 compares the device characteristics of PSCs based on low-bandgap perovskite films, $(FASnI_3)_{0.6}(MAPbI_3)_{0.4}$, prepared without and with different additives (GuaI, $Pb(SCN)_2$, and GuaSCN). It is evident that using either GuaI or $Pb(SCN)_2$ can increase the device performance. However, the respective improvements with GuaI and $Pb(SCN)_2$ additives are significantly lower than that is seen in the devices prepared with the GuaSCN additive. Finally, FIGS. 26A-26D illustrate statistical distributions of PV parameters of PSCs based on 1-μm low-bandgap perovskite films, $(FASnI_3)_{0.6}(MAPbI_3)_{0.4}$, prepared with 7% GuaSCN additive.

This example using GauSCN as an additive in the perovskite formulation, further demonstrates an additive-engineering approach to prepare >20%-efficient low-bandgap (~1.25 eV) perovskite solar cell based on Sn—Pb mixed perovskite absorbers $((FASnI_3)_{0.6}(MAPbI_3)_{0.4})$. The use of GuaSCN as an additive improves perovskite film quality with enhanced crystallinity, larger grain size, smoother grain surface, longer carrier lifetime, reduced energy disorder, faster carrier transport, and longer carrier diffusion length (~2.5 micrometer). These improved perovskite properties resulted in an improved average solar cell efficiency from <16% to >18%. When increasing the perovskite film thickness to about 1 micrometer, the solar cell efficiency reached about 20.2%-20.4% owing to the significantly improved carrier diffusion length; this efficiency level is much higher than the state-of-the-art (~17%-18%) reported in literature. Coupling a semi-transparent 1.63-eV perovskite top cell with a 1.25-eV perovskite bottom cell, a ~25%-efficient polycrystalline perovskite/perovskite 4-terminal thin-film tandem solar cell was achieved.

Methods:

Materials.

Unless stated otherwise, all materials were purchased from Sigma-Aldrich, Alfa Aesar, TCI, or Greatcellsolar and were used as received. C60 was purchased from Lumtec and used as received.

Preparation of Perovskite Precursor.

The precursor of 3D perovskite $(FA_{0.65}MA_{0.20}Cs_{0.15})Pb(I_{0.8}Br_{0.2})_3$ film was prepared by dissolving FAI, CsI, MABr, $PbI_2$, and $PbBr_2$ with stoichiometry in anhydrous N,N-dimethylformamide (DMF) and N-methyl-2-pyrrolidone (NMP) mixed solvent (4/1, v/v). The molar concentration of the perovskite precursor was in the range of 1M to 1.5M. To obtain 2D/3D mixed perovskite, FAI in precursor was substituted by PEAI, with the desired molar concentration ranging from 0 to 3 mol %. The $Pb(SCN)_2$ additive was used for both 3D and 2D/3D perovskite precursors with concentration varying from 0 to 5 mol %, calculated based on Pb amount. Perovskite precursors were stirred at room temperature for 3 hours before perovskite film deposition. Perovskite precursor solution concentration and spin-coating speed were adjusted for device optimization.

Perovskite Solar Cell Fabrication.

The PTAA solution dissolved in toluene (5 mg/1 mL) was spin-coated on the cleaned ITO substrate at 6,000 rpm for 25 seconds followed by annealing at 100° C. for 10 min in $N_2$-filled glovebox. After annealing, the PTAA/ITO substrate was further spin-coated with DMF to improve the wettability of perovskite precursor. 60 μL of perovskite precursor was coated on the DMF pre-treated PTAA/ITO substrate at a spin speed of 4,000 rpm for 25 seconds to form a solid-state-precursor (SSP) film. The SSP film was subsequently immersed into diethyl ether bath for about 30 seconds to 60 seconds. The color of the SSP film immediately changed from transparent to brown during solvent extraction. The substrate was then sequentially annealed at 65° C. for 10 min and 100° C. for 13 minutes. For devices with an opaque top contact, the perovskite film was sequentially coated with about 30-nm C60, 6-nm BCP, and 100-nm Ag by thermal evaporation. For devices with a transparent top contact, the perovskite film was first coated with about 30-nm C60 by thermal evaporation, and followed by coating of about 6-nm $SnO_x$ and 1-nm of Zn-doped $SnO_x$ (ZTO) layers by atomic layer deposition (ALD). Finally, about 250 nm of IZO layer were sputtered at room-temperature using an RF power of 100 W in a vacuum chamber with a base pressure of $2 \times 10^{-7}$ torr. The sheet resistance of a thin film of IZO deposited on glass with identical deposition parameters was measured to be about 12 Ω/sq. using a four-point probe.

CIGS Cell Fabrication.

A 0.5-μm Mo back contact was sputtered onto aluminosilicate glass that had high K content (Etamax purchased from Schott). A bandgap-graded, 2.5-μm-thick $Cu(In,Ga)Se_2$ absorber layer was then grown by 3-stage co-evaporation at 615° C. A post-deposition treatment was performed after cooling the absorber to 330° C. and evaporating 25 nm of KF over 10 min (no Se supplied). The overall film had cation molar ratios of Cu/(Ga+In) of 0.89 and Ga/(Ga+In) of 0.34 by X-ray fluorescence, and a bandgap of 1.12 eV. The device was completed with an n-type buffer layer (50-nm CdS by chemical bath deposition), intrinsic buffer (90-nm sputtered ZnO), doped window (120-nm sputtered Al-doped ZnO), metal grids (Ni/Al evaporated through a shadow mask), and anti-reflective coating (100-nm evaporated $MgF_2$). Devices with 0.42 cm² area were isolated by photolithography and hydrochloric acid etching.

ALD Coating of Tin Oxide and Zinc-Tin-Oxide.

The tin oxide ($SnO_x$) and zinc-tin-oxide (ZTO) processes were deposited using a Beneq TFS200 ALD system at 85° C. using tetrakis(dimethylamino)tin(IV) (TDMASn), diethylzinc (DEZ), and water. Chamber and process nitrogen flows were set to 250 and 300 sccm, respectively. TDMASn was heated to 55° C.; DEZ and water were unheated. TDMASn was pulsed using a bubbler charge-pulse-purge procedure, where the bubbler was charged with nitrogen for 0.35 seconds, pulsed for 1 seconds, then pulsed for an additional 0.2 seconds with nitrogen flow through the bubbler. The $SnO_x$ deposition cycle consisted of the processing sequence: TDMASn charge-pulse-purge procedure, purge (6 seconds), $H_2O$ pulse (0.2 seconds), purge (6 seconds). This process resulted in a growth of 1.4 Å/cycle. ZTO was deposited using a supercycle approach, in which a single supercycle consisted of 3 cycles of zinc oxide (ZnO) followed by 3 cycles of $SnO_x$. The ZnO deposition cycle consisted of a DEZ pulse (0.2 seconds), purge (6 seconds), $H_2O$ pulse (0.2 seconds), purge (6 seconds). This ZTO supercycle process resulted in a growth rate of 10 Å/supercycle.

Material Characterization.

The crystal structures of perovskite films were characterized using an X-ray diffractometer (XRD, D-Max 2200, Rigaku). The morphologies and microstructures of perovskite films and the cross-sectional structure of solar cells were examined by using a field-emission scanning electron microscopy (FESEM, Nova 630 NanoSEM, FEI). The optical absorption spectra of perovskite films were characterized using a UV-Vis spectrophotometer (Cary-6000i, Agilent).

Time-of-Flight Secondary-Ion Mass Spectrometry.

An ION-TOF TOF-SIMS V Time of Flight SIMS (TOF-SIMS) spectrometer was used for depth profiling and chemical imaging of the perovskite. Analysis was completed using a 3-lens 30-kV BiMn primary-ion gun. 1D profiles were completed with the $Bi_3^+$ primary-ion beam, (0.8-pA pulsed beam current), and a 50×50-μm area was analyzed with a 128:128 primary beam raster. 3-D tomography was completed with 100-nm lateral resolution using a $Bi_3^{++}$ primary-ion-beam cluster (100-ns pulse width, 0.1-pA pulsed beam current); a 50×50-μm area was sampled with a 1024:1024 primary-beam raster. Sputter depth profiling was accomplished with 1-kV oxygen and cesium ion sputter beams (3-5-nA sputter current) with a raster of 1×150 μm. After completion of the SIMS measurements, the depth of the craters was determined by optical interference light microscopy to convert the SIMS sputter time scale to a sputter depth scale.

Time-Resolved Microwave Conductivity.

Thin-film perovskite samples deposited on quartz substrates (1 cm×2.5 cm×1 mm) were illuminated through the quartz side of the substrate with 650-nm (5-ns pulse width) laser using an optical parametric oscillator (Continuum Panther) pumped by the 355-nm harmonic of a Q-switched Nd:YAG laser (Continuum Powerlite). The transient change in photoconductance (ΔG(t)) was measured via changes in the microwave power (ΔP(t)) due to absorption of microwaves (~9 GHz) by the photogenerated holes and electrons, and it is given by:

$$\Delta G(t) = (-1/K)(\Delta P(t)/P), \quad (7)$$

where K is a calibration factor experimentally determined from the resonance characteristics of the microwave cavity and the dielectric properties of the sample. The end-of-pulse (peak) photoconductance ($\Delta G_{peak}$) can be related to the product of the yield of free-carrier generation (p) and the sum (Σμ) of the GHz-frequency mobilities of electron ($\mu_e$) and hole ($\mu_h$) by:

$$\Delta G_{peak} = \beta q_e N(\mu_e + \mu_h) = \beta q_e I_0 F_A \varphi \Sigma \mu, \quad (8)$$

where β=2.2 and is the ratio of the interior dimensions of the waveguide, $q_e$ is the electronic charge, N is the number of photogenerated charge-carrier pairs, $I_0$ is the incident photon flux of the excitation laser pulse, and $F_A$ is the fraction of photons absorbed by the sample. In bulk semiconductors, where the photogeneration yield can be assumed to be unity, the photoconductance provides a measure of the carrier mobility. Transient photoconductance data were recorded at pump excitation intensities (~1-sun) where recombination and peak photoconductance is independent of intensity, provided sufficient signal-to-noise was attainable.

Device Characterization.

The photocurrent densityvoltage (J-V) curves were measured under a simulated AM 1.5 G illumination (100 mW cm$^{-2}$, Oriel Sol3A Class AAA Solar Simulator, Newport) and nitrogen condition in a glove box using a Keithley 2400 source meter with 20-mV steps and 60-ms delay time. The AM 1.5 G illumination was calibrated using a standard Si solar cell (Oriel, VLSI standards) and KG2 filter. The stabilized power output (SPO) of PSCs was also measured using the same equipment. The active area of PSCs was 0.06 cm$^2$ as determined by the black metal aperture. External quantum efficiency (EQE) spectra of devices were measured using a solar cell quantum-efficiency measurement system.

For perovskite/CIGS 4-T tandem devices, the J-V curves and EQE spectra of semi-transparent perovskite top cells were measured using the same condition as described above. The filtered CIGS cell with an active area of ~0.4 cm$^2$ was measured by using a large-area (~0.6-cm$^2$) semi-transparent perovskite device filter with IZO top contact under a simulated AM 1.5 G illumination (100 mW cm$^{-2}$, Oriel Sol3A Class AAA Solar Simulator, Newport) at ambient condition. Paraffin oil (refractive index of ~1.47) was used as an optical coupler to remove the air gap between the top perovskite device filter and the bottom CIGS cell.

Example Set 1

Example 1

A perovskite comprising: a first portion comprising $A_{1-w}A'_{w}B(X_{1-z}X'_{z})_3$, and a second portion comprising $A''_2B(X_{1-e}X''_e)_4$, wherein: each of A, A', A'' are monovalent cations, B is a divalent cation, each of X, X', and X'' are monovalent anions, $0 \leq w \leq 1$, $0 \leq z \leq 1$, and $0 \leq e \leq 1$.

Example 2

The perovskite of Example 1, wherein the first portion and the second portion are at a ratio of the second portion to the first portion of 1/(n−1), and $1 \leq n \leq 100000$.

Example 3

The perovskite of Example 2, wherein $1 \leq n \leq 10000$.

Example 4

The perovskite of Example 3, wherein $1 \leq n \leq 1000$.

Example 5

The perovskite of Example 4, wherein $1 \leq n \leq 100$.

Example 6

The perovskite of Example 1, wherein the second portion is present in the perovskite at a molar concentration between greater than 0% and less than or equal to 50%.

Example 7

The perovskite of Example 6, wherein the second portion is present in the perovskite at a molar concentration between greater than 0% and less than or equal to 20%.

Example 8

The perovskite of Example 1, wherein A comprises at least one of cesium, formamidinium (FA), methylammonium (MA), rubidium, potassium, or sodium.

Example 9

The perovskite of Example 1, wherein A' comprises at least one of cesium, formamidinium (FA), methylammonium (MA), rubidium, potassium, or sodium.

Example 10

The perovskite of Example 1, wherein A'' comprises at least one of phenylethyl ammonium (PEA), guanidinium (Gua), butylammonium, cyclopropylammonium, polyethylenimine, iodoethylammonium, ethane-1,2-diammonium, or ammoniumvaleric acid.

Example 11

The perovskite of Example 1, wherein B comprises at least one of lead, tin, or germanium.

Example 12

The perovskite of Example 1, wherein X comprises a halide.

Example 13

The perovskite of Example 1, wherein X' comprises a halide.

Example 14

The perovskite of Example 1, wherein X'' comprises a pseudohalide.

Example 15

The perovskite of Example 1, wherein X" comprises at least one of thiocyanate (SCN), cyanate, isothiocyanate, azide, selenocyanogen, nitrite, tellurorhodanide, tetracarbonylcobaltate, or $AL_{13}I_2^-$.

Example 16

The perovskite of Example 1, wherein: the first portion comprises $FA_{1-w}MA_wPb(I_{1-z}Br_z)_3$, $0<w\leq 1$, and $0<z\leq 1$.

Example 17

The perovskite of Example 16, wherein $0<w\leq 0.8$ and $0.05<z\leq 0.4$.

Example 18

The perovskite of Example 1, wherein: the second portion comprises $PEA_2Pb(I_{1-e}SCN_e)_4$, and $0<e\leq 1.0$.

Example 19

The perovskite of Example 18, wherein $0.20\leq e\leq 0.4$.

Example 20

The perovskite of Example 1, wherein: the second portion comprises $Gua_2Pb(I_{1-e}SCN_e)_4$, and $0<e\leq 1.0$.

Example 21

The perovskite of Example 20, wherein $0.20\leq e\leq 0.4$.

Example 22

The perovskite of Example 1, wherein: the first portion further comprises A''' resulting in $A_{1-w-x}A'_wA'''_xB(X_{1-z}X'_z)_3$, A''' is a monovalent cation, and $0<x\leq 1$.

Example 23

The perovskite of Example 22, wherein A''' comprises at least one of cesium, formamidinium (FA), methylammonium (MA), rubidium, potassium, or sodium.

Example 24

The perovskite of Example 16, further comprising: cesium such that the first portion comprises $FA_{1-w-x}MA_wCs_xPb(I_{1-z}Br_z)_3$, wherein: $0<x\leq 1$.

Example 25

The perovskite of Example 24, wherein $0.01<x\leq 0.3$.

Example 26

The perovskite of Example 22, wherein: the first portion further comprises B' resulting in $A_{1-w-x}A'_wA'''_xB_{1-y}B'_y(X_{1-z}X'_z)_3$, B' is a divalent cation, and $0<y\leq 1$.

Example 27

The perovskite of Example 26, wherein B' comprises at least one of lead, tin, or germanium.

Example 28

The perovskite of Example 16, further comprising: tin such that the first portion comprises $FA_{1-w}MA_wSn_{1-y}Pb_yI_3$, $0<w\leq 1$, $0<y\leq 1$, and $z=0$.

Example 29

The perovskite of Example 28, wherein $0.5\leq w\leq 0.8$, and $0.2\leq y\leq 0.6$.

Example 30

The perovskite of Example 1, further comprising: a plurality of grains separated from neighboring grains by a plurality of grain boundaries, wherein: the plurality of grains consist essentially of the first portion, and the plurality of grain boundaries consist essentially of the second portion.

Example 31

The perovskite of Example 30, wherein each grain has a characteristic length between 300 nm to 10 μm.

Example Set 2

Example 1

A perovskite comprising: $A_{(n-1-nw+w)}A'_{(wn-w)}A''_2B_nX_{(3n-3zn+3z-4e+1)}X'_{(3zn-3z)}X''_{4e}$, wherein: each of A, A', A'' are monovalent cations, B is a divalent cation, each of X, X', and X'' are monovalent anions, $0<w\leq 1$, $0<z\leq 1$, $0<e\leq 1$, and $1\leq n\leq 100000$.

Example 2

The perovskite of Example 1, wherein $1\leq n\leq 10000$.

Example 3

The perovskite of Example 2, wherein $1\leq n\leq 1000$.

Example 4

The perovskite of Example 3, wherein $1\leq n\leq 100$.

Example 5

The perovskite of Example 1, wherein the second portion is present in the perovskite at a molar concentration between greater than 0% and less than or equal to 50%.

Example 6

The perovskite of Example 5, wherein the second portion is present in the perovskite at a molar concentration between greater than 0% and less than or equal to 20%.

Example 7

The perovskite of Example 1, wherein A comprises at least one of cesium, formamidinium (FA), methylammonium (MA), rubidium, potassium, or sodium.

Example 8

The perovskite of Example 1, wherein A' comprises at least one of cesium, formamidinium (FA), methylammonium (MA), rubidium, potassium, or sodium.

Example 9

The perovskite of Example 1, wherein A" comprises at least one of phenylethyl ammonium (PEA), guanidinium (Gua), butylammonium, cyclopropylammonium, polyethylenimine, iodoethylammonium, ethane-1,2-diammonium, or ammoniumvaleric acid.

Example 10

The perovskite of Example 1, wherein B comprises at least one of lead, tin, or germanium.

Example 11

The perovskite of Example 1, wherein X comprises a halide.

Example 12

The perovskite of Example 1, wherein X' comprises a halide.

Example 13

The perovskite of Example 1, wherein X" comprises a pseudohalide.

Example 14

The perovskite of Example 1, wherein X" comprises at least one of thiocyanate (SCN), cyanate, isothiocyanate, azide, selenocyanogen, tellurorhodanide, tetracarbonylcobltate, or $AL_{13}I_2^-$.

Example 15

The perovskite of Example 1, comprising $FA_{(n-1-nw+w)}MA_{(wn-w)}PEA_2Pb_nI_{(3n-3zn+3z-4e+1)}Br_{(3zn-3z)}SCN_{4e}$.

Example 16

The perovskite of Example 15, wherein $0<w\leq0.8$, $0.05<z\leq0.4$, and $0<e\leq1.0$.

Example 17

The perovskite of Example 1 comprising $FA_{(n-1-nw+w)}MA_{(wn-w)}GUa_2Pb_nI_{(3n-4e+1)}SCN_{4e}$ and $z=0$.

Example 18

The perovskite of Example 17, wherein $0<w\leq0.8$ and $0<e\leq1.0$.

Example 19

The perovskite of Example 17, further comprising bromine, resulting in $FA_{(n-1-nw+w)}MA_{(wn-w)}GUa_2Pb_nI_{(3n-3zn+3z-4e+1)}Br_{(3zn-3z)}SCN_{4e}$.

Example 20

The perovskite of Example 19, wherein $0.05\leq z\leq0.4$.

Example 21

The perovskite of Example 1, further comprising A''', wherein: A''' is a monovalent cation, resulting in $A_{(n-nw-nx-1+w+x)}A_{(wn-w)}A''_2A'''_{(xn-x)}B_nX_{(3n-3zn+3z-4e+1)}X'_{(3zn-3z)}X''_{4e}$, and $0<x\leq1$.

Example 22

The perovskite of Example 21, wherein A''' comprises at least one of cesium, formamidinium (FA), methylammonium (MA), rubidium, potassium, or sodium.

Example 23

The perovskite of Example 21, comprising: $FA_{(n-nw-nx-1+w+x)}MA_{(wn-w)}PEA_2Cs_{(xn-x)}Pb_nI_{(3n-3zn+3z-4e+1)}Br_{(3zn-3z)}SCN_{4e}$.

Example 24

The perovskite of Example 23, wherein $0.01\leq x\leq0.3$.

Example 25

The perovskite of Example 21, comprising $FA_{(n-nw-nx-1+w+x)}MA_{(wn-w)}Gua_2Cs_{(xn-x)}Pb_nI_{(3n-3zn+3z-4e+1)}Br_{(3zn-3z)}SCN_{4e}$.

Example 26

The perovskite of Example 25, wherein $0.01\leq x\leq0.3$.

Example 27

The perovskite of Example 21, further comprising B', wherein: B' is a monovalent anion, resulting in $A_{(n-nw-nx-1+w+x)}A'_{(wn-w)}A''_2A'''_{(xn-x)}B_{(n-ny+y)}B'_{(ny-y)}X_{(3n-3zn+3z-4e+1)}X'_{(3zn-3z)}X''_{4e}$, and $0<y\leq1$.

Example 28

The perovskite of Example 27, wherein B' comprises at least one of lead, tin, or germanium.

Example 29

The perovskite of Example 27, comprising: $FA_{(n-nw-nx-1+w+x)}MA_{(wn-w)}PEA_2Cs_{(xn-x)}Pb_{(n-ny+y)}Sn_{(3n-3zn+3z-4e+1)}I_{(3zn-3z)}SCN_{4e}$.

Example 30

The perovskite of Example 29, wherein $0.2\leq y\leq0.6$.

Example 31

The perovskite of Example 27, comprising: $FA_{(n-nw-nx-1+w+x)}MA_{(wn-w)}Gua_2Cs_{(xn-x)}Pb_{(n-ny+y)}Sn_{(3n-3zn+3z-4e+1)}I_{(3zn-3z)}SCN_{4e}$.

Example 32

The perovskite of Example 31, wherein $0.2 \leq y \leq 0.6$.

Example 33

The perovskite of Example 1, further comprising: a plurality of grains separated from neighboring grains by a plurality of grain boundaries, wherein: the plurality of grains consist essentially of a first portion of the perovskite, and the plurality of grain boundaries consist essentially of a second portion of the perovskite.

Example 34

The perovskite of Example 33, wherein the first portion is substantially in a 3D perovskite structure.

Example 35

The perovskite of Example 33, wherein the second portion is substantially in a 2D perovskite structure.

Example 36

The perovskite of Example 33, wherein each grain has a characteristic length between 300 nm to 10 μm.

Example Set 3

Example 1

A method comprising: completing a first reaction, $(1-w)(AX+BX_2)+w(A'X'+BX'_2) \rightarrow A_{1-w}A'_wB(X_{1-w}X'_w)_3$; and completing a second reaction, $2A''X''+(1-e)BX_2+eBX''_2 \rightarrow A''_2B(X_{2-2e}X''_{2+2e})$, wherein: the first reaction and the second reaction result in the forming of a perovskite comprising $[A_{1-w}A\alpha_wB(X_{1-w}X'_w)_3]_{n-1}[A''_2B(X_{2-2e}X''_{2+2e})]$, each of A, A', and A'' are monovalent cations, B is a divalent cation, each of X, X', and X'' are monovalent anions, $0<w \leq 1$, $0<e \leq 1$, and $1 \leq n \leq 100000$.

Example 2

The method of Example 1, wherein $1 \leq n \leq 10000$.

Example 3

The method of Example 2, wherein $1 \leq n \leq 1000$.

Example 4

The method of Example 3, wherein $1 \leq n \leq 100$.

Example 5

The method of Example 1, wherein the $A''_2B(X_{2-2e}X''_{2+2e})$ is present in the perovskite at a molar concentration between greater than 0% and less than or equal to 50%.

Example 6

The method of Example 5, wherein the $A''_2B(X_{2-2e}X''_{2+2e})$ is present in the perovskite at a molar concentration between greater than 0% and less than or equal to 20%.

Example 7

The method of Example 1, wherein A comprises at least one of cesium, formamidinium (FA), methylammonium (MA), rubidium, potassium, or sodium.

Example 8

The method of Example 1, wherein A' comprises at least one of cesium, formamidinium (FA), methylammonium (MA), rubidium, potassium, or sodium.

Example 9

The method of Example 1, wherein A'' comprises at least one of phenylethyl ammonium (PEA), guanidinium (Gua), butylammonium, cyclopropylammonium, polyethylenimine, iodoethylammonium, ethane-1,2-diammonium, or ammoniumvaleric acid.

Example 10

The method of Example 1, wherein B comprises at least one of lead, tin, or germanium.

Example 11

The method of Example 1, wherein X comprises a halide.

Example 12

The method of Example 1, wherein X' comprises a halide.

Example 13

The method of Example 1, wherein X'' comprises a pseudohalide.

Example 14

The method of Example 1, wherein X'' comprises at least one of thiocyanate (SCN), cyanate, isothiocyanate, azide, selenocyanogen, tellurorhodanide, tetracarbonylcobaltate, or $AL_{13}I_2^-$.

Example 15

The method of Example 1, wherein $A_{1-w}A'_wB(X_{1-w}X'_w)_3$ comprises $FA_{1-w}MA_wPb(I_{1-w}Br_w)_3$.

Example 16

The method of Example 15, wherein $0.05 < w \leq 0.8$.

Example 17

The method of Example 1, wherein $A''_2B(X_{2-2e}X''_{2+2e})$ comprises $PEA_2Pb(I_{2-2e}SCN_{2+2e})$.

Example 18

The method of Example 17, wherein $0.1 \leq e \leq 0.9$.

Example 19

The method of Example 1, wherein $A''_2B(X_{2-2e}X''_{2+2e})$ comprises $Gua_2Pb(I_{2-2e}SCN_{2+2e})$.

Example 20

The method of Example 19, wherein $0.1 \leq e \leq 0.9$.

Example 21

The method of Example 1, wherein: the first reaction further comprises, $(1-w-x)(AX+BX_2)+w(A'X'+BX'_2)+x(A'''X+BX_2) \rightarrow A_{1-w-x}A'_w A'''_x B(X_{3-3w}X'_{w+2w})$, wherein: A''' is a monovalent cation, and $0<x\leq 1$.

Example 22

The method of Example 21, wherein A''' comprises at least one of cesium, formamidinium ($F_A$), methylammonium (MA), rubidium, potassium, or sodium.

Example 23

The method of Example 21, wherein $A_{1-w-x}A'_w A'''_x B(X_{3-3w}X'_{w+2w})$ comprises $FA_{1-w-x}MA_w Cs_x Pb(I_{3-3w}Br_{w+2w})$.

Example 24

The method of Example 23, wherein $0.01 \leq x \leq 0.3$.

Example 25

The method of Example 21, wherein: the first reaction further comprises, $(1-w-x-y)(AX+BX_2)+w(A'X'+BX'_2)+x(A'''X+BX_2)+y(AX+B'X_2) \rightarrow A_{1-w-x}A'_w A'''_x B_{1-y}B'_y(X_{3-3w}X'_{w+2w})$, wherein: B' is a divalent cation, and $0<y\leq 1$.

Example 26

The method of Example 25, wherein B' comprises at least one of lead, tin, or germanium.

Example 27

The method of Example 25, wherein $A_{1-w-x}A'_w A'''_x B_{1-y}B'_y(X_{3-3w}X'_{w+2w})$ comprises $FA_{1-w-x}MA_w Cs_x Pb_{1-y}Sn_y(I_{3-3w}Br_{w+2w})$.

Example 28

The method of Example 27 wherein $0.2<y\leq 0.6$.

Example 29

The method of Example 1, wherein the completing of the first reaction and the completing of the second reaction are performed in a liquid phase.

Example 30

The method of Example 29, wherein the liquid phase includes a polar solvent.

Example 31

The method of Example 30, wherein the polar solvent comprises N,N-dimethylformamide.

Example 32

The method of Example 31, wherein the polar solvent further comprises N,N-dimethylformamide.

Example 33

The method of Example 29, wherein, before the completing of first reaction, each of AX, $BX_2$, A'X', $BX'_2$ are at a concentration in the liquid phase between 0.1M and 10M.

Example 34

The method of Example 29, wherein, before the completing of first reaction, each of AX, $BX_2$, A'X', $BX'_2$ are at a concentration in the liquid phase between 1M and 1.5M.

Example 35

The method of Example 29, wherein, before the completing of second reaction, each of A"X and $BX''_2$ are at a concentration in the liquid phase between greater than 0 mol % and 50 mol %.

Example 36

The method of Example 29, wherein, before the completing of second reaction, each of A"X and $BX''_2$ are at a concentration in the liquid phase between greater than 0 mol % and 20 mol %.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A perovskite comprising:
$A_{(n-1-nw+w)}A'_{(wn-w)}A''_2 B_n X_{(3N-3zn+3z-4e+1)}X'_{(3zn-3z)}X''_{4e}$, wherein:
A comprises formamidinium (FA),
A' comprises methylammonium (MA),
A" comprises at least one of phenylethyl ammonium (PEA) or guanidinium (Gua),
B comprises lead,
each of X, X', and X" are monovalent anions,
X comprises iodine, X' comprises a monovalent anion,
X" comprises thiocyanate (SCN),
$0<w\leq 1$, $0\leq z\leq 1$, $0<e\leq 1$, and $1\leq n\leq 100,000$.

2. The perovskite of claim 1, wherein A" further comprises at least one of butylammonium, cyclopropylammonium, polyethylenimine, iodoethylammonium, ethane-1,2-diammonium, or ammoniumvaleric acid.

3. The perovskite of claim 1, wherein X" further comprises at least one of cyanate, isothiocyanate, azide, selenocyanogen, tellurorhodanide, tetracarbonylcobaltate, or $AL_{13}I_2^-$.

4. The perovskite of claim 1, wherein X' comprises bromide and $0<z\leq 1$.

5. The perovskite of claim 1, further comprising A''', wherein:
A''' is a monovalent cation resulting in $A_{(n-nw-nx-1+w+x)}A'_{(wn-w)}A''_2A'''_{(xn-x)}B_nX_{(3n-3zn+3z-4e+1)}X'_{(3zn-3z)}X''_{4e}$, and
$0<x\leq 1$.

6. The perovskite of claim 5, comprising $FA_{(n-nw-nx-1+w+x)}MA_{(wn-w)}PEA_2Cs_{(xn-x)}Pb_nI_{(3n-3zn+3z-4e+1)}Br_{(3zn-3z)}SCN_{4e}$.

7. The perovskite of claim 5, comprising $FA_{(n-nw-nx-1+w+x)}MA_{(wn-w)}Gua_2Cs_{(xn-x)}Pb_nI_{(3n-3zn+3z-4e+1)}Br_{(3zn-3z)}SCN_{4e}$.

8. The perovskite of claim 5, further comprising B', wherein:
B' is a divalent cation resulting in $A_{(n-nw-nx-1+w+x)}A'_{(wn-w)}A''_2A'''_{(xn-x)}B_{(n-ny+y)}B'_{(ny-y)}X_{(3n-3zn+3z-4e+1)}X'_{(3zn-3z)}X''_{4e}$, and
$0<y\leq 1$.

9. The perovskite of claim 8, comprising $FA_{(n-nw-nx-1+w+x)}MA_{(wn-w)}PEA_2Cs_{(xn-x)}Pb_{(n-ny+y)}Sn_{(ny-y)}I_{(3n-3zn+3z-4e+1)}SCN_{4e}$.

10. The perovskite of claim 8, comprising $FA_{(n-nw-nx-1+w+x)}MA_{(wn-w)}Gua_2Cs_{(xn-x)}Pb_{(n-ny+y)}Sn_{(ny-y)}I_{(3n-3zn+3z-4e+1)}SCN_{4e}$.

11. The perovskite of claim 1, wherein:
the perovskite has a plurality of grains separated from neighboring grains by a plurality of grain boundaries, wherein:
the plurality of grains have a 3D perovskite structure, and
the plurality of grain boundaries have a 2D perovskite structure.

12. The perovskite of claim 11, wherein each grain has a characteristic length between 300 nm to 10 μm.

13. A method comprising:
completing a first reaction, $(1-w)(AX+BX_2)+w(A'X'+BX'_2) \rightarrow A_{1-w}A'_wB(X_{1-w}X'_w)_3$; and
completing a second reaction, $2A''X''+(1-e)BX_2+eBX''_2 \rightarrow A''_2B(X_{2-2e}X''_{2+2e})$, wherein:
the first reaction and the second reaction result in the forming of a perovskite comprising $[A_{1-w}A''_wB(X_{1-w}X'_w)_3]_{n-1}[A''_2B(X_{2-2e}X''_{2+2e})]$,
A comprises formamidinium (FA),
A' comprises methylammonium (MA),
A" comprises at least one of phenylethyl ammonium (PEA) or guanidinium (Gua),
B comprises lead,
X comprises iodine,
X' comprises bromine,
X" comprises thiocyanate (SCN),
$0<w\leq 1$, $0<e\leq 1$, and $1\leq n\leq 100000$.

14. The method of claim 13, wherein A" further comprises at least one of butylammonium, cyclopropylammonium, polyethylenimine, iodoethylammonium, ethane-1,2-diammonium, or ammoniumvaleric acid.

* * * * *